(12) United States Patent
Guo et al.

(10) Patent No.: US 12,322,331 B2
(45) Date of Patent: Jun. 3, 2025

(54) DISPLAY SUBSTRATE AND DISPLAY APPARATUS

(71) Applicant: BOE Technology Group Co., Ltd., Beijing (CN)

(72) Inventors: Yuzhen Guo, Beijing (CN); Zhenyu Zhang, Beijing (CN); Lubin Shi, Beijing (CN); Zhen Zhang, Beijing (CN); Chenyang Zhang, Beijing (CN); Fuqiang Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/794,625

(22) PCT Filed: Sep. 23, 2021

(86) PCT No.: PCT/CN2021/120001
§ 371 (c)(1),
(2) Date: Mar. 30, 2023

(87) PCT Pub. No.: WO2023/044680
PCT Pub. Date: Mar. 30, 2023

(65) Prior Publication Data
US 2024/0203343 A1    Jun. 20, 2024

(51) Int. Cl.
*G09G 3/3233* (2016.01)
*G09G 3/3266* (2016.01)
*H10K 59/131* (2023.01)

(52) U.S. Cl.
CPC ......... *G09G 3/3233* (2013.01); *G09G 3/3266* (2013.01); *H10K 59/131* (2023.02);
(Continued)

(58) Field of Classification Search
CPC ... G09G 2300/0408; G09G 2300/0426; G09G 2300/0452; G09G 2300/0819;
(Continued)

(56) References Cited

U.S. PATENT DOCUMENTS

2006/0139257 A1* 6/2006 Kwak ................. G09G 3/3233
345/76
2009/0309863 A1* 12/2009 Seto ..................... G09G 3/3233
345/82
(Continued)

FOREIGN PATENT DOCUMENTS

CN         1779765 A      5/2006
CN       104464644 A      3/2015
(Continued)

*Primary Examiner* — Ricardo Osorio
(74) *Attorney, Agent, or Firm* — Ling Wu; Stephen Yang; Ling and Yang Intellectual Property

(57) ABSTRACT

Disclosed are a display substrate and a display apparatus, the display substrate includes a display region and a non-display region, the display region is provided with a pixel circuit and a light emitting unit; each pixel circuit is connected with K light emitting devices emitting light of a same color; each pixel circuit includes a current control sub-circuit and a light emitting selection sub-circuit; the current control sub-circuit is configured to provide a drive current to a first node under control of a reset signal terminal, an initial signal terminal, a scan signal terminal, a data signal terminal, a light emitting control terminal, and a first power supply terminal; the light emitting selection sub-circuit is configured to sequentially provide a signal of the first node to the K light emitting devices emitting light of the same color under control of K light emitting selection signal terminals.

20 Claims, 28 Drawing Sheets

(52) U.S. Cl.
CPC .............. *G09G 2300/0408* (2013.01); *G09G 2300/0426* (2013.01); *G09G 2300/0452* (2013.01); *G09G 2300/0819* (2013.01); *G09G 2300/0842* (2013.01); *G09G 2310/0286* (2013.01); *G09G 2310/08* (2013.01)

(58) Field of Classification Search
CPC ....... G09G 2310/0286; G09G 2310/08; G09G 3/3233; G09G 3/3266; G09G 2300/0842; G09G 3/32; H10K 59/131
See application file for complete search history.

(56) References Cited

U.S. PATENT DOCUMENTS

| | | |
|---|---|---|
| 2009/0315874 A1 | 12/2009 | Kim |
| 2015/0015468 A1 | 1/2015 | Ko et al. |
| 2015/0022508 A1 | 1/2015 | Kim et al. |
| 2016/0307510 A1 | 10/2016 | Duan et al. |
| 2017/0061868 A1* | 3/2017 | Tseng ................. G09G 3/3233 |
| 2017/0200412 A1 | 7/2017 | Gu et al. |
| 2017/0229056 A1 | 8/2017 | Li et al. |
| 2019/0340979 A1 | 11/2019 | Yang et al. |
| 2020/0035158 A1 | 1/2020 | Yang et al. |
| 2020/0243562 A1* | 7/2020 | Liu ..................... H01L 27/1222 |
| 2021/0225974 A1 | 7/2021 | Zeng et al. |
| 2021/0264848 A1 | 8/2021 | Yamashita et al. |
| 2021/0367081 A1 | 11/2021 | Yan et al. |
| 2021/0408210 A1* | 12/2021 | Kang ................... H10K 59/131 |

FOREIGN PATENT DOCUMENTS

| | | | |
|---|---|---|---|
| CN | 105528997 A | 4/2016 | |
| CN | 205508358 U | 8/2016 | |
| CN | 106297672 A | 1/2017 | |
| CN | 106448566 A | 2/2017 | |
| CN | 106782301 A | 5/2017 | |
| CN | 108604436 A | 9/2018 | |
| CN | 108885855 A | 11/2018 | |
| CN | 109119028 A | 1/2019 | |
| CN | 110649101 A | 1/2020 | |
| CN | 112863435 A | 5/2021 | |
| EP | 1531452 A1 * | 5/2005 | ........... G09G 3/3233 |
| JP | 2010-19963 A | 1/2010 | |
| KR | 20150006729 A * | 1/2015 | |
| WO | 2013129216 A1 | 9/2013 | |
| WO | WO-2016110021 A1 * | 7/2016 | ............... G09G 3/32 |

* cited by examiner

DISPLAY SUBSTRATE AND DISPLAY APPARATUS

CROSS-REFERENCE TO RELATED APPLICATION

The present application is a U.S. National Phase Entry of International Application No. PCT/CN2021/120001 having an international filing date of Sep. 23, 2021. The entire contents of the above-identified application are hereby incorporated by reference.

TECHNICAL FIELD

Embodiments of the present disclosure relate to, but are not limited to, the field of display technologies, and more particularly, to a display substrate and a display apparatus.

BACKGROUND

An Organic Light Emitting Diode (OLED for short) and a Quantum dot Light Emitting Diode (QLED for short) are active light emitting display devices and have advantages of self-luminescence, a wide viewing angle, a high contrast ratio, low power consumption, an extremely high response speed, lightness and thinness, flexibility, and a low cost, etc. With constant development of display technologies, a flexible display apparatus (Flexible Display) that uses an OLED or a QLED as a light emitting device and performs signal control through a Thin Film Transistor (TFT for short) has become a mainstream product in the field of display at present.

SUMMARY

The following is a summary about subject matters described herein in detail. The summary is not intended to limit the protection scope of claims.

In a first, the present disclosure provides a display substrate, including: a display region and a non-display region, the display region is provided with M1 rows and N1 columns of pixel circuits and M2 rows and N2 columns of light emitting units, each light emitting unit includes: a first light emitting device, a second light emitting device, and a third light emitting device, wherein the first light emitting device, the second light emitting device, and the third light emitting device emit light of different colors; wherein M1≠M2, N1≠N2; each pixel circuit is connected with K light emitting devices emitting light of a same color, wherein K is a positive integer greater than or equal to 2; each pixel circuit includes a current control sub-circuit and a light emitting selection sub-circuit; the current control sub-circuit is respectively connected with a reset signal terminal, an initial signal terminal, a scan signal terminal, a data signal terminal, a light emitting control terminal, a first power supply terminal, and a first node, and is configured to provide a drive current to the first node under control of the reset signal terminal, the initial signal terminal, the scan signal terminal, the data signal terminal, the light emitting control terminal, and the first power supply terminal; the light emitting selection sub-circuit is respectively connected with the first node, K light emitting selection signal terminals, and the K light emitting devices emitting light of the same color, and is configured to sequentially provide a signal of the first node to the K light emitting devices emitting light of the same color under control of the K light emitting selection signal terminals.

In some possible implementation modes, in each pixel circuit, the current control sub-circuit includes: a first transistor, a second transistor, a third transistor, a fourth transistor, a fifth transistor, and a capacitor, wherein the capacitor includes a first electrode plate and a second electrode plate; a control electrode of the first transistor is connected with the reset signal terminal, a first electrode of the first transistor is connected with the initial signal terminal, and a second electrode of the first transistor is connected with a second node; a control electrode of the second transistor is connected with the scan signal terminal, a first electrode of the second transistor is connected with the data signal terminal, and a second electrode of the second transistor is connected with a third node; a control electrode of the third transistor is connected with the second node, a first electrode of the third transistor is connected with a third node, and a second electrode of the third transistor is connected with the first node; a control electrode of the fourth transistor is connected with the scan signal terminal, a first electrode of the fourth transistor is connected with the second node, and a second electrode of the fourth transistor is connected with the first node; a control electrode of the fifth transistor is connected with the light emitting control terminal, a first electrode of the fifth transistor is connected with the first power supply terminal, and a second electrode of the fifth transistor is connected with the third node; and the first electrode plate is connected with the second node, and the second electrode plate is connected with the first power supply terminal.

In some possible implementation modes, in each pixel circuit, the light emitting selection sub-circuit includes a sixth transistor to a (5+K)-th transistor; a control electrode of a k-th transistor is connected with a (k−5)-th light emitting selection signal terminal, a first electrode of the k-th transistor is connected with the first node, a second electrode of the k-th transistor is connected with a (k−5)-th light emitting device, 6≤k≤5+K.

In some possible implementation modes, time at which the K light emitting selection signal terminals receive an effective level signal does not coincide.

In some possible implementation modes, light emitting devices connected with adjacent pixel circuits located in a same row emit light of different colors, and light emitting devices connected with adjacent pixel circuits located in a same column emit light of a same color.

In some possible implementation modes, when M2=K×M1 and N1=3×N2, light emitting devices connected with each pixel circuit are located in a same column; a pixel circuit of row m and column 3n−2 is respectively connected with a first light emitting device in a light emitting unit of row K×m−K+1 and column n, and a first light emitting device in a light emitting unit of row Km−K+2 and column n, until a first light emitting device in a light emitting unit of row K×m and column n, wherein 1≤m≤M1 and 1≤n≤N2; a pixel circuit of row m and column 3n−1 is respectively connected with a second light emitting device in the light emitting unit of row K×m−K+1 and column n, and a second light emitting device in the light emitting unit of row Km−K+2 and column n, until a second light emitting device in the light emitting unit of row K×m and column n; a pixel circuit of row m and column 3n is respectively connected with a third light emitting device in the light emitting unit of row K×m−K+1 and column n, and a third light emitting device in the light emitting unit of row Km−K+2 and column n, until a third light emitting device in the light emitting unit of row K×m and column n.

In some possible implementation modes, when M2=4× M1 and N1=3×N2, light emitting devices connected with pixel circuits are arranged along a first direction and a second direction, wherein the first direction intersects with the second direction; a pixel circuit of row m and column 3n-2 is connected with a first light emitting device in a light emitting unit of row 2m−1 and column 2n−1, a first light emitting device in a light emitting unit of row 2m−1 and column 2n, a first light emitting device in a light emitting unit of row 2m and column 2n−1, and a first light emitting device in a light emitting unit of row 2m and column 2n, wherein 1≤m≤M1 and 1≤n≤N2; a pixel circuit of row m and column 3n−1 is connected with a second light emitting device in the light emitting unit of row 2m−1 and column 2n−1, a second light emitting device in the light emitting unit of row 2m−1 and column 2n, a second light emitting device in the light emitting unit of row 2m and column 2n−1, and a second light emitting device in the light emitting unit of row 2m and column 2n; a pixel circuit of row m and column 3n is connected with a third light emitting device in the light emitting unit of row 2m−1 and column 2n−1, a third light emitting device in the light emitting unit of row 2m−1 and column 2n, a third light emitting device in the light emitting unit of row 2m and column 2n−1, and a third light emitting device in the light emitting unit of row 2m and column 2n.

In some possible implementation modes, N1 columns of data signal lines, M1 rows of scan signal lines, M1 rows of first power supply lines, M1 rows of reset signal lines, M1 rows of initial signal lines, P rows of first light emitting selection signal lines, P rows of second light emitting selection signal lines, P rows of third light emitting selection signal lines, P rows of fourth light emitting selection signal lines, and P rows of light emitting control lines are further included, wherein P=M1 or M1/2; the data signal lines extend along a first direction, and the scan signal lines, the first power supply lines, the reset signal lines, the initial signal lines, the first light emitting selection signal lines, the second light emitting selection signal lines, the third light emitting selection signal lines, the fourth light emitting selection signal lines, and the light emitting control lines extend along a second direction, wherein the first direction and the second direction intersect; a scan signal line of an s-th row is connected with a scan signal terminal of a pixel circuit of an s-th row, a first power supply line of an s-th row is connected with a first power supply terminal of the pixel circuit of the s-th row, a reset signal line of an s-th row is connected with a reset signal terminal of the pixel circuit of the s-th row, an initial signal line of an s-th row is connected with an initial signal terminal of the pixel circuit of the s-th row, a data signal line of a t-th column is connected with a data signal terminal of a pixel circuit of a t-th column, 1≤s≤M1, 1≤t≤N1; when P=M1, a first light emitting selection signal line of an s-th row is connected with a first light emitting selection signal terminal of the pixel circuit of the s-th row, a second light emitting selection signal line of an s-th row is connected with a second light emitting selection signal terminal of the pixel circuit of the s-th row, a third light emitting selection signal line of an s-th row is connected with a third light emitting selection signal terminal of the pixel circuit of the s-th row, a fourth light emitting selection signal line of an s-th row is connected with a fourth light emitting selection signal terminal of the pixel circuit of the s-th row; when P=M1/2, a first light emitting selection signal line of a v-th row is respectively connected with first light emitting selection signal terminals of a pixel circuit of a (2v−1)-th row and a pixel circuit of a 2v-th row, a second light emitting selection signal line of a v-th row is respectively connected with second light emitting selection signal terminals of the pixel circuit of the (2v−1)-th row and the pixel circuit of the 2v-th row, a third light emitting selection signal line of a v-th row is respectively connected with third light emitting selection signal terminals of the pixel circuit of the (2v−1)-th row and the pixel circuit of the 2v-th row, a fourth light emitting selection signal line of a v-th row is respectively connected with fourth light emitting selection signal terminals of the pixel circuit of the (2v−1)-th row and the pixel circuit of the 2v-th row, and a light emitting control line of a v-th row is respectively connected with light emitting control terminals of the pixel circuit of the (2v−1)-th row and the pixel circuit of the 2v-th row, wherein 1≤v≤P.

In some possible implementation modes, a first light emitting selection signal line and a second light emitting selection signal line are arranged in a same layer, a third light emitting selection signal line and a fourth light emitting selection signal line are arranged in a same layer, and the first light emitting selection signal line and the third light emitting selection signal line are arranged in different layers.

In some possible implementation modes, the non-display region is provided with a scan drive circuit, a light emitting drive circuit, a first light emitting selection drive circuit, a second light emitting selection drive circuit, a third light emitting selection drive circuit, and a fourth light emitting selection drive circuit, and the display region includes a first side and a second side which are oppositely disposed; the scan drive circuit is located on the first side and the second side of the display region, the light emitting drive circuit is located on a side of the scan drive circuit away from the display region, the first light emitting selection drive circuit is located on the first side of the display region and between the scan drive circuit and the light emitting drive circuit, the second light emitting selection drive circuit is located on the second side of the display region and between the scan drive circuit and the light emitting drive circuit, the third light emitting selection drive circuit is located on the first side of the display region and between the first light emitting selection drive circuit and the light emitting drive circuit, and the fourth light emitting selection drive circuit is located on the second side of the display region and between the second light emitting selection drive circuit and the light emitting drive circuit; the scan drive circuit includes: M1 cascaded scan shift registers, and a scan shift register of an s-th stage is connected with a scan signal line of an s-th row, the light emitting drive circuit includes P cascaded light emitting shift registers, wherein a light emitting shift register of a v-th stage is connected with a light emitting control line of a v-th row; the first light emitting selection drive circuit includes P cascaded first light emitting selection shift registers, a first light emitting selection shift register of a v-th stage is connected with a first light emitting selection signal line of a v-th row; the second light emitting selection drive circuit includes P cascaded second light emitting selection shift registers, a second light emitting selection shift register of a v-th stage is connected with a second light emitting selection signal line of a v-th row; the third light emitting selection drive circuit includes P cascaded third light emitting selection shift registers, a third light emitting selection shift register of a v-th stage is connected with a third light emitting selection signal line of a v-th row; and the fourth light emitting selection drive circuit includes P cascaded fourth light emitting selection shift registers, a fourth light emitting selection shift register of a v-th stage is connected with a fourth light emitting selection signal line of a v-th row.

In some possible implementation modes, a base substrate, and a drive circuit layer and a light emitting structure layer that are sequentially disposed on the base substrate are included; the drive circuit layer includes a pixel circuit, and the light emitting structure layer includes a light emitting unit; the drive circuit layer includes: a first insulation layer, a semiconductor layer, a second insulation layer, a first metal layer, a third insulation layer, a second metal layer, a fourth insulation layer, a third metal layer, a fifth insulation layer, a fourth metal layer, a sixth insulation layer, a fifth metal layer, a seventh insulation layer, a sixth metal layer, an eighth insulation layer, a seventh metal layer, and a planarization layer which are stacked on the base substrate in sequence; when K=4, the semiconductor layer includes active layers of multiple pixel circuits, an active layer of each pixel circuit includes active layers of multiple transistors; the first metal layer includes a light emitting control line, a scan signal line, a reset signal line, and first conductive layers of multiple pixel circuits, wherein a first conductive layer of each pixel circuit includes gate electrodes of multiple transistors and a first electrode plate; the second metal layer includes a first power supply line, an initial signal line, and second conductive layers of multiple pixel circuits, a second conductive layer of each pixel circuit includes first electrodes and second electrodes of multiple transistors, a first connection part, and a second connection part; the third metal layer includes a data signal line and third conductive layers of multiple pixel circuits, a third conductive layer of each pixel circuit includes a first electrode of a second transistor, a third connection part, a fourth connection part, and a fifth connection part; the fourth metal layer includes fourth conductive layers of multiple pixel circuits, and a fourth conductive layer of each pixel circuit includes a sixth connection part, a seventh connection part, an eighth connection part, a ninth connection part, a tenth connection part, and an eleventh connection part; the fifth metal layer includes fifth conductive layers of multiple pixel circuits, and a conductive layer of each pixel circuit includes a twelfth connection part; the sixth metal layer includes a third light emitting selection signal line, a fourth light emitting selection signal line, and a sixth conductive layer of another pixel circuit except pixel circuits of a first column, wherein the sixth conductive layer of the another pixel circuit except the pixel circuits of the first column includes a thirteenth connection part and a fourteenth connection part; and the seventh metal layer includes a first light emitting selection signal line, a second light emitting selection signal line, and seventh conductive layers of multiple pixel circuits, and a seventh conductive layer of each pixel circuit includes a fifteenth connection part, a sixteenth connection part, a seventeenth connection part, and an eighteenth connection part.

In some possible implementation modes, an orthographic projection of the initial signal line of the s-th row on the base substrate is at least partially overlapped with an orthographic projection of the reset signal line of the s-th row on the base substrate; an orthographic projection of the first light emitting selection signal line on the base substrate is located between an orthographic projection of the third light emitting selection signal line on the base substrate and an orthographic projection of the fourth light emitting selection signal line on the base substrate; and an orthographic projection of the second light emitting selection signal line on the base substrate is located on a side of the orthographic projection of the fourth light emitting selection signal line on the base substrate away from the orthographic projection of the third light emitting selection signal line on the base substrate.

In some possible implementation modes, active layers of adjacent pixel circuits located in a same row are arranged symmetrically along a midline of the adjacent pixel circuits, and an active layer of a pixel circuit of row i and column j is connected with an active layer of a pixel circuit of row i and column j+1, wherein $1 \leq i \leq M1$, $1 \leq j < N1$, and are odd numbers; first conductive layers of adjacent pixel circuits located in a same row are symmetrically arranged along a midline between the adjacent pixel circuits; second conductive layers of adjacent pixel circuits located in a same row are symmetrically arranged along a midline between the adjacent pixel circuits; third conductive layers of adjacent pixel circuits located in a same row are symmetrically arranged along a midline between the adjacent pixel circuits; fourth conductive layers of adjacent pixel circuits located in a same row are symmetrically arranged along a midline between the adjacent pixel circuits; and fifth conductive layers of adjacent pixel circuits located in a same row are symmetrically arranged along a midline between the adjacent pixel circuits.

In some possible implementation modes, an active layer of a first transistor includes: a first branch segment, a first connection segment, and a second branch segment; the first branch segment and the second branch segment are located on a same side of the first connection segment, and the first connection segment is respectively connected with the first branch segment and the second branch segment; the first branch segment and the second branch segment extend along a first direction, and the first connection segment extends along a second direction; a length of the first connection segment is greater than a length of the first branch segment.

In some possible implementation modes, when the light emitting devices connected with the pixel circuits are arranged along the first direction and the second direction, an active layer of a fifth transistor of a pixel circuit of row i and column j and an active layer of a fifth transistor of a pixel circuit of row i and column i+1 are of an integrally formed structure; a gate electrode of an eighth transistor of the pixel circuit of row i and column j and a gate electrode of an eighth transistor of a pixel circuit of row i and column j+1 are of an integrally formed structure; a gate electrode of a ninth transistor of the pixel circuit of row i and column j and a gate electrode of a ninth transistor of the pixel circuit of row i and column j+1 are of an integrally formed structure; a gate electrode of a sixth transistor of the pixel circuit of row i and column j+1 and a gate electrode of a sixth transistor of a pixel circuit of row i and column j+2 are of an integrally formed structure; a gate electrode of a seventh transistor of the pixel circuit of row i and column j+1 and a gate electrode of a seventh transistor of the pixel circuit of row i and column j+2 are of an integrally formed structure; a first connection part of the pixel circuit of row i and column j and a first connection part of the pixel circuit of row i and column j+1 are of an integrally formed structure; a first electrode of the fifth transistor of the pixel circuit of row i and column j and a first electrode of the fifth transistor of the pixel circuit of row i and column j+1 are of an integrally formed structure; an eighth connection part of the pixel circuit of row i and column j and an eighth connection part of the pixel circuit of row i and column j+1 are of an integrally formed structure; and a ninth connection part of the pixel circuit of row i and column j and a ninth connection part of the pixel circuit of row i and column j+1 are of an integrally formed structure.

In some possible implementation modes, the second insulation layer and the third insulation layer are provided with a first via to a ninth via located in each pixel circuit; the third insulation layer is further provided with a tenth via and an eleventh via located in each pixel circuit; the second insulation layer, the third insulation layer, and the fourth insulation layer are provided with a twelfth via and thirteenth via; the third insulation layer and the fourth insulation layer are provided with a fourteenth via, a fifteenth via, and a sixteenth via located in each pixel circuit; the fourth insulation layer and the fifth insulation layer are provided with a seventeenth via to a twenty-second via located in each pixel circuit; the third insulation layer, the fourth insulation layer, the fifth insulation layer, and the sixth insulation layer are provided with a twenty-third via and a twenty-fourth via located in each pixel circuit; the sixth insulation layer and the seventh insulation layer are provided with a twenty-fifth via and a twenty-sixth via located in each pixel circuit; the sixth insulation layer and the seventh insulation layer are further provided with a twenty-seventh via and a twenty-eighth via located in the another pixel circuit except the pixel circuits of the first column; the fifth insulation layer, the sixth insulation layer, the seventh insulation layer, and the eighth insulation layer are provided with a twenty-ninth via and a thirtieth via located in each pixel circuit; in the pixel circuits of the first column, the sixth insulation layer, the seventh insulation layer, and the eighth insulation layer are provided with a thirty-first via and a thirty-second via located in each pixel circuit, the sixth insulation layer, the seventh insulation layer, and the eighth insulation layer are further provided with a thirty-third via and a thirty-fourth via located in each pixel circuit; the eighth insulation layer is provided with a thirty-fifth via and a thirty-sixth via located in the another pixel circuit except the pixel circuits of the first column; and the planarization layer is provided with a thirty-seventh via, a thirty-eighth via, a thirty-ninth via, and a fortieth via located in each pixel circuit; the first via exposes an active layer of a fifth transistor, the second via exposes an active layer of a third transistor, the third via exposes an active layer of a first transistor, the fourth via exposes an active layer of a sixth transistor, the fifth via exposes an active layer of an eighth transistor, the sixth via exposes the active layer of the eighth transistor, the seventh via exposes the active layer of the sixth transistor, the eighth via exposes an active layer of a seventh transistor, the ninth via exposes an active layer of a ninth transistor, the tenth via exposes a gate electrode of the eighth transistor, the eleventh via exposes a gate electrode of the ninth transistor, the twelfth via exposes the active layer of the first transistor and an active layer of a fourth transistor, the thirteenth via exposes an active layer of the second transistor, the fourteenth via exposes the first electrode plate, the fifteenth via exposes a gate electrode of the sixth transistor, the sixteenth via exposes a gate electrode of the seventh transistor, the seventeenth via exposes a second electrode of the sixth transistor, the eighteenth via exposes a second electrode of the eighth transistor, the nineteenth via exposes the first connection part, the twentieth via exposes the second connection part, the twenty-first via exposes a second electrode of the seventh transistor, the twenty-second via exposes a second electrode of the ninth transistor, the twenty-third via exposes a second electrode of the third transistor, the twenty-fourth via exposes a first electrode of the sixth transistor; in each pixel circuit, the twenty-fifth via exposes the eighth connection part, the twenty-sixth via exposes the ninth connection part, the twenty-seventh via exposes the sixth connection part, the twenty-eighth via exposes the tenth connection part, the twenty-ninth via exposes the fourth connection part, the thirtieth via exposes the fifth connection part, the thirty-first via exposes the sixth connection part, the thirty-second via exposes the tenth connection part, the thirty-third via exposes the seventh connection part, the thirty-fourth via exposes the eleventh connection part, the thirty-fifth via exposes the thirteenth connection part, the thirty-sixth via exposes the fourteenth connection part, the thirty-seventh via exposes the fifteenth connection part, the thirty-eighth via exposes the sixteenth connection part, the thirty-ninth via exposes the seventeenth connection part, and the fortieth via exposes the eighteenth connection part.

In some possible implementation modes, a first via of a pixel circuit of row i and column j and a first via of a pixel circuit of row i and column j+1 are a same via; a tenth via of the pixel circuit of row i and column j and a tenth via of the pixel circuit of row i and column j+1 are a same via; an eleventh via of the pixel circuit of row i and column j and an eleventh via of the pixel circuit of row i and column j+1 are a same via; a fifteenth via of the pixel circuit of row i and column j+1 and a fifteenth via of a pixel circuit of row i and column j+2 are a same via; a sixteenth via of the pixel circuit of row i and column j+1 and a sixteenth via of the pixel circuit of row i and column j+2 are a same via; a nineteenth via of the pixel circuit of row i and column j and a nineteenth via of the pixel circuit of row i and column j+1 are a same via; a twenty-fifth via of the pixel circuit of row i and column j and a twenty-fifth via of the pixel circuit of row i and column j+1 are a same via; a twenty-sixteenth via of the pixel circuit of row i and column j and a twenty-sixteenth via of the pixel circuit of row i and column j+1 are a same via; a twenty-ninth via of the pixel circuit of row i and column j+1 and a twenty-ninth via of the pixel circuit of row i and column j+2 are a same via; and a thirtieth via of the pixel circuit of row i and column j+1 and a thirtieth via of the pixel circuit of row i and column j+2 are a same via.

In some possible implementation modes, for each pixel circuit, a first electrode of a fifth transistor is connected with an active layer of the fifth transistor through the first via, a second electrode of a third transistor is connected with an active layer of the third transistor through the second via, a first electrode of a first transistor is connected with an active layer of the first transistor through the third via, a second electrode of a sixth transistor is connected with an active layer of the sixth transistor through the fourth via, a second electrode of an eighth transistor is connected with an active layer of the eighth transistor through the fifth via, a first electrode of the eighth transistor is connected with the active layer of the eighth transistor through the sixth via, a first electrode of the sixth transistor is connected with the active layer of the sixth transistor through the seventh via, a second electrode of a seventh transistor is connected with an active layer of the seventh transistor through the eighth via, a second electrode of a ninth transistor is connected with an active layer of the ninth transistor through the ninth via, the first connection part is connected with a gate electrode of the eighth transistor through the tenth via, the second connection part is connected with a gate electrode of the ninth transistor through the eleventh via, the third connection part is connected with the active layer of the first transistor through the twelfth via, the third connection part is connected with the first electrode plate through the fourteenth via, a first electrode of a second transistor is connected with an active layer of the second transistor through the thirteenth via, the fourth connection part is connected with a gate electrode of the sixth transistor through the fifteenth via, the fifth connection part is connected with a gate electrode of the seventh transistor through the sixteenth via, the sixth connection part is connected with the second electrode of the sixth transistor through the seventeenth via, the seventh connection part is connected with the second electrode of the eighth transistor through the eighteenth via, the eighth connection part is connected with the first connection part through the nineteenth via, the ninth connection part is connected with the second connection part through the twentieth via, the tenth connection part is connected with a second electrode of the seventh transistor through the twenty-first via, the eleventh connection part is connected with the second electrode of the ninth transistor through the twenty-second via, the twelfth connection part is connected with the second electrode of the third transistor through the twenty-third via, and is connected with the first electrode of the sixth transistor through the twenty-fourth via, the third light emitting selection signal line is connected with the eighth connection part through the twenty-fifth via, the fourth light emitting selection signal line is connected with the ninth connection part through the twenty-sixth via, the first light emitting selection signal line is connected with the fourth connection part through the twenty-ninth via, the second light emitting selection signal line is connected with the fifth connection part through the thirtieth via, a first light emitting device connected with a pixel circuit is connected with the fifteenth connection part through the thirty-sixth via, a second light emitting device connected with the pixel circuit is connected with the seventeenth connection part through the thirty-eighth via, a third light emitting device connected with the pixel circuit is connected with the sixteenth connection part through the thirty-seventh via, and a fourth light emitting device connected with the pixel circuit is connected with the eighteenth connection part through the thirty-eighth via; in the pixel circuits of the first column, the fifteenth connection part is connected with the sixth connection part through the thirty-first via, the sixteenth connection part is connected with the tenth connection part through the thirty-second via, the seventeenth connection part is connected with the seventh connection part through the thirty-third via, the eighteenth connection part is connected with the eleventh connection part through the thirty-fourth via; in the another pixel circuit except the pixel circuits of the first column, the thirteenth connection part is connected with the sixth connection part through the twenty-seventh via, the fourteenth connection part is connected with the tenth connection part through the twenty-eighth via, the fifteenth connection part is connected with the seventh connection part through the thirty-third via, the sixteenth connection part is connected with the eleventh connection part through the thirty-fourth via, the seventeenth connection part is connected with the thirteenth connection part through the thirty-fifth via, and the eighteenth connection part is connected with the fourteenth connection part through the thirty-sixth via.

In some possible implementation modes, a light emitting device includes: a first electrode, an organic emitting layer, and a second electrode; the light emitting structure layer includes a first electrode layer, a pixel definition layer, a light emitting material layer, and a second electrode layer which are sequentially stacked on a drive structure layer; the first electrode layer includes first electrodes arranged in an array, the light emitting material layer includes organic emitting layers arranged in an array, and the second electrode layer includes a second electrode; a pixel circuit is connected with a first electrode of a light emitting device connected with the pixel circuit, and second electrodes of all light emitting devices are connected with a second power supply terminal; for a pixel circuit of row m and column 3n-2, an orthographic projection of the fifteenth connection part on the base substrate is at least partially overlapped with an orthographic projection of a first electrode of a first light emitting device in a light emitting unit of row 2m-1 and column 2n-1 on the base substrate, an orthographic projection of the sixteenth connection part on the base substrate is at least partially overlapped with an orthographic projection of a first electrode of a first light emitting device in a light emitting unit of row 2m and column 2n-1 on the base substrate; an orthographic projection of the seventeenth connection part on the base substrate is at least partially overlapped with an orthographic projection of a first electrode of a first light emitting device in a light emitting unit of row 2m-1 and column 2n on the base substrate, and an orthographic projection of the eighteenth connection part on the base substrate is at least partially overlapped with an orthographic projection of a first electrode of a first light emitting device in a light emitting unit of row 2m and column 2n on the base substrate; for a pixel circuit of row m and column 3n-1, an orthographic projection of the fifteenth connection part on the base substrate is at least partially overlapped with an orthographic projection of a first electrode of a second light emitting device in a light emitting unit of row 2m-1 and column 2n-1 on the base substrate, an orthographic projection of the sixteenth connection part on the base substrate is at least partially overlapped with an orthographic projection of a first electrode of a second light emitting device in a light emitting unit of row 2m and column 2n-1 on the base substrate; an orthographic projection of the seventeenth connection part on the base substrate is at least partially overlapped with an orthographic projection of a first electrode of a second light emitting device in a light emitting unit of row 2m-1 and column 2n on the base substrate, and an orthographic projection of the eighteenth connection part on the base substrate is at least partially overlapped with an orthographic projection of a first electrode of a second light emitting device in a light emitting unit of row 2m and column 2n on the base substrate; for a pixel circuit of row m and column 3n, an orthographic projection of the fifteenth connection part on the base substrate is at least partially overlapped with an orthographic projection of a first electrode of a third light emitting device in a light emitting unit of row 2m-1 and column 2n-1 on the base substrate, an orthographic projection of the sixteenth connection part on the base substrate is at least partially overlapped with an orthographic projection of a first electrode of a third light emitting device in a light emitting unit of row 2m and column 2n-1 on the base substrate; an orthographic projection of the seventeenth connection part on the base substrate is at least partially overlapped with an orthographic projection of a first electrode of a third light emitting device in a light emitting unit of row 2m-1 and column 2n on the base substrate, and an orthographic projection of the eighteenth connection part on the base substrate is at least partially overlapped with an orthographic projection of a first electrode of a third light emitting device in a light emitting unit of row 2m and column 2n on the base substrate.

In some possible implementation modes, for each light emitting device, a surface of a first electrode away from the base substrate includes: a first terminal and a second terminal; the planarization layer is provided with a via, and the first electrode is connected with a pixel circuit through the via of the planarization layer; a via of the planarization layer connecting first electrodes of light emitting devices located in a same row with a pixel circuit is located at a same terminal of the first electrodes; a via of the planarization layer connecting a first electrode of a light emitting device located in an x-th row with a pixel circuit is located at a first terminal or a second terminal of the first electrode, and a via of the planarization layer connecting a first electrode of a light emitting device located in an (x+1)-th row with a pixel circuit is located at a first terminal or a second terminal of the first electrode.

In a second aspect, the present disclosure further provides a display apparatus, including the display substrate described above.

After reading and understanding drawings and the detailed description, other aspects may be understood.

BRIEF DESCRIPTION OF DRAWINGS

The accompanying drawings are used for providing understanding of technical solutions of the present disclosure, and constitute a part of the specification. They are used for explaining the technical solutions of the present disclosure together with the embodiments of the present disclosure, and do not constitute a limitation on the technical solutions of the present disclosure.

DETAILED DESCRIPTION

Figure 1:
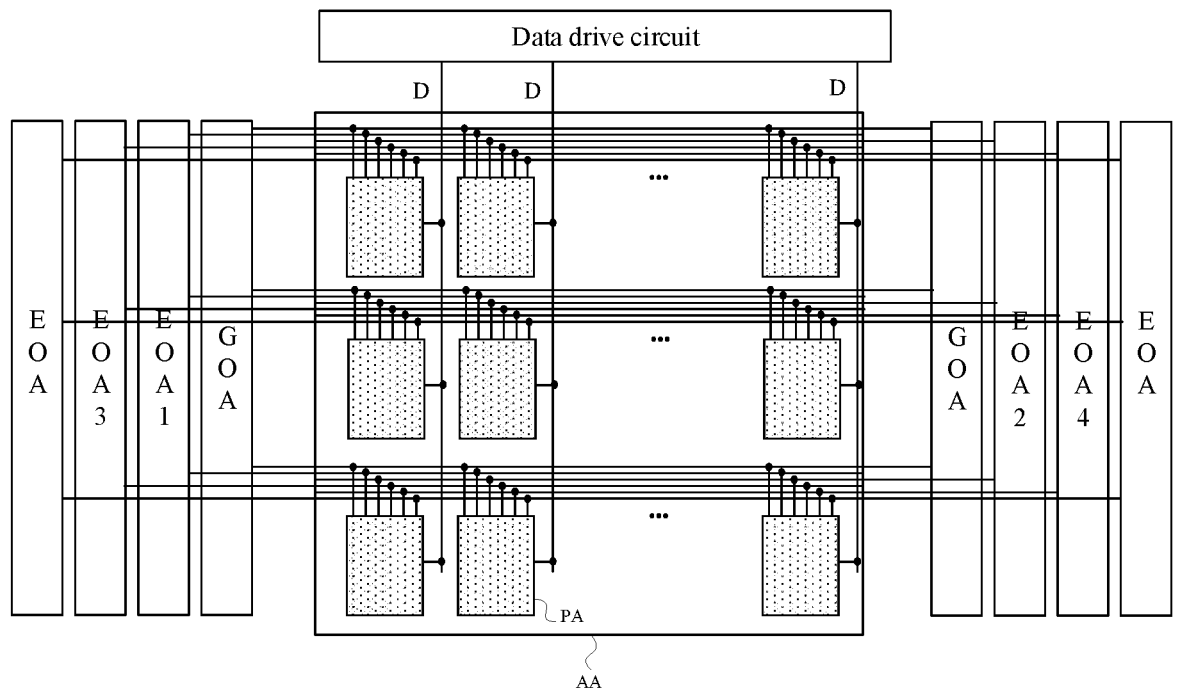
FIG. 1 is a schematic diagram of a structure of a display substrate.

To make objectives, technical solutions, and advantages of the present disclosure clearer, the embodiments of the present disclosure will be described in detail with reference to the accompanying drawings. It is to be noted that implementation modes may be implemented in multiple different forms. Those of ordinary skills in the art may easily understand such a fact that modes and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict. In order to keep following description of the embodiments of the present disclosure clear and concise, detailed descriptions about part of known functions and known components are omitted in the present disclosure. The drawings of the embodiments of the present disclosure only involve structures involved in the embodiments of the present disclosure, and other structures may refer to usual designs.

In the drawings, a size of each constituent element, a thickness of a layer, or a region is exaggerated sometimes for clarity. Therefore, one mode of the present disclosure is not necessarily limited to the size, and shapes and sizes of various components in the drawings do not reflect actual scales. In addition, the drawings schematically illustrate ideal examples, and one mode of the present disclosure is not limited to shapes, numerical values, or the like shown in the drawings.

Ordinal numerals such as "first", "second", and "third" in the specification are set to avoid confusion of constituent elements, but not to set a limit in quantity.

In the specification, for convenience, wordings indicating directional or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to a direction according to which the constituent elements are described. Therefore, appropriate replacements may be made according to a situation without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two elements. Those of ordinary skill in the art may understand specific meanings of these terms in the present disclosure according to a specific situation.

In the specification, a transistor refers to an element which at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be the drain electrode, and a second electrode may be the source electrode. Or, the first electrode may be the source electrode, and the second electrode may be the drain electrode. In cases that transistors with opposite polarities are used, a direction of a current is changed during operation of a circuit, or the like, functions of the "source electrode" and the "drain electrode" are sometimes interchangeable. Therefore, the "source electrode" and the "drain electrode" are interchangeable in the specification.

In the specification, an "electrical connection" includes a case that constituent elements are connected together through an element with some electrical effect. The "element with some electrical effect" is not particularly limited as long as electrical signals may be sent and received between the connected constituent elements. Examples of the "element with some electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

In the present disclosure, "about" refers to that a boundary is defined not so strictly and numerical values within process and measurement error ranges are allowed.

A resolution of a display substrate in a near-eye display apparatus is relatively low, resulting in a screen window effect in the near-eye display apparatus and a poor display effect.

Figure 2:
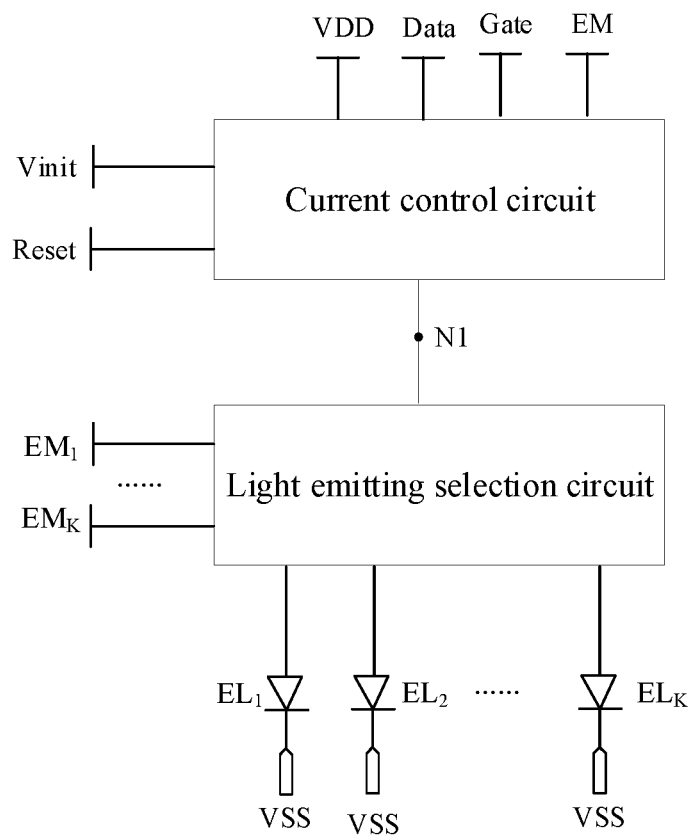
FIG. 2 is a schematic diagram of a structure of a pixel circuit according to an exemplary embodiment.
Figure 3:
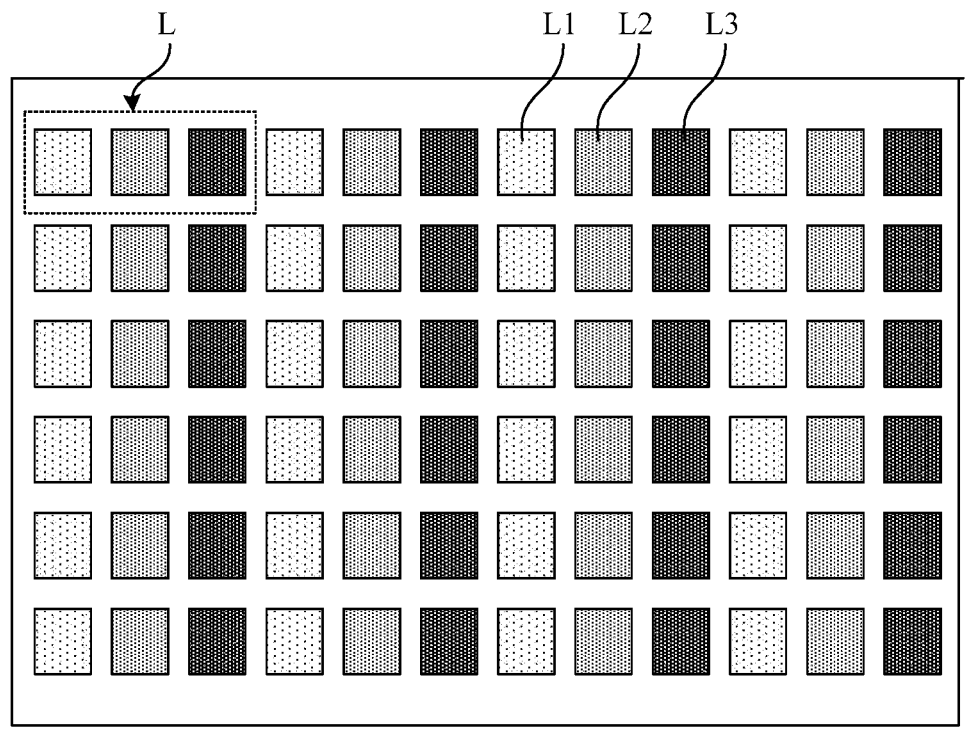
FIG. 3 is a schematic diagram of a display substrate according to an exemplary embodiment.

FIG. 1 is a schematic diagram of a structure of a display substrate, FIG. 2 is a schematic diagram of a structure of a pixel circuit according to an exemplary embodiment, and FIG. 3 is a schematic diagram of a display substrate according to an exemplary embodiment. As shown in FIGS. 1 to 3, the display substrate includes: a display region AA and a non-display region at a periphery of the display region, the display region AA is provided with M1 rows and N1 columns of pixel circuits PA and M2 rows and N2 columns of light emitting units, each light emitting unit L includes: a first light emitting device L1, a second light emitting device L2, and a third light emitting device L3, wherein the first light emitting device L1, the second light emitting device L2, and the third light emitting device L3 emit light of different colors; wherein, M1≠M2, N1≠N2; each pixel circuit is connected with K light emitting devices emitting light of a same color, where K is a positive integer greater than or equal to 2.

As shown in FIG. 2, in an exemplary embodiment, each pixel circuit may include a current control sub-circuit and a light emitting selection sub-circuit. The current control sub-circuit is respectively connected with a reset signal terminal Reset, an initial signal terminal Vinit, a scan signal terminal Gate, a data signal terminal Data, a light emitting control terminal EM, a first power supply terminal VDD, and a first node N1, and is configured to provide a drive current to the first node N1 under control of the reset signal terminal Reset, the initial signal terminal Vinit, the scan signal terminal Gate, the data signal terminal Data, the light emitting control terminal EM, and the first power supply terminal VDD. The light emitting selection sub-circuit is respectively connected with the first node N1, K light emitting selection signal terminals $EM_1$ to $EM_K$ and K light emitting devices $EL_1$ to $EL_K$ emitting light of a same color, and is configured to sequentially supply a signal of the first node N1 to K light emitting devices $EL_1$ to $EL_K$ emitting light of a same color under control of the K light emitting selection signal terminals $EM_1$ to $EM_K$.

In an exemplary embodiment, a light emitting device may be an OLED or a QLED.

In an exemplary embodiment, three light emitting devices in a light emitting unit may respectively emit red, green, or blue light, which is not limited in the present disclosure. In an exemplary implementation mode, a shape of each light emitting device may be a rectangle, a diamond, a pentagon, or a hexagon. The three light emitting devices may be arranged in a horizontal juxtaposition, a vertical juxtaposition, or a manner like a Chinese character "品", and the present disclosure is not limited herein.

In an exemplary embodiment, the first power supply terminal continuously provides a high-level signal.

A display substrate according to an embodiment of the present disclosure includes: a display region and a non-display region. the display region is provided with M1 rows and N1 columns of pixel circuits and M2 rows and N2 columns of light emitting units, each light emitting unit includes: a first light emitting device, a second light emitting device, and a third light emitting device, wherein the first light emitting device, the second light emitting device, and the third light emitting device emit light of different colors; wherein, M1≠M2, N1≠N2; each pixel circuit is connected with K light emitting devices emitting light of a same color, wherein K is a positive integer greater than or equal to 2; each pixel circuit includes a current control sub-circuit and a light emitting selection sub-circuit; the current control sub-circuit is respectively connected with a reset signal terminal, an initial signal terminal, a scan signal terminal, a data signal terminal, a light emitting control terminal, a first power supply terminal, and a first node, and is configured to provide a drive current to the first node under control of the reset signal terminal, the initial signal terminal, the scan signal terminal, the data signal terminal, the light emitting control terminal, and the first power supply terminal; the light emitting selection sub-circuit is respectively connected with the first node, K light emitting selection signal terminals, and K light emitting devices emitting light of a same color, and is configured to sequentially provide a signal of the first node to K light emitting devices emitting light of the same color under control of K light emitting selection signal terminals. By connecting a pixel circuit with K light emitting devices, a resolution of the display substrate may be increased, thereby improving a display effect of the display substrate.

Figure 4A:
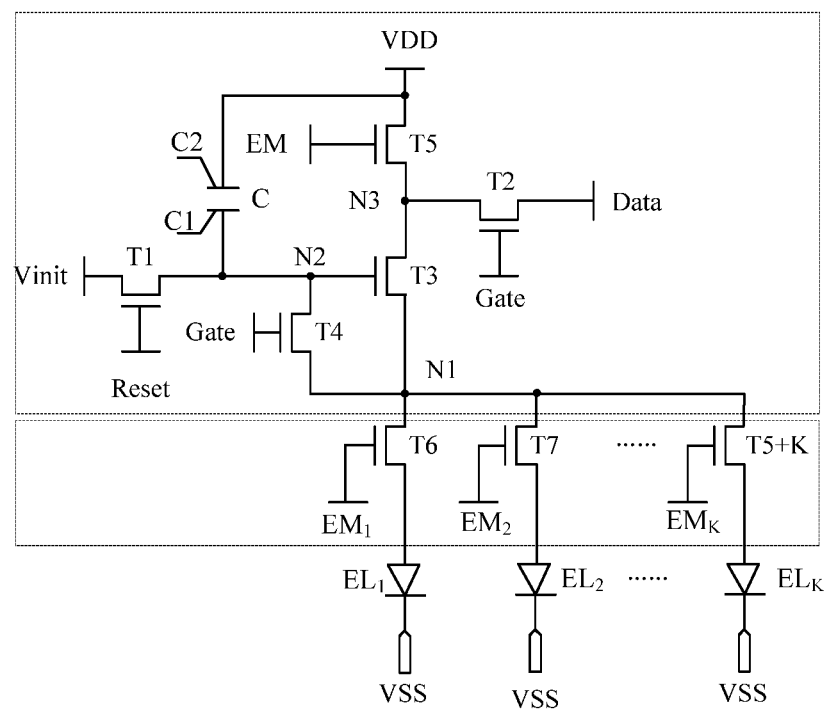
FIG. 4A is a schematic diagram of a pixel circuit according to an exemplary embodiment.
Figure 4B:
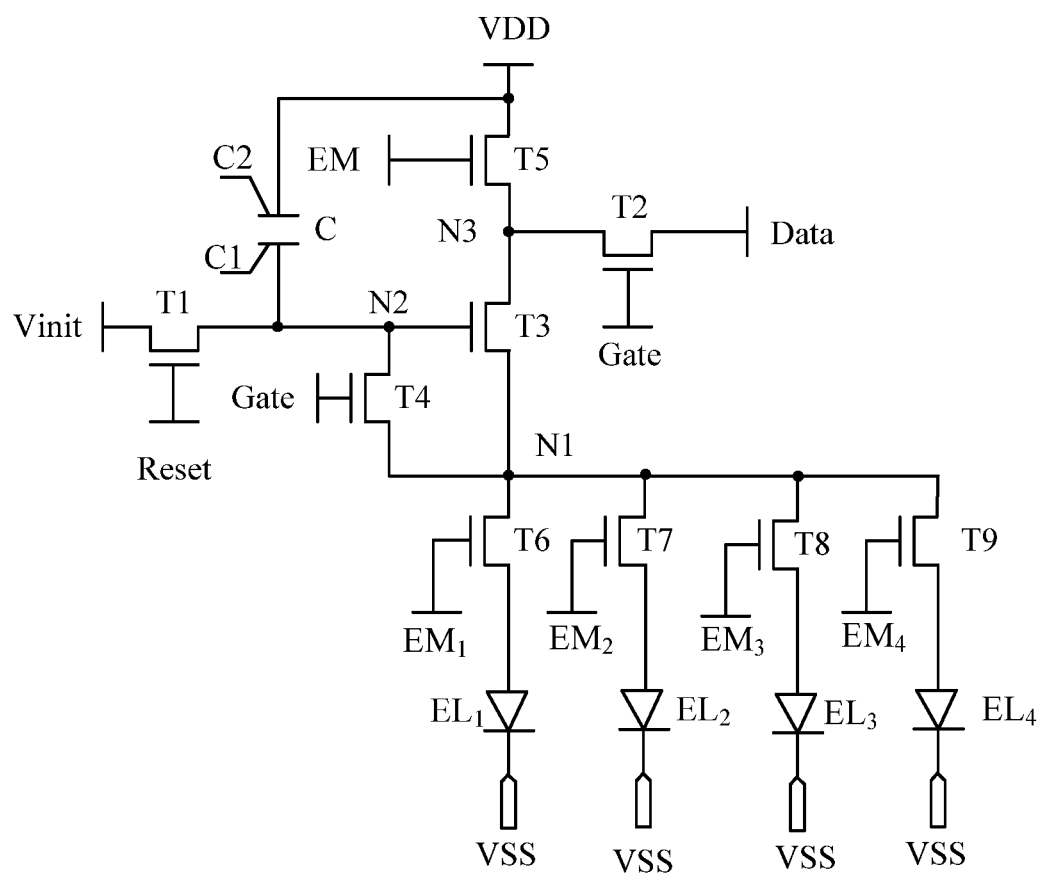
FIG. 4B is a schematic diagram of a pixel circuit according to another exemplary embodiment.

In an exemplary embodiment, FIG. 4A is a schematic diagram of a pixel circuit according to an exemplary embodiment, and FIG. 4B is a schematic diagram of a pixel circuit according to another exemplary embodiment. As shown in FIG. 4A and FIG. 4B, in each pixel circuit, a current control sub-circuit may include: a first transistor T1, a second transistor T2, a third transistor T3, a fourth transistor T4, a fifth transistor T5, and a capacitor C, wherein the capacitor C includes a first electrode plate C1 and a second electrode plate C2. A control electrode of the first transistor T1 is connected with a reset signal terminal Reset, a first electrode of the first transistor T1 is connected with an initial signal terminal Vinit, and a second electrode of the first transistor T1 is connected with a second node N2. A control electrode of the second transistor T2 is connected with a scan signal terminal Gate, a first electrode of the second transistor T2 is connected with a data signal terminal Data, and a second electrode of the second transistor T2 is connected with a third node N3. A control electrode of the third transistor T3 is connected with the second node N2, a first electrode of the third transistor T3 is connected with the third node N3, and a second electrode of the third transistor T3 is connected with a first node N1. A control electrode of the fourth transistor T4 is connected with the scan signal terminal Gate, a first electrode of the fourth transistor T4 is connected with the second node N2, and a second electrode of the fourth transistor T4 is connected with the first node N1. A control electrode of the fifth transistor T5 is connected with a light emitting control terminal EM, a first electrode of the fifth transistor T5 is connected with a first power supply terminal VDD, and a second electrode of the fifth transistor T5 is connected with the third node N3. The first electrode plate C1 is connected with the second node n2, and the second electrode plate C2 is connected with the first power supply terminal VDD.

In an exemplary embodiment, as shown in FIGS. 4A to 4B, in each pixel circuit, a light emitting selection sub-circuit may include a sixth transistor T6 to a (5+K)-th transistor T5+K. A control electrode of a k-th transistor Tk is connected with a (k−5)-th light emitting selection signal terminal $EM_{k-5}$, a first electrode of the k-th transistor Tk is connected with the first node N1, a second electrode of the k-th transistor Tk is connected with a (k−5)-th light emitting device $EL_{k-5}$, 6≤K≤5+K. FIG. 4B is described by taking K=4 as an example. A control electrode of the sixth transistor T6 in FIG. 4B is connected with a first light emitting selection signal terminal $EM_1$, s first electrode of the sixth transistor T6 is connected with the first node N1, a second electrode of the sixth transistor T6 is connected with a first light emitting device $EL_1$, a control electrode of a seventh transistor T7 is connected with a second light emitting selection signal terminal $EM_2$, a first electrode of the seventh transistor T7 is connected with the first node N1, and a second electrode of the seventh transistor T7 is connected with a second light emitting device $EL_2$. A control electrode of an eighth transistor T8 is connected with a third light emitting selection signal terminal $EM_3$. A first electrode of the eighth transistor T8 is connected with the first node N1, and a second electrode of the eighth transistor T8 is connected with a third light emitting device $EL_3$. A control electrode of a ninth transistor T9 is connected with a fourth light emitting selection signal terminal $EM_4$. A first electrode of the ninth transistor T9 is connected with the first node N1, and a second electrode of the ninth transistor T9 is connected with a fourth light emitting device $EL_4$.

In an exemplary embodiment, the third transistor is a drive transistor. The first transistor, the second transistor, the fourth transistor to the (5+K)-th transistor are all switch transistors. For example, the first transistor T1 to the (5+K)-th transistor T5+K may be low temperature poly silicon thin film transistors, or may be oxide thin film transistors, or may be low temperature poly silicon thin film transistors and oxide thin film transistors. An active layer of a low temperature poly silicon thin film transistor is made of Low Temperature Poly Silicon (LTPS for short), and an active layer of an oxide thin film transistor is made of an oxide. The low temperature poly silicon thin film transistor has advantages of a high mobility, fast charging, and the like, and the oxide thin film transistor has advantages of a low leakage current and the like. In an exemplary implementation mode, a low temperature poly silicon thin film transistor and an oxide thin film transistor may be integrated on one display substrate to form a Low Temperature Polycrystalline Oxide (LTPO for short) display substrate, so that advantages of the two may be utilized, high Pixel Per Inch (PPI for short) and low-frequency drive may be achieved, power consumption may be reduced, and display quality may be improved.

In an exemplary embodiment, the first transistor T1 to the (5+K)-th transistor T5+K may be P-type transistors, or may be N-type transistors. Use of a same type of transistors in a pixel drive circuit may simplify a process flow, reduce process difficulties of a display panel, and improve a product yield. In an exemplary embodiment, the first transistor T1 to the (5+K)-th transistor T5+K may include a P-type transistor and an N-type transistor. When a low level is applied to a gate electrode of a P-type transistor, the P-type transistor is turned on, and when a high level is applied to the gate electrode of the P-type transistor, the P-type transistor is turned off. Accordingly, a clock signal is a signal that periodically switches between two different levels, and the two levels are used for turning on a transistor and turn off the transistor respectively, so that a higher level of the two different levels is often referred to as a high level and a lower level of the two different levels is referred to as a low level.

In an exemplary embodiment, light emitting devices connected with adjacent pixel circuits located in a same row emit light of different colors, and light emitting devices connected with adjacent pixel circuits located in a same column emit light of a same color.

In an exemplary embodiment, time when K light emitting selection signal terminals receive effective level signals does not coincide. The time when the K light emitting selection signal terminals receive the effective level signals does not coincide, so that K light emitting devices connected with pixel circuits do not emit light at the same time, and a display effect of a display substrate may be ensured.

Figure 5:
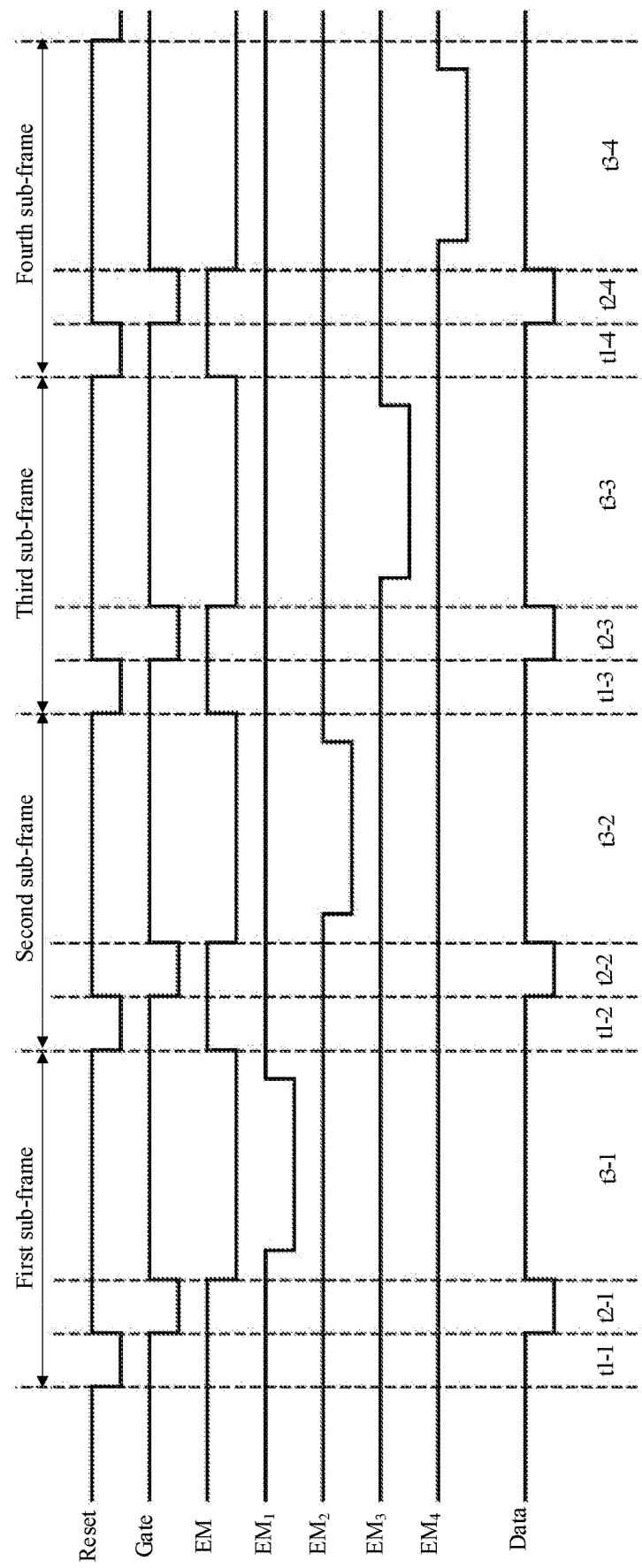
FIG. 5 is a working timing diagram of a pixel circuit.

Taking K=4 and nine transistors are all P-type transistors as an example, FIG. 5 is a working timing diagram of a pixel circuit. The pixel circuit according to the exemplary embodiment of the present disclosure is described below with reference to a working process of the pixel circuit illustrated in FIG. 4B. The pixel circuit in FIG. 4B includes nine transistors (a first transistor T1 to a ninth transistor T9), one capacitor C, and nine signal terminals (a data signal terminal Data, a scan signal terminal Gate, a reset signal terminal Reset, an initial signal terminal Vinit, a light emitting control terminal EM, a first power supply terminal VDD, a first light emitting selection signal terminal $EM_1$, a second light emitting selection signal terminal $EM_2$, a third light emitting selection signal terminal $EM_3$, and a fourth light emitting selection signal terminal $EM_4$). In one frame, a current control circuit in each pixel circuit is charged four times, corresponding to four sub-frames respectively, each sub-frame corresponds to a light emitting device, and the four light emitting devices are lit in sequence. A working process of each pixel circuit may include four sub-frames: a first sub-frame, a second sub-frame, a third sub-frame, and a fourth sub-frame in sequence.

The operation process of each pixel circuit in the first sub-frame may include following stages.

In a first stage t1_1, referred to as a reset stage, a signal of the reset signal terminal Reset is a low-level signal, and signals of the scan signal terminal Gate, the light emitting control terminal EM, the first light emitting selection signal terminal $EM_1$, the second light emitting selection signal terminal $EM_2$, the third light emitting selection signal terminal $EM_3$, and the fourth light emitting selection signal terminal $EM_4$ are all high-level signals. The signal of the reset signal terminal Reset is the low-level signal, the first transistor T1 is turned on, and a signal of the initial signal terminal Vinit is provided to a second node N2 to initialize the capacitor C and clear an original data voltage in the capacitor. The signals of the scan signal terminal Gate, the reset signal terminal Reset, the light emitting control terminal EM, the first light emitting selection signal terminal $EM_1$, the second light emitting selection signal terminal $EM_2$, the third light emitting selection signal terminal $EM_3$, and the fourth light emitting selection signal terminal $EM_4$ are all high-level signals, so that the second transistor T2, the fourth transistor T4, the fifth transistor T5, the sixth transistor T6, the seventh transistor T7, the eighth transistor T8, and the ninth transistor T9 are turned off, and the light emitting devices $EL_1$ to $EL_K$ do not emit light in this stage.

In a second stage t2_1, referred to as a data writing stage or a threshold compensation stage, a signal of the scan signal terminal Gate is a low-level signal, and signals of the reset signal terminal Reset, the light emitting control terminal EM, the first light emitting selection signal terminal $EM_1$, the second light emitting selection signal terminal $EM_2$, the third light emitting selection signal terminal $EM_3$, and the fourth light emitting selection signal terminal $EM_4$ are all high-level signals. The data signal terminal Data outputs a data voltage, and the data voltage of the data signal terminal Data is provided to a third node N3. In this stage, since a signal of the second node N2 is a low-level signal, the third transistor T3 is turned on. The signal of the scan signal terminal Gate is the low-level signal, so that the second transistor T2 and the fourth transistor T4 are turned on. The second transistor T2 and the fourth transistor T4 are turned on so that the data voltage output from the data signal terminal Data is provided to the second node N2 through the third node N3, the turned-on third transistor T3, a first node N1, and the turned-on second transistor T2. A difference between the data voltage output by the data signal terminal Data and a threshold voltage of the third transistor T3 is charged into the capacitor C. A voltage of the second node N2 is Vd−|Vth|, wherein Vd is the data voltage output by the data signal terminal Data, and Vth is the threshold voltage of the third transistor T3. The signals of the reset signal terminal Reset, the light emitting control terminal EM, the first light emitting selection signal terminal $EM_1$, the second light emitting selection signal terminal $EM_2$, the third light emitting selection signal terminal $EM_3$, and the fourth light emitting selection signal terminal $EM_4$ are all high-level signals, so that the first transistor T1, the fifth transistor T5, the sixth transistor T6, the seventh transistor T7, the eighth transistor T8, and the ninth transistor T9 are turned off, and the light emitting devices $EL_1$ to $EL_K$ do not emit light in this stage.

In a third stage t3_1, referred to as a light emitting stage, signals of the light emitting control terminal EM and the first light emitting selection signal terminal $EM_1$ are low-level signals, and signals of the scan signal terminal Gate, the reset signal terminal Reset, the second light emitting selection signal terminal $EM_2$, the third light emitting selection signal terminal $EM_3$, and the fourth light emitting selection signal terminal $EM_4$ are all high-level signals. The signals of the light emitting control terminal EM and the first light emitting selection signal terminal $EM_1$ are low-level signals, so that the fifth transistor T5 and the sixth transistor T6 are turned on, a power supply voltage output by the first power supply terminal VDD provides a drive voltage to a first electrode of the first light emitting device $EL_1$ through the turned-on fifth transistor T5, the third transistor T3, and the sixth transistor T6 to drive the first light emitting device $EL_1$ to emit light.

The operation process of each pixel circuit in the second sub-frame may include following stages.

In a first stage t1_2, referred to as a reset stage, a signal of the reset signal terminal Reset is a low-level signal, and signals of the scan signal terminal Gate, the light emitting control terminal EM, the first light emitting selection signal terminal $EM_1$, the second light emitting selection signal terminal $EM_2$, the third light emitting selection signal terminal $EM_3$, and the fourth light emitting selection signal terminal EM₄ are all high-level signals. The signal of the reset signal terminal Reset is the low-level signal, the first transistor T1 is turned on, and a signal of the initial signal terminal Vinit is provided to the second node N2 to initialize the capacitor C and clear an original data voltage in the capacitor. The signals of the scan signal terminal Gate, the reset signal terminal Reset, the light emitting control terminal EM, the first light emitting selection signal terminal EM₁, the second light emitting selection signal terminal EM₂, the third light emitting selection signal terminal EM₃, and the fourth light emitting selection signal terminal EM₄ are all high-level signals, so that the second transistor T2, the fourth transistor T4, the fifth transistor T5, the sixth transistor T6, the seventh transistor T7, the eighth transistor T8, and the ninth transistor T9 are turned off, and the light emitting devices EL₁ to EL_K do not emit light in this stage.

In a second stage t2_2, referred to as a data writing stage or a threshold compensation stage, a signal of the scan signal terminal Gate is a low-level signal, and signals of the reset signal terminal Reset, the light emitting control terminal EM, the first light emitting selection signal terminal EM₁, the second light emitting selection signal terminal EM₂, the third light emitting selection signal terminal EM₃, and the fourth light emitting selection signal terminal EM₄ are all high-level signals. The data signal terminal Data outputs a data voltage, and the data voltage of the data signal terminal Data is provided to the third node N3. In this stage, since a signal of the second node N2 is a low-level signal, the third transistor T3 is turned on. The signal of the scan signal terminal Gate is the low-level signal, and the second transistor T2 and the fourth transistor T4 are turned on. The second transistor T2 and the fourth transistor T4 are turned on so that the data voltage output from the data signal terminal Data is provided to the second node N2 through the third node N3, the turned-on third transistor T3, the first node N1, and the turned-on second transistor T2. A difference between the data voltage output by the data signal terminal Data and a threshold voltage of the third transistor T3 is charged into the capacitor C. A voltage of the second node N2 is Vd−|Vth|, wherein Vd is the data voltage output by the data signal terminal Data, and Vth is the threshold voltage of the third transistor T3. The signals of the reset signal terminal Reset, the light emitting control terminal EM, the first light emitting selection signal terminal EM₁, the second light emitting selection signal terminal EM₂, the third light emitting selection signal terminal EM₃, and the fourth light emitting selection signal terminal EM₄ are all high-level signals, so that the first transistor T1, the fifth transistor T5, the sixth transistor T6, the seventh transistor T7, the eighth transistor T8, and the ninth transistor T9 are turned off, and the light emitting devices EL₁ to EL_K do not emit light in this stage.

In a third stage t3_2, referred to as a light emitting stage, signals of the light emitting control terminal EM and the second light emitting selection signal terminal EM₂ are low-level signals, and signals of the scan signal terminal Gate, the reset signal terminal Reset, the first light emitting selection signal terminal EM₁, the third light emitting selection signal terminal EM₃, and the fourth light emitting selection signal terminal EM₄ are all high-level signals. The signals of the light emitting control terminal EM and the second light emitting selection signal terminal EM₂ are the low-level signals, so that the fifth transistor T5 and the seventh transistor T7 are turned on, a power supply voltage output from the first power supply terminal VDD provides a drive voltage to a first electrode of the second light emitting device EL₂ through the turned-on fifth transistor T5, the third transistor T3, and the seventh transistor T7 to drive the second light emitting device EL₂ to emit light.

The operation process of each pixel circuit in the third sub-frame may include following stages.

In a first stage t1_3, referred to as a reset stage, a signal of the reset signal terminal Reset is a low-level signal, and signals of the scan signal terminal Gate, the light emitting control terminal EM, the first light emitting selection signal terminal EM₁, the second light emitting selection signal terminal EM₂, the third light emitting selection signal terminal EM₃, and the fourth light emitting selection signal terminal EM₄ are all high-level signals. The signal of the reset signal terminal Reset is the low-level signal, the first transistor T1 is turned on, and a signal of the initial signal terminal Vinit is provided to the second node N2 to initialize the capacitor C and clear an original data voltage in the capacitor. The signals of the scan signal terminal Gate, the reset signal terminal Reset, the light emitting control terminal EM, the first light emitting selection signal terminal EM₁, the second light emitting selection signal terminal EM₂, the third light emitting selection signal terminal EM₃, and the fourth light emitting selection signal terminal EM₄ are all high-level signals, so that the second transistor T2, the fourth transistor T4, the fifth transistor T5, the sixth transistor T6, the seventh transistor T7, the eighth transistor T8, and the ninth transistor T9 are turned off, and the light emitting devices EL₁ to EL_K do not emit light in this stage.

In a second stage t2_3, referred to as a data writing stage or a threshold compensation stage, a signal of the scan signal terminal Gate is a low-level signal, and signals of the reset signal terminal Reset, the light emitting control terminal EM, the first light emitting selection signal terminal EM₁, the second light emitting selection signal terminal EM₂, the third light emitting selection signal terminal EM₃, and the fourth light emitting selection signal terminal EM₄ are all high-level signals. The data signal terminal Data outputs a data voltage, and the data voltage of the data signal terminal Data is provided to the third node N3. In this stage, since a signal of the second node N2 is a low-level signal, the third transistor T3 is turned on. The signal of the scan signal terminal Gate is the low-level signal, and the second transistor T2 and the fourth transistor T4 are turned on. The second transistor T2 and the fourth transistor T4 are turned on so that the data voltage output from the data signal terminal Data is provided to the second node N2 through the third node N3, the turned-on third transistor T3, the first node N1, and the turned-on second transistor T2. A difference between the data voltage output by the data signal terminal Data and a threshold voltage of the third transistor T3 is charged into the capacitor C. A voltage of the second node N2 is Vd−|Vth|, wherein Vd is the data voltage output by the data signal terminal Data, and Vth is the threshold voltage of the third transistor T3. The signals of the reset signal terminal Reset, the light emitting control terminal EM, the first light emitting selection signal terminal EM₁, the second light emitting selection signal terminal EM₂, the third light emitting selection signal terminal EM₃, and the fourth light emitting selection signal terminal EM₄ are all high-level signals, so that the first transistor T1, the fifth transistor T5, the sixth transistor T6, the seventh transistor T7, the eighth transistor T8, and the ninth transistor T9 are turned off, and the light emitting devices EL₁ to EL_K do not emit light in this stage.

In a third stage t3_3, referred to as a light emitting stage, signals of the light emitting control terminal EM and the third light emitting selection signal terminal EM₃ are low-level signals, and signals of the scan signal terminal Gate, the reset signal terminal Reset, the first light emitting selection signal terminal $EM_1$, the second light emitting selection signal terminal $EM_2$, and the fourth light emitting selection signal terminal $EM_4$ are all high-level signals. The signals of the light emitting control terminal EM and the third light emitting selection signal terminal $EM_3$ are the low-level signals, so that the fifth transistor T5 and the eighth transistor T8 are turned on, a power supply voltage output by the first power supply terminal VDD provides a drive voltage to a first electrode of the third light emitting device $EL_3$ through the turned-on fifth transistor T5, the third transistor T3, and the eighth transistor T8 to drive the third light emitting device $EL_3$ to emit light.

The operation process of each pixel circuit in the fourth sub-frame may include following stages.

In a first stage t1_4, referred to as a reset stage, a signal of the reset signal terminal Reset is a low-level signal, and signals of the scan signal terminal Gate, the light emitting control terminal EM, the first light emitting selection signal terminal $EM_1$, the second light emitting selection signal terminal $EM_2$, the third light emitting selection signal terminal $EM_3$, and the fourth light emitting selection signal terminal $EM_4$ are all high-level signals. The signal of the reset signal terminal Reset is the low-level signal, the first transistor T1 is turned on, and a signal of the initial signal terminal Vinit is provided to the second node N2 to initialize the capacitor C and clear an original data voltage in the capacitor. The signals of the scan signal terminal Gate, the reset signal terminal Reset, the light emitting control terminal EM, the first light emitting selection signal terminal $EM_1$, the second light emitting selection signal terminal $EM_2$, the third light emitting selection signal terminal $EM_3$, and the fourth light emitting selection signal terminal $EM_4$ are all high-level signals, so that the second transistor T2, the fourth transistor T4, the fifth transistor T5, the sixth transistor T6, the seventh transistor T7, the eighth transistor T8, and the ninth transistor T9 are turned off, and the light emitting devices $EL_1$ to $EL_K$ do not emit light in this stage.

In a second stage t2_4, referred to as a data writing stage or a threshold compensation stage, a signal of the scan signal terminal Gate is a low-level signal, and signals of the reset signal terminal Reset, the light emitting control terminal EM, the first light emitting selection signal terminal $EM_1$, the second light emitting selection signal terminal $EM_2$, the third light emitting selection signal terminal $EM_3$, and the fourth light emitting selection signal terminal $EM_4$ are all high-level signals. The data signal terminal Data outputs a data voltage, and the data voltage of the data signal terminal Data is provided to the third node N3. In this stage, since a signal of the second node N2 is a low-level signal, the third transistor T3 is turned on. The signal of the scan signal terminal Gate is the low-level signal, and the second transistor T2 and the fourth transistor T4 are turned on. The second transistor T2 and the fourth transistor T4 are turned on so that the data voltage output from the data signal terminal Data is provided to the second node N2 through the third node N3, the turned-on third transistor T3, the first node N1, and the turned-on second transistor T2. A difference between the data voltage output by the data signal terminal Data and a threshold voltage of the third transistor T3 is charged into the capacitor C. A voltage of the second node N2 is Vd−|Vth|, wherein Vd is the data voltage output by the data signal terminal Data, and Vth is the threshold voltage of the third transistor T3. The signals of the reset signal terminal Reset, the light emitting control terminal EM, the first light emitting selection signal terminal $EM_1$, the second light emitting selection signal terminal $EM_2$, the third light emitting selection signal terminal $EM_3$, and the fourth light emitting selection signal terminal $EM_4$ are all high-level signals, so that the first transistor T1, the fifth transistor T5, the sixth transistor T6, the seventh transistor T7, the eighth transistor T8, and the ninth transistor T9 are turned off, and the light emitting devices $EL_1$ to $EL_K$ do not emit light in this stage.

In a third stage t3_4, referred to as a light emitting stage, signals of the light emitting control terminal EM and the fourth light emitting selection signal terminal $EM_4$ are low-level signals, and signals of the scan signal terminal Gate, the reset signal terminal Reset, the first light emitting selection signal terminal $EM_1$, the second light emitting selection signal terminal $EM_2$, and the third light emitting selection signal terminal $EM_3$ are all high-level signals. The signals of the light emitting control terminal EM and the fourth light emitting selection signal terminal $EM_4$ are the low-level signals, so that the fifth transistor T5 and the ninth transistor T9 are turned on, a power supply voltage output by the first power supply terminal VDD provides a drive voltage to a first electrode of the fourth light emitting device $EL_4$ through the turned-on fifth transistor T5, the third transistor T3, and the ninth transistor T9 to drive the fourth light emitting device $EL_4$ to emit light.

In the present disclosure, the first transistor T1 to the fifth transistor T5 are respectively turned on four times in one frame time, and the data signal terminal Data provides a data signal four times to sequentially drive four light emitting devices to emit light, so that normal display of the display substrate may be achieved by using human vision persistence.

In a drive process of the pixel circuit, a drive current flowing through the third transistor T3 (a drive transistor) is determined by a voltage difference between a control electrode and a first electrode of the third transistor T3. The voltage of the second node N2 is Vd−|Vth|, so that the drive current of the third transistor T3 is as follows.

$$I=K^*(Vgs-Vth)^2=K^*[(Vdd-Vd+|Vth|)-Vth]^2=K^*[(Vdd-Vd)]^2$$

I is the drive current flowing through the third transistor T3, i.e., a drive current for driving an OLED, K is a constant, Vgs is a voltage difference between a gate electrode and the first electrode of the third transistor T3, Vth is the threshold voltage of the third transistor T3, Vd is the data voltage output by the data signal terminal Data, and Vdd is the power voltage output by the first power supply line VDD.

Figure 6A:
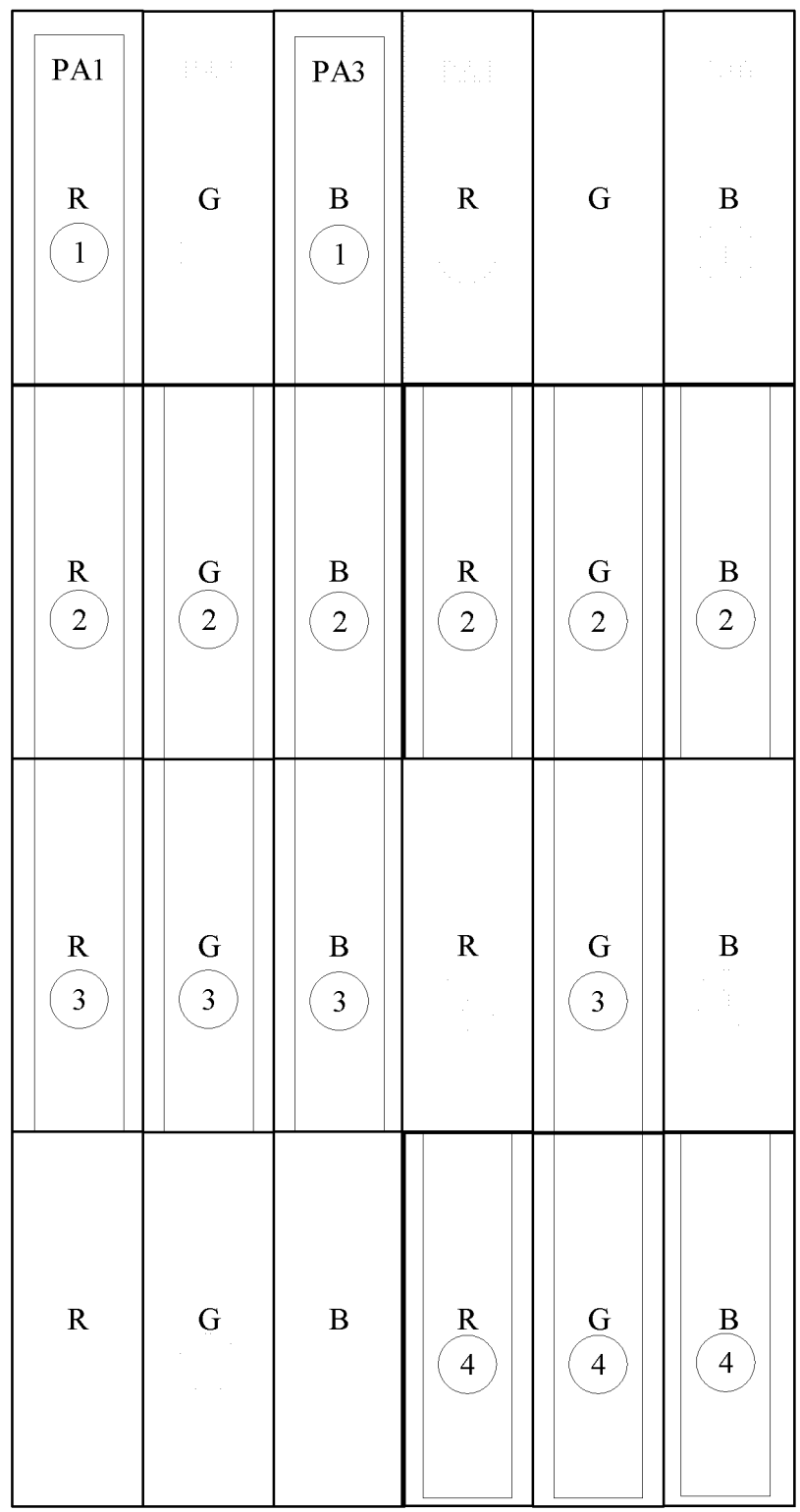
FIG. 6A is a first schematic diagram of a connection between a pixel circuit and a light emitting device.

In an exemplary embodiment, when M2=K×M1 and N1=3×N2, light emitting devices connected with each pixel circuit are located in a same column. A pixel circuit of row m and column 3n−2 is respectively connected with a first light emitting device in a light emitting unit of row K×m−K+1 and column n, and a first light emitting device in a light emitting unit of row Km−K+2 and column n, until a first light emitting device in a light emitting unit of row K×m and column n, wherein 1≤m≤M1, 1≤n≤N2. A pixel circuit of row m and column 3n−1 is respectively connected with a second light emitting device in a light emitting unit of row K×m−K+1 and column n, and a second light emitting device in a light emitting unit of row Km−K+2 and column n, until a second light emitting device in a light emitting unit of row K×m and column n. A pixel circuit of row m and column 3n is respectively connected with a third light emitting device in a light emitting unit of row K×m−K+1 and column n, and a third light emitting device in a light emitting unit of row Km−K+2 and column n, until a third light emitting device in a light emitting unit of row K×m and column n. FIG. 6A is a first schematic diagram of a connection between a pixel circuit and a light emitting device. FIG. 6A is described by taking K=4 as an example. As shown in FIG. 6A, R denotes a first light emitting device that emits red light, G denotes a second light emitting device that emits green light, B denotes a third light emitting device that emits blue light, PA1 denotes a pixel circuit of an i-th column, 1 in PA1 denotes a second electrode of a sixth transistor in a pixel circuit, 2 denotes a second electrode of a seventh transistor in the pixel circuit, 3 denotes a second electrode of an eighth transistor in the pixel circuit, and 4 denotes a second electrode of a ninth transistor in the pixel circuit. Taking K=4 as an example, a second electrode of a sixth transistor, a second electrode of a seventh transistor, a second electrode of an eighth transistor, and a second electrode of a ninth transistor of a pixel circuit of a first row and a first column respectively emit light with a first light emitting device in a light emitting unit of a first row and a first column, a first light emitting device in a light emitting unit of a second row and the first column, a first light emitting device in a light emitting unit of a third row and the first column, and a first light emitting device in a light emitting unit of a fourth row and the first column. A second electrode of a sixth transistor, a second electrode of a seventh transistor, a second electrode of an eighth transistor, and a second electrode of a ninth transistor of a pixel circuit of the first row and a second column respectively emit light with a second light emitting device in the light emitting unit of the first row and the first column, a second light emitting device in the light emitting unit of the second row and the first column, a second light emitting device in the light emitting unit of the third row and the first column, and a second light emitting device in the light emitting unit of the fourth row and the first column. A second electrode of a sixth transistor, a second electrode of a seventh transistor, a second electrode of an eighth transistor, and a second electrode of a ninth transistor of a pixel circuit of the first row and a third column respectively emit light with a third light emitting device in the light emitting unit of the first row and the first column, a third light emitting device in the light emitting unit of the second row and the first column, a third light emitting device in the light emitting unit of the third row and the first column, and a third light emitting device in the light emitting unit of the fourth row and the first column, and so on.

When light emitting devices connected with each pixel circuit are located in a same column, pixel circuits located in a same row sequentially light up all light emitting devices of rows where connected K light emitting devices are located. For example, taking K=4 as an example, pixel circuits of a first row light up light emitting devices of a first row, light emitting devices of a second row, light emitting devices of a third row, and light emitting devices of a fourth row in sequence.

Figure 6B:
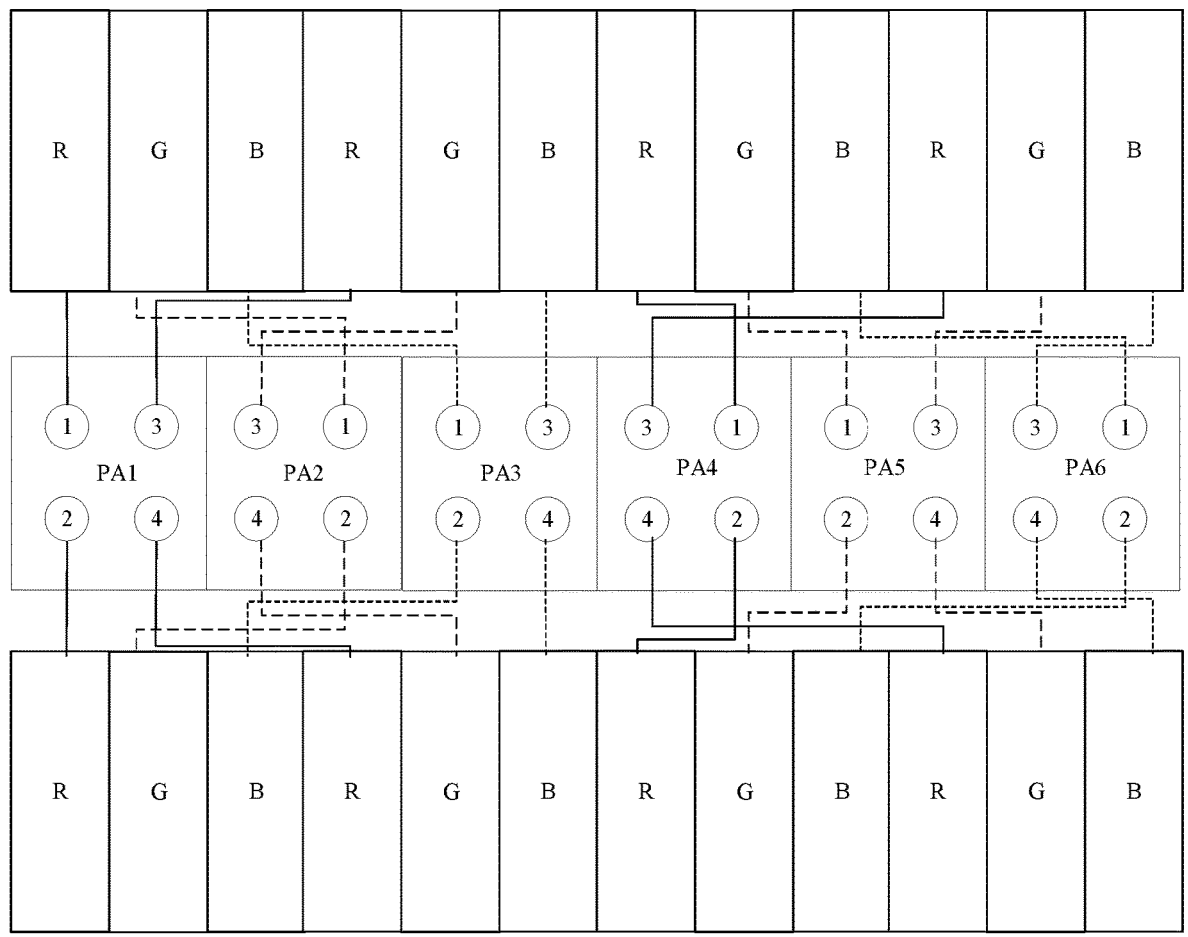
FIG. 6B is a second schematic diagram of a connection between a pixel circuit and a light emitting device.

In an exemplary embodiment, when M2=4×M1 and N1=3×N2, light emitting devices connected with pixel circuits are arranged along a first direction and a second direction, wherein the first direction intersects with the second direction. A pixel circuit of row m and column 3n−2 is connected with a first light emitting device in a light emitting unit of row 2m−1 and column 2n−1, a first light emitting device in a light emitting unit of row 2m−1 and column 2n, a first light emitting device in a light emitting unit of row 2m and column 2n−1, and a first light emitting device in a light emitting unit of row 2m and column 2n, wherein 1≤m≤M1 and 1≤n≤N2. A pixel circuit of row m and column 3n−1 is connected with a second light emitting device in a light emitting unit of row 2m−1 and column 2n−1, a second light emitting device in a light emitting unit of row 2m−1 and column 2n, a second light emitting device in a light emitting unit of row 2m and column 2n−1, and a second light emitting device in a light emitting unit of row 2m and column 2n. A pixel circuit of row m and column 3n is connected with a third light emitting device in a light emitting unit of row 2m−1 and column 2n−1, a third light emitting device in a light emitting unit of row 2m−1 and column 2n, a third light emitting device in a light emitting unit of row 2m and column 2n−1, and a third light emitting device in a light emitting unit of row 2m and column 2n. FIG. 6B is a second schematic diagram of a connection between a pixel circuit and a light emitting device. As shown in FIG. 6B, R denotes a first light emitting device that emits red light, G denotes a second light emitting device that emits green light, B denotes a third light emitting device that emits blue light, PAi denotes a pixel circuit of an i-th column, 1 in PA1 denotes a second electrode of a sixth transistor in a pixel circuit, 2 denotes a second electrode of a seventh transistor in the pixel circuit, 3 denotes a second electrode of an eighth transistor in the pixel circuit, and 4 denotes a second electrode of a ninth transistor in the pixel circuit.

In an exemplary embodiment, as shown in FIG. 6B, an arrangement of second electrodes of sixth transistors to second electrodes of ninth transistors in adjacent pixel circuits is symmetrically along a midline of the adjacent pixel circuits.

In an exemplary embodiment, as shown in FIG. 6B, a second electrode of a sixth transistor of a pixel circuit of a first row and a first column is connected with a first light emitting device in a pixel unit of a first row and a first column, a second electrode of a seventh transistor of the pixel circuit of the first row and the first column is connected with a first light emitting device in a pixel circuit of a second row and the first column, a second electrode of an eighth transistor of the pixel circuit of the first row and the first column is connected with a first light emitting device in a pixel circuit of the first row and the second column, and a second electrode of a ninth transistor of the pixel circuit of the first row and the first column is connected with the first light emitting device in the pixel circuit of the second row and the first column. A second electrode of a sixth transistor of a pixel circuit of the first row and a second column is connected with a second light emitting device in the pixel circuit of the first row and the first column, a second electrode of a seventh transistor of the pixel circuit of the first row and the second column is connected with a second light emitting device in the pixel circuit of the second row and the first column, a second electrode of an eighth transistor of the pixel circuit of the first row and the second column is connected with a second light emitting device in the pixel circuit of the first row and the second column, and a second electrode of a ninth transistor of the pixel circuit of the first row and the second column is connected with a second light emitting device in the pixel circuit of the second row and the first column. A second electrode of a sixth transistor of a pixel circuit of the first row and a third column is connected with a third light emitting device in the pixel circuit of the first row and the first column, a second electrode of a seventh transistor of the pixel circuit of the first row and the third column is connected with a third light emitting device in the pixel circuit of the second row and the first column, a second electrode of an eighth transistor of the pixel circuit of the first row and the third column is connected with a third light emitting device in the pixel circuit of the first row and the second column, and a second electrode of a ninth transistor of the pixel circuit of the first row and the third column is connected with a third light emitting device in the pixel circuit of the second row and the first column. A second electrode of a sixth transistor of a pixel circuit of the first row and a fourth column is connected with a first light emitting device in a pixel circuit of the first row and a third column, a second electrode of a seventh transistor of the pixel circuit of the first row and the fourth column is connected with a first light emitting device in a pixel circuit of the second row and the third column, a second electrode of an eighth transistor of the pixel circuit of the first row and the fourth column is connected with a first light emitting device in a pixel circuit of the first row and a fourth column, and a second electrode of a ninth transistor of the pixel circuit of the first row and the fourth column is connected with a first light emitting device in the pixel circuit of the second row and the first column. A second electrode of a sixth transistor of a pixel circuit of the first row and a fifth column is connected with a second light emitting device in the pixel circuit of the first row and the third column, the second electrode of the seventh transistor of the pixel circuit of the first row and the fourth column is connected with a second light emitting device in the pixel circuit of the second row and the third column, the second electrode of the eighth transistor of the pixel circuit of the first row and the fourth column is connected with a second light emitting device in the pixel circuit of the first row and the fourth column, and the second electrode of the ninth transistor of the pixel circuit of the first row and the fourth column is connected with a second light emitting device in the pixel circuit of the second row and the first column. A second electrode of a sixth transistor of a pixel circuit of the first row and a sixth column is connected with a third light emitting device in the pixel circuit of the first row and the third column, the second electrode of the seventh transistor of the pixel circuit of the first row and the fourth column is connected with a third light emitting device in the pixel circuit of the second row and the third column, the second electrode of the eighth transistor of the pixel circuit of the first row and the fourth column is connected with a third light emitting device in the pixel circuit of the first row and the fourth column, and the second electrode of the ninth transistor of the pixel circuit of the first row and the fourth column is connected with a third light emitting device in the pixel circuit of the second row and the first column, and so on.

When light emitting devices connected with each pixel circuit are arranged along the first direction and the second direction, pixel circuits located in a same row simultaneously light up part of light emitting devices of a row where each light emitting device is located, and after four subframes, all light emitting devices in two rows of light emitting devices have all finished emitting light.

Figure 7A:
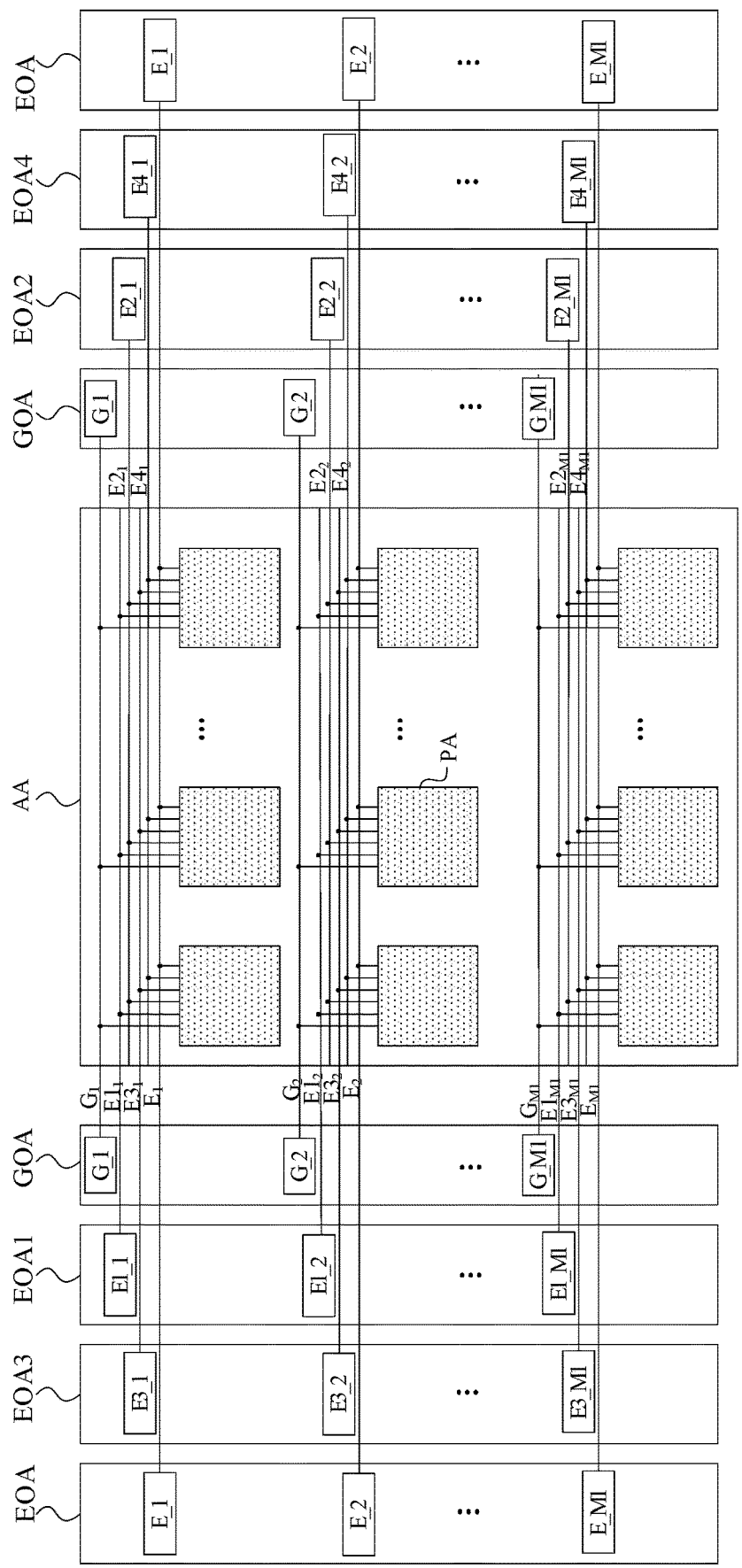
FIG. 7A is a first schematic diagram of a structure of a display substrate.
Figure 7B:
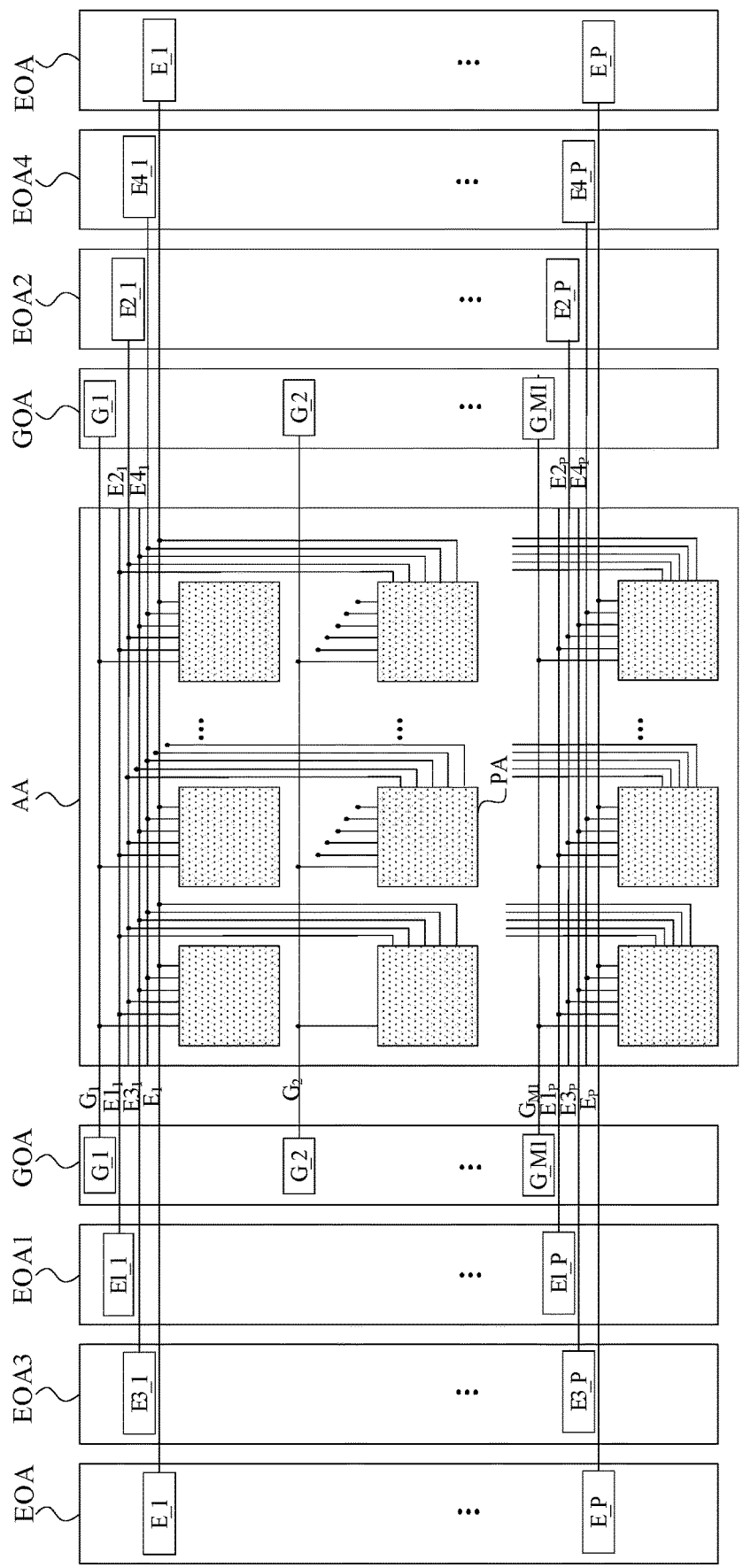
FIG. 7B is a second schematic diagram of a structure of a display substrate.

FIG. 7A is a first schematic diagram of a structure of a display substrate. FIG. 7B is a second schematic diagram of a structure of a display substrate. As shown in FIGS. 1, 7A, and 7B, the display substrate may further include: N1 columns of data signal lines D, M1 rows of scan signal lines $G_1$ to $G_{M1}$, M1 rows of first power supply lines, M1 rows of reset signal lines, M1 rows of initial signal lines, P rows of first light emitting selection signal lines $E1_1$ to $E1_P$, P rows of second light emitting selection signal lines $E2_1$ to $E2_P$, P rows of third light emitting selection signal lines $E3_1$ to $E3_P$, P rows of fourth light emitting selection signal lines $E4_1$ to $E4_{M1}$, and P rows of light emitting control lines $E_1$ to $E_{M1}$, P=M1 or M1/2; FIG. 7A is illustrated by taking P=M1 as an example, and FIG. 7B is illustrated by taking P=M1/2 as an example.

In an exemplary embodiment, a data signal line extends along a first direction, and a scan signal line, a first power supply line, a reset signal line, an initial signal line, a first light emitting selection signal line, a second light emitting selection signal line, a third light emitting selection signal line, a fourth light emitting selection signal line, and a light emitting control line extend along a second direction.

In an exemplary embodiment, as shown in FIGS. 7A to 7B, a scan signal line of row s is connected with a scan signal terminal of a pixel circuit of row s, a first power supply line of row s is connected with a first power supply terminal of the pixel circuit of row s, a reset signal line of row s is connected with a reset signal terminal of the pixel circuit of row s, an initial signal line of row s is connected with an initial signal terminal of the pixel circuit of row s, a data signal line of column t is connected with a data signal terminal of a pixel circuit of column t, $1 \le s \le M1$, $1 \le t \le N1$.

In an exemplary embodiment, when P=M1, a first light emitting selection signal line of row s is connected with a first light emitting selection signal terminal of a pixel circuit of row s, a second light emitting selection signal line of row s is connected with a second light emitting selection signal terminal of the pixel circuit of row s, a third light emitting selection signal line of row s is connected with a third light emitting selection signal terminal of the pixel circuit of row s, and a fourth light emitting selection signal line of row s is connected with a fourth light emitting selection signal terminal of the pixel circuit of row s.

In an exemplary embodiment, when P=M1/2, a first light emitting selection signal line of row v is respectively connected with first light emitting selection signal terminals of a pixel circuit of row 2v−1 and a pixel circuit of row 2v, a second light emitting selection signal line of row v is respectively connected with second light emitting selection signal terminals of the pixel circuit of row 2v−1 and the pixel circuit of row 2v, a third light emitting selection signal line of row v is respectively connected with third light emitting selection signal terminals of the pixel circuit of row 2v−1 and the pixel circuit of row 2v, a fourth light emitting selection signal line of row v is respectively connected with fourth light emitting selection signal terminals of the pixel circuit of row 2v−1 and the pixel circuit of row 2v, and a light emitting control line of row v is respectively connected with light emitting control terminals of the pixel circuit of row 2v−1 and the pixel circuit of row 2v, wherein $1 \le v \le P$.

In an exemplary embodiment, a first light emitting selection signal line and a second light emitting selection signal line are disposed in a same layer, a third light emitting selection signal line and a fourth light emitting selection signal line are disposed in a same layer, and the first light emitting selection signal line and the third light emitting selection signal line are disposed in different layers. The first light emitting selection signal line and the third light emitting selection signal line are disposed in different layers, so that occupation of a pixel circuit in a first direction may be reduced, an area occupied by the pixel circuit may be reduced, and a resolution of the display substrate may be improved.

In an exemplary embodiment, as shown in FIGS. 1, 7A, and 7B, the non-display region may be provided with a scan drive circuit GOA, a light emitting drive circuit EOA, a first light emitting selection drive circuit EOA1, a second light emitting selection drive circuit EOA2, a third light emitting selection drive circuit EOA3, and a fourth light emitting selection drive circuit EOA4, and the display region AA includes a first side and a second side which are oppositely disposed.

In an exemplary embodiment, scan drive circuits are located on the first side and the second side of the display region. FIG. 1, FIG. 7A, and FIG. 7B are described by taking an example that the scan drive circuits are located on the first side and the second side of the display region. The light emitting drive circuit EOA is located on a side of a scan drive circuit GOA away from the display region. The first light emitting selection drive circuit EOA1 is located on the first side of the display region, and between the scan drive circuit GOA and the light emitting drive circuit EOA. The second light emitting selection drive circuit EOA2 is located on the second side of the display region, and between the scan drive circuit GOA and the light emitting drive circuit EOA. The third light emitting selection drive circuit EOA3 is located on the first side of the display region, and between the first light emitting selection drive circuit EOA1 and the light emitting drive circuit EOA. The fourth light emitting selection drive circuit EOA4 is located on the second side of the display region, and between the second light emitting selection drive circuit EOA2 and the light emitting drive circuit EOA.

In an exemplary embodiment, shown in FIGS. 7A and 7B, the scan drive circuit GOA may include M1 cascaded scan shift registers G_1 to G_M1, a scan shift register of an s-th stage is connected with a scan signal line of an s-th row. The light emitting drive circuit EOA may include P cascaded light emitting shift registers E_1 to E_P, wherein a light emitting shift register of a v-th stage is connected with a light emitting control line of a v-th row. The first light emitting selection drive circuit EOA1 includes P cascaded first light emitting selection shift registers E1_1 to E1_P, a first light emitting selection shift register of a v-th stage is connected with a first light emitting selection signal line of a v-th row. The second light emitting selection drive circuit EOA2 includes P cascaded second light emitting selection shift registers E2_1 to E2_P, a second light emitting selection shift register of a v-th stage is connected with a second light emitting selection signal line of a v-th row. The third light emitting selection drive circuit EOA3 includes P cascaded third light emitting selection shift registers E3_1 to E3_P, a third light emitting selection shift register of a v-th stage is connected with a third light emitting selection signal line of a v-th row. The fourth light emitting selection drive circuit EOA4 includes P cascaded fourth light emitting selection shift registers E4_1 to E4_P, a fourth light emitting selection shift register of a v-th stage is connected with a fourth light emitting selection signal line of a v-th row.

Figure 8:
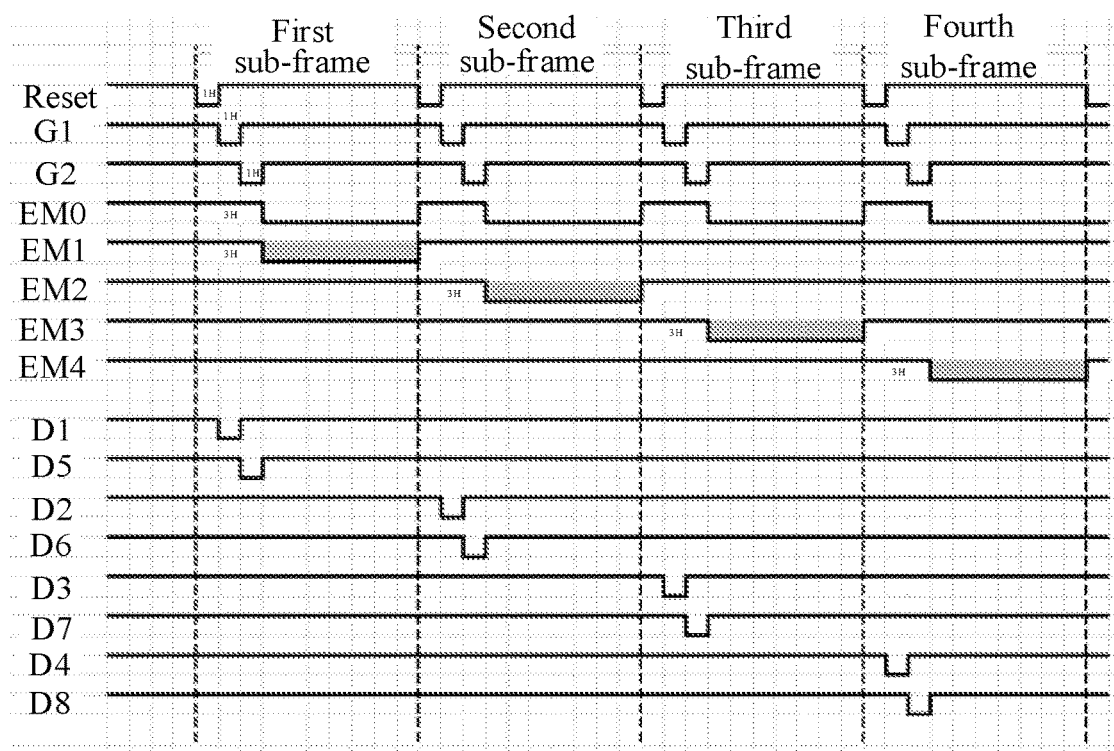
FIG. 8 is a timing chart of pixel circuits located in row i and row i+1 of a same column.

FIG. 8 is a timing chart of pixel circuits located in row i and row i+1 of a same column. FIG. 8 is illustrated by taking P=M1/2 and K=4 as an example. As shown in FIG. 8, D1 refers to a data signal supplied to a data signal terminal of a pixel circuit of an i-th row through a first sub-frame, D2 refers to a data signal supplied to the data signal terminal of the pixel circuit of the i-th row through a second sub-frame, D3 refers to a data signal supplied to the data signal terminal of the pixel circuit of the i-th row through a third sub-frame, D4 refers to a data signal supplied to the data signal terminal of the pixel circuit of the i-th row through a fourth sub-frame, D5 refers to a data signal supplied to a data signal terminal of a pixel circuit of an (i+1)-th row through the first sub-frame, D6 refers to a data signal supplied to the data signal terminal of the pixel circuit of the (i+1)-th row through the second sub-frame, D7 refers to a data signal supplied to the data signal terminal of the pixel circuit of the (i+1)-th row through the third sub-frame, and D8 refers to a data signal supplied to the data signal terminal of the pixel circuit of the (i+1)-th row through the fourth sub-frame. $EM_1$ is a signal supplied to first signal selection signal terminals of the pixel circuit of the i-th row and the pixel circuit of the (i+1)-th row, $EM_2$ is a signal supplied to second signal selection signal terminals of the pixel circuit of the i-th row and the pixel circuit of the (i+1)-th row, $EM_3$ is a signal supplied to third signal selection signal terminals of the pixel circuit of the i-th row and the pixel circuit of the (i+1)-th row, $EM_4$ is a signal supplied to fourth signal selection signal terminals of the pixel circuit of the i-th row and the pixel circuit of the (i+1)-th row, G1 is a scan signal supplied to a scan signal terminal of the pixel circuit of the i-th row, G2 is a scan signal supplied to a scan signal terminal of the pixel circuit of the (i+1)-th row, and Reset is a signal supplied to reset signal terminals of the pixel circuit of the i-th row and the pixel circuit of the (i+1)-th row. The pixel circuits of the i-th row and the (i+1)-th row of the same column share a same light emitting control line, a same first light emitting selection signal line, a same second light emitting selection signal line, a same third light emitting signal line, and a same fourth light emitting signal line. As may be seen from FIG. 8, that is, when charging time of one row is correspondingly reduced from light emitting time, that is, when two rows of current control circuits are charging, signals of light emitting control lines are all in a turned-off state, and in a same sub-frame, one light emitting device in two rows of pixel circuits emits light at the same time.

Figure 9:
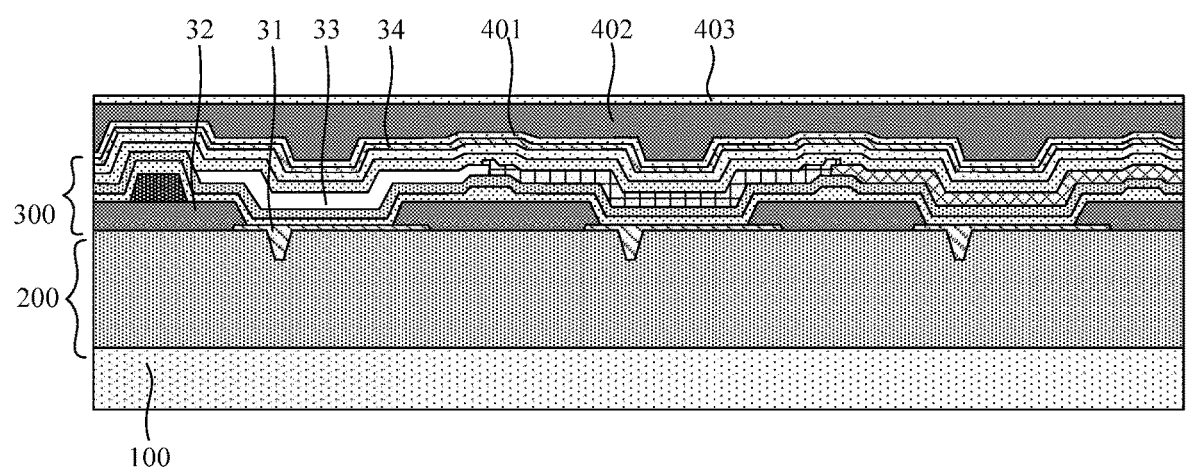
FIG. 9 is a schematic diagram of a structure of a display substrate according to an exemplary embodiment.
Figure 10A:
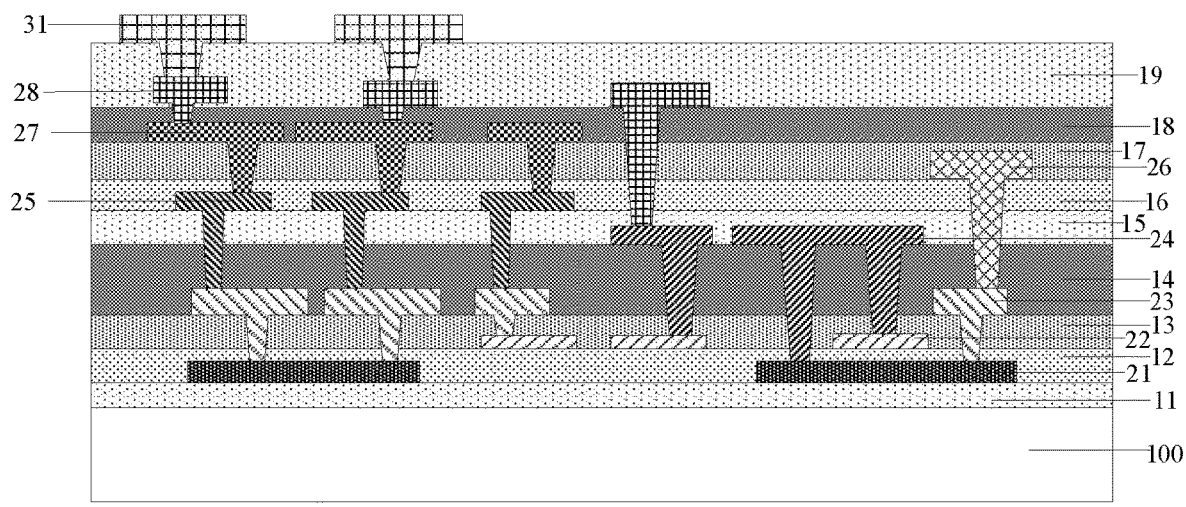
FIG. 10A is a first schematic diagram of a structure of a drive circuit layer according to an exemplary embodiment.

FIG. 9 is a schematic diagram of a structure of a display substrate according to an exemplary embodiment, and FIG. 10A is a first schematic diagram of a structure of a drive circuit layer according to an exemplary embodiment. As shown in FIGS. 9 and 10A, the display substrate according to the exemplary embodiment may include a base substrate 100, and a drive circuit layer 200 and a light emitting structure layer 300 arranged on the base substrate 100 in sequence; the drive circuit layer includes a pixel circuit, and the light emitting structure layer includes a light emitting unit. The drive circuit layer includes: a first insulation layer 11, a semiconductor layer 21, a second insulation layer 12, a first metal layer 22, a third insulation layer 13, a second metal layer 23, a fourth insulation layer 14, a third metal layer 24, a fifth insulation layer 15, a fourth metal layer 25, a sixth insulation layer 16, a fifth metal layer 26, a seventh insulation layer 17, a sixth metal layer 27, an eighth insulation layer 18, a seventh metal layer 28, and a planarization layer 19 which are stacked on the base substrate in sequence.

In an exemplary embodiment, as shown in FIG. 9, the display substrate may further include an encapsulation layer. The encapsulation layer may include a first encapsulation layer 401, a second encapsulation layer 402, and a third encapsulation layer 403 which are stacked, wherein the first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403, thus ensuring that external water vapor cannot enter the light emitting structure layer.

In an exemplary embodiment, when the drive circuit layer includes seven metal layers, and K=4, and when light emitting devices connected with pixel circuits are arranged along a first direction and a second direction, the semiconductor layer includes active layers of multiple pixel circuits, active layers of each pixel circuit includes active layers of multiple transistors; the first metal layer includes a light emitting control line, a scan signal line, a reset signal line, and first conductive layers of multiple pixel circuits, wherein a first conductive layer of each pixel circuit includes gate electrodes of multiple transistors and a first electrode plate; the second metal layer includes a first power supply line, an initial signal line, and second conductive layers of multiple pixel circuits, a second conductive layer of each pixel circuit includes first electrodes and second electrodes of multiple transistors, a first connection part, and a second connection part; the third metal layer includes a data signal line and third conductive layers of multiple pixel circuits, a third conductive layer of each pixel circuit includes a first electrode of a second transistor, a third connection part, a fourth connection part, and a fifth connection part; the fourth metal layer includes fourth conductive layers of multiple pixel circuits, and a fourth conductive layer of each pixel circuit includes a sixth connection part, a seventh connection part, an eighth connection part, a ninth connection part, a tenth connection part, and an eleventh connection part; the fifth metal layer includes fifth conductive layers of multiple pixel circuits, and a conductive layer of each pixel circuit includes a twelfth connection part; the sixth metal layer includes a third light emitting selection signal line, a fourth light emitting selection signal line, and a sixth conductive layer of another pixel circuit except pixel circuits of a first column, wherein the sixth conductive layer of the another pixel circuit except the pixel circuits of the first column includes a thirteenth connection part and a fourteenth connection part; and the seventh metal layer includes a first light emitting selection signal line, a second light emitting selection signal line, and seventh conductive layers of multiple pixel circuits, and a seventh conductive layer of each pixel circuit includes a fifteenth connection part, a sixteenth connection part, a seventeenth connection part, and an eighteenth connection part.

Figure 10B:
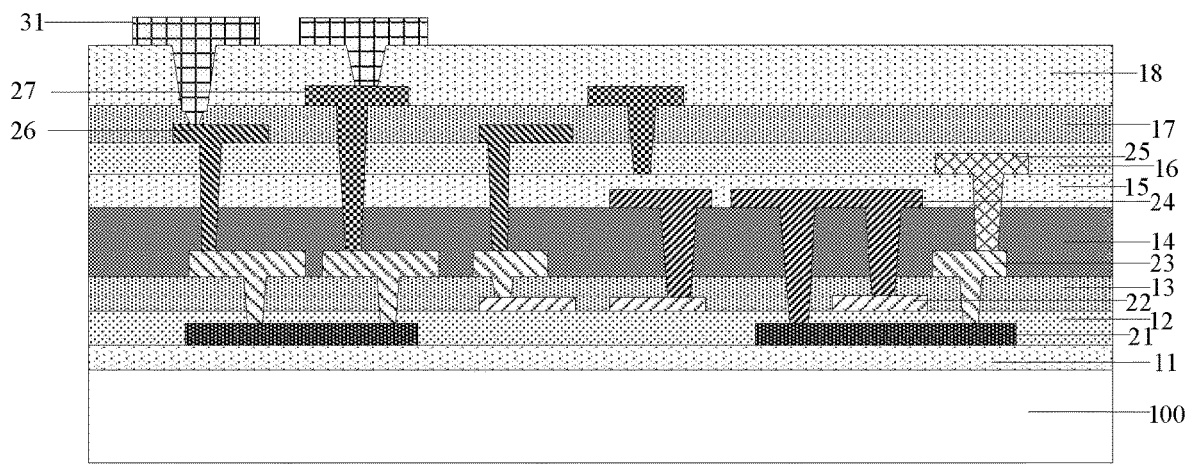
FIG. 10B is a second schematic diagram of a structure of a drive circuit layer according to an exemplary embodiment.

FIG. 10B is a second schematic diagram of a structure of a drive circuit layer according to an exemplary embodiment. As shown in FIG. 10B, a drive circuit layer in a display substrate according to an exemplary embodiment includes: a first insulation layer 11, a semiconductor layer 21, a second insulation layer 12, a first metal layer 22, a third insulation layer 13, a second metal layer 23, a fourth insulation layer 14, a third metal layer 24, a fifth insulation layer 15, a fourth metal layer 25, a sixth insulation layer 16, a fifth metal layer 26, a seventh insulation layer 17, a sixth metal layer 27, and a planarization layer 18 which are stacked on the base substrate 100 in sequence.

Figure 10C:
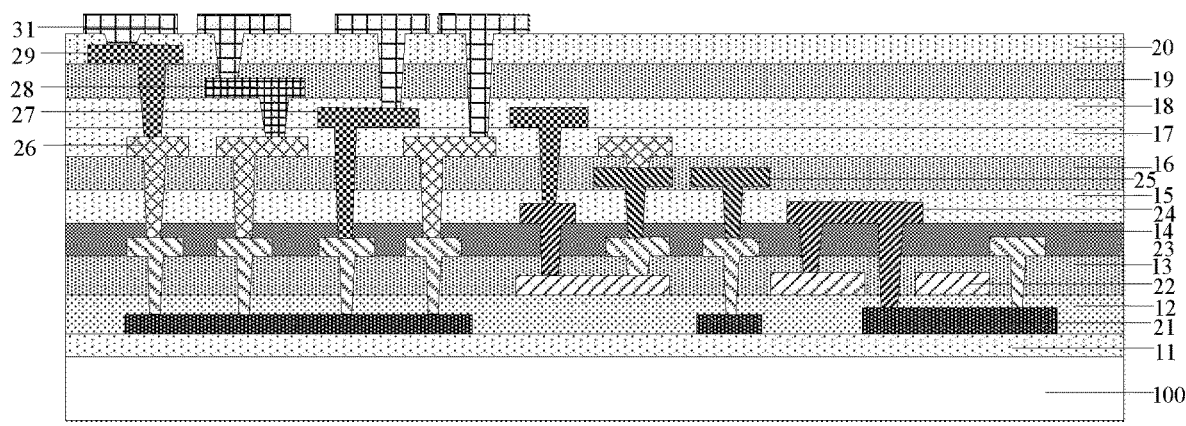
FIG. 10C is a third schematic diagram of a structure of a drive circuit layer according to an exemplary embodiment.

FIG. 10C is a third schematic diagram of a structure of a drive circuit layer according to an exemplary embodiment. As shown in FIG. 10C, a drive circuit layer in a display substrate according to an exemplary embodiment includes: a first insulation layer 11, a semiconductor layer 21, a second insulation layer 12, a first metal layer 22, a third insulation layer 13, a second metal layer 23, a fourth insulation layer 14, a third metal layer 24, a fifth insulation layer 15, a fourth metal layer 25, a sixth insulation layer 16, a fifth metal layer 26, a seventh insulation layer 17, a sixth metal layer 27, an eighth insulation layer 18, a seventh metal layer 28, a ninth insulation layer 19, an eighth metal layer 29, and a planarization layer 20 which are stacked on the base substrate 100 in sequence.

Compared with FIG. 10A, FIG. 10B, and FIG. 10C, a quantity of film layers of insulation layers and a quantity of film layers of metal layers in the drive circuit layer are different, and the present disclosure is not limited thereto.

In an exemplary embodiment, when the drive circuit layer includes seven metal layers, and K=4, and when light emitting devices connected with pixel circuits are arranged along a first direction and a second direction, an orthographic projection of an initial signal line of an s-th row on the base substrate is at least partially overlapped with an orthographic projection of a reset signal line of an s-th on the base substrate. An orthographic projection of a first light emitting selection signal line on the base substrate is located between an orthographic projection of a third light emitting selection signal line on the base substrate and an orthographic projection of a fourth light emitting selection signal line on the base substrate; and an orthographic projection of a second light emitting selection signal line on the base substrate is located on a side of the orthographic projection of the fourth light emitting selection signal line on the base substrate away from the orthographic projection of the third light emitting selection signal line on the base substrate.

In an exemplary embodiment, when the drive circuit layer includes seven metal layers, and K=4, and when light emitting devices connected with pixel circuits are arranged along a first direction and a second direction, active layers of adjacent pixel circuits located in a same row are arranged symmetrically along a midline of the adjacent pixel circuits, and an active layer of a pixel circuit of row i and column j is connected with an active layer of a pixel circuit of row i and column j+1, wherein 1≤i≤M1, 1≤j<N1, and are odd numbers; first conductive layers of adjacent pixel circuits located in a same row are symmetrically arranged along a midline between the adjacent pixel circuits; second conductive layers of adjacent pixel circuits located in a same row are symmetrically arranged along a midline between the adjacent pixel circuits; third conductive layers of adjacent pixel circuits located in a same row are symmetrically arranged along a midline between the adjacent pixel circuits; fourth conductive layers of adjacent pixel circuits located in a same row are symmetrically arranged along a midline between the adjacent pixel circuits; and fifth conductive layers of adjacent pixel circuits located in a same row are symmetrically arranged along a midline between the adjacent pixel circuits.

Figure 11:
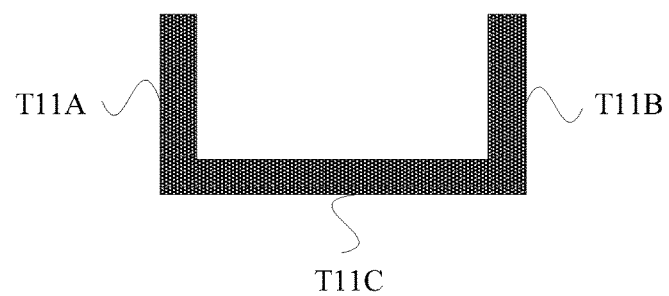
FIG. 11 is a schematic diagram of a structure of an active layer of a first transistor.

FIG. 11 is a schematic diagram of a structure of an active layer of a first transistor. As shown in FIG. 11, in an exemplary embodiment, the active layer of the first transistor includes: a first branch segment T11A, a first connection segment T11C, and a second branch segment T11B. The first branch segment T11A and the second branch segment T11B are located on a same side of the first connection segment T11C, and the first connection segment T11C is respectively connected with the first branch segment T11A and the second branch segment T11B.

In an exemplary embodiment, the first branch segment T11A and the second branch segment T11B extend along a first direction, and the first connection segment T11C extends along a second direction. In an exemplary embodiment, a length of the first connection segment T11C is greater than a length of the first branch segment.

In the present disclosure, the active layer of the first transistor is U-shaped, and a channel region of the first transistor extends along the second direction, so that a length of the active layer of the first transistor may be increased, a leakage current may be reduced, and occupation of a pixel circuit in the first direction may be reduced.

In an exemplary embodiment, when the drive circuit layer includes seven metal layers, and K=4, and when light emitting devices connected with pixel circuits are arranged along a first direction and a second direction, an active layer of a fifth transistor of a pixel circuit of row i and column j and an active layer of a fifth transistor of a pixel circuit of row i and column i+1 are of an integrally formed structure; a gate electrode of an eighth transistor of the pixel circuit of row i and column j and a gate electrode of an eighth transistor of the pixel circuit of row i and column j+1 are of an integrally formed structure; a gate electrode of a ninth transistor of the pixel circuit of row i and column j and a gate electrode of a ninth transistor of the pixel circuit of row i and column j+1 are of an integrally formed structure; a gate electrode of a sixth transistor of the pixel circuit of row i and column j+1 and a gate electrode of a sixth transistor of a pixel circuit of row i and column j+2 are of an integrally formed structure; a gate electrode of a seventh transistor of the pixel circuit of row i and column j+1 and a gate electrode of a seventh transistor of a pixel circuit of row i and column j+2 are of an integrally formed structure; a first connection part of the pixel circuit of row i and column j and a first connection part of the pixel circuit of row i and column j+1 are of an integrally formed structure; a first electrode of a fifth transistor of the pixel circuit of row i and column j and a first electrode of a fifth transistor of the pixel circuit of row i and column j+1 are of an integrally formed structure; an eighth connection part of the pixel circuit of row i and column j and an eighth connection part of the pixel circuit of row i and column j+1 are of an integrally formed structure; and a ninth connection part of the pixel circuit of row i and column j and a ninth connection part of the pixel circuit of row i and column j+1 are of an integrally formed structure. Adjacent pixel circuits sharing the above structures may reduce an area occupied by pixel circuits and achieve a high resolution of the display substrate.

In an exemplary embodiment, when the drive circuit layer includes seven metal layers, and K=4, and when light emitting devices connected with pixel circuits are arranged along a first direction and a second direction, the second insulation layer and the third insulation layer are provided with a first via to a ninth via in each pixel circuit; the third insulation layer is also provided with a tenth via and an eleventh via in each pixel circuit; the second insulation layer, the third insulation layer, and the fourth insulation layer are provided with a twelfth via and thirteenth via; the third insulation layer and the fourth insulation layer are provided with a fourteenth via, a fifteenth via, and a sixteenth via in each pixel circuit; the fourth insulation layer and the fifth insulation layer are provided with a seventeenth via to a twenty-second via in each pixel circuit; the third insulation layer, the fourth insulation layer, the fifth insulation layer, and the sixth insulation layer are provided with a twenty-third via and a twenty-fourth via in each pixel circuit; the sixth insulation layer and the seventh insulation layer are provided with a twenty-fifth via and a twenty-sixth via in each pixel circuit; the sixth insulation layer and the seventh insulation layer are further provided with a twenty-seventh via and a twenty-eighth via in another pixel circuit except pixel circuits of a first column; the fifth insulation layer, the sixth insulation layer, the seventh insulation layer, and the eighth insulation layer are provided with a twenty-ninth via and a thirtieth via in each pixel circuit; in pixel circuits of the first column, the sixth insulation layer, the seventh insulation layer, and the eighth insulation layer are provided with a thirty-first via and a thirty-second via in each pixel circuit, the sixth insulation layer, the seventh insulation layer, and the eighth insulation layer are further provided with a thirty-third via and a thirty-fourth via in each pixel circuit; the eighth insulation layer is provided with a thirty-fifth via and a thirty-sixth via in another pixel circuit except pixel circuits of the first column; and the planarization layer is provided with a thirty-seventh via, a thirty-eighth via, a thirty-ninth via, and a fortieth via in each pixel circuit.

In an exemplary embodiment, when the drive circuit layer includes seven metal layers, and K=4, when the light emitting devices connected with the pixel circuits are arranged along the first direction and the second direction, the first via exposes the active layer of the fifth transistor, the second via exposes the active layer of the third transistor, the third via exposes the active layer of the first transistor, the fourth via exposes the active layer of the sixth transistor, the fifth via exposes the active layer of the eighth transistor, the sixth via exposes the active layer of the eighth transistor, the seventh via exposes the active layer of the sixth transistor, the eighth via exposes the active layer of the seventh transistor, the ninth via exposes the active layer of the ninth transistor, the tenth via exposes the gate electrode of the eighth transistor, the eleventh via exposes the gate electrode of the ninth transistor, the twelfth via exposes the active layer of the first transistor and the active layer of the fourth transistor, the thirteenth via exposes the active layer of the second transistor, the fourteenth via exposes the first electrode plate, the fifteenth via exposes the gate electrode of the sixth transistor, the sixteenth via exposes the gate electrode of the seventh transistor, the seventeenth via exposes the second electrode of the sixth transistor, the eighteenth via exposes the second electrode of the eighth transistor, the nineteenth via exposes the first connection part, the twentieth via exposes the second connection part, the twenty-first via exposes the second electrode of the seventh transistor, and the twenty-second via exposes the second electrode of the ninth transistor. The twenty-third via exposes the second electrode of the third transistor, and the twenty-fourth via exposes the first electrode of the sixth transistor. In each pixel circuit, the twenty-fifth via exposes the eighth connection part, the twenty-sixth via exposes the ninth connection part, the twenty-seventh via exposes the sixth connection part, the twenty-eighth via exposes the tenth connection part, the twenty-ninth via exposes the fourth connection part, the thirtieth via exposes the fifth connection part, the thirty-first via exposes the sixth connection part, the thirty-second via exposes the tenth connection part, the thirty-third via exposes the seventh connection part, the thirty-fourth via exposes the eleventh connection part, the thirty-third via exposes the seventh connection part, the thirty-fourth via exposes the eleventh connection part, the thirty-fifth via exposes the thirteenth connection part, the thirty-sixth via exposes the fourteenth connection part, the thirty-seventh via exposes the fifteenth connection part, the thirty-eighth via exposes the sixteenth connection part, the thirty-ninth via exposes the seventeenth connection part, and the fortieth via exposes the eighteenth connection part.

In an exemplary embodiment, when the drive circuit layer includes seven metal layers, and K=4, when the light emitting devices connected with the pixel circuits are arranged along the first direction and the second direction, a first via of a pixel circuit of row i and column j and a first via of a pixel circuit of row i and column j+1 are a same via; a tenth via of the pixel circuit of row i and column j and a tenth via of the pixel circuit of row i and column j+1 are a same via; an eleventh via of the pixel circuit of row i and column j and an eleventh via of the pixel circuit of row i and column j+1 are a same via; a fifteenth via of the pixel circuit of row i and column j+1 and a fifteenth via of a pixel circuit of row i and column j+2 are a same via; a sixteenth via of the pixel circuit of row i and column j+1 and a sixteenth via of the pixel circuit of row i and column j+2 are a same via; a nineteenth via of the pixel circuit of row i and column j and a nineteenth via of the pixel circuit of row i and column j+1 are a same via; a twenty-fifth via of the pixel circuit of row i and column j and a twenty-fifth via of the pixel circuit of row i and column j+1 are a same via. A sixteenth via of the pixel circuit of row i and column j and a sixteenth via of the pixel circuit of row i and column j+1 are a same via; a twenty-ninth via of the pixel circuit of row i and column j+1 and a twenty-ninth via of the pixel circuit of row i and column j+2 are a same via; and a thirtieth via of the pixel circuit of row i and column j+1 and a thirtieth via of the pixel circuit of row i and column j+2 are a same via. Adjacent pixel circuits share the above vias, which may simplify a manufacturing process of the display substrate, reduce space occupied by the pixel circuits along the second direction, and achieve a high resolution of the display substrate.

In an exemplary embodiment, when the drive circuit layer includes seven metal layers, and K=4, and when the light emitting devices connected with the pixel circuits are arranged along the first direction and the second direction, for each pixel circuit, the first electrode of the fifth transistor is connected with the active layer of the fifth transistor through the first via, the second electrode of the third transistor is connected with the active layer of the third transistor through the second via, the first electrode of the first transistor is connected with the active layer of the first transistor through the third via, the second electrode of the sixth transistor is connected with the active layer of the sixth transistor through the fourth via, the second electrode of the eighth transistor is connected with the active layer of the eighth transistor through the fifth via, the first electrode of the eighth transistor is connected with the active layer of the eighth transistor through the sixth via, the first electrode of the sixth transistor is connected with the active layer of the sixth transistor through the seventh via, the second electrode of the seventh transistor is connected with the active layer of the seventh transistor through the eighth via, the second electrode of the ninth transistor is connected with the active layer of the ninth transistor through the ninth via, the first connection part is connected with the gate electrode of the eighth transistor through the tenth via, the second connection part is connected with the gate electrode of the ninth transistor through the eleventh via, the third connection part is connected with the active layer of the first transistor through the twelfth via, the third connection part is connected with the first electrode plate through the fourteenth via, the first electrode of the second transistor is connected with the active layer of the second transistor through the thirteenth via, the fourth connection part is connected with the gate electrode of the sixth transistor through the fifteenth via, and the fifth connection part is connected with the gate electrode of the seventh transistor through the sixteenth via. In an exemplary embodiment, the sixth connection part is connected with the second electrode of the sixth transistor through the seventeenth via, the seventh connection part is connected with the second electrode of the eighth transistor through the eighteenth via, the eighth connection part is connected with the first connection part through the nineteenth via, the ninth connection part is connected with the second connection part through the twentieth via, the tenth connection part is connected with the second electrode of the seventh transistor through the twenty-first via, the eleventh connection part is connected with the second electrode of the ninth transistor through the twenty-second via, the twelfth connection part is connected with the second electrode of the third transistor through the twenty-third via, and is connected with the first electrode of the sixth transistor through the twenty-fourth via, the third light emitting selection signal line is connected with the eighth connection part through the twenty-fifth via, the fourth light emitting selection signal line is connected with the ninth connection part through the twenty-sixth via, the first light emitting selection signal line is connected with the fourth connection part through the twenty-ninth via, the second light emitting selection signal line is connected with the fifth connection part through the thirtieth via, a first light emitting device connected with a pixel circuit is connected with the fifteenth connection part through the thirty-sixth via, a second light emitting device connected with a pixel circuit is connected with the seventeenth connection part through the thirty-eighth via, a third light emitting device connected with a pixel circuit is connected with the sixteenth connection part through the thirty-seventh via, and a fourth light emitting device connected with a pixel circuit is connected with the eighteenth connection part through the thirty-eighth via. In pixel circuits of a first column, the fifteenth connection part is connected with the sixth connection part through the thirty-first via, the sixteenth connection part is connected with the tenth connection part through the thirty-second via, the seventeenth connection part is connected with the seventh connection part through the thirty-third via, the eighteenth connection part is connected with the eleventh connection part through the thirty-fourth via; in another pixel circuit except the pixel circuits of the first column, the thirteenth connection part is connected with the sixth connection part through the twenty-seventh via, the fourteenth connection part is connected with the tenth connection part through the twenty-eighth via, the fifteenth connection part is connected with the seventh connection part through the thirty-third via, the sixteenth connection part is connected with the eleventh connection part through the thirty-fourth via, the seventeenth connection part is connected with the thirteenth connection part through the thirty-fifth via, and the eighteenth connection part is connected with the fourteenth connection part through the thirty-sixth via.

In an exemplary embodiment, as shown in FIG. 9, a light emitting device includes: a first electrode, an organic emitting layer, and a second electrode; a light emitting structure layer 300 includes a first electrode layer 31, a pixel definition layer 34, a light emitting material layer 33, and a second electrode layer 34 which are sequentially stacked on a drive structure layer 200. The first electrode layer includes first electrodes arranged in an array, the light emitting material layer includes organic emitting layers arranged in an array, and the second electrode layer includes a second electrode. A pixel circuit is connected with a first electrode of a light emitting device connected with the pixel circuit, and second electrodes of all light emitting devices are connected with a second power supply terminal VSS.

In an exemplary embodiment, the organic emitting layer may include a Hole Injection Layer (HIL for short), a Hole Transport Layer (HTL for short), an Electron Block Layer (EBL for short), an Emitting Layer (EML for short), a Hole Block Layer (HBL for short), an Electron Transport Layer (ETL for short), and an Electron Injection Layer (EIL for short) that are stacked. In an exemplary implementation mode, hole injection layers of all sub-pixels may be connected together to form a common layer, electron injection layers of all the sub-pixels may be connected together to form a common layer, hole transport layers of all the sub-pixels may be connected together to form a common layer, electron transport layers of all the sub-pixels may be connected together to form a common layer, hole block layers of all the sub-pixels may be connected together to form a common layer, emitting layers of adjacent sub-pixels may be overlapped slightly or may be isolated from each other, and electron block layers of adjacent sub-pixels may be overlapped slightly or may be isolated from each other.

In an exemplary embodiment, the second power supply terminal VSS continuously provides a low-level signal.

In an exemplary embodiment, when the drive circuit layer includes seven metal layers, and K=4, and when light emitting devices connected with pixel circuits are arranged along a first direction and a second direction, for a pixel circuit of row m and column 3n−2, an orthographic projection of the fifteenth connection part on the base substrate is at least partially overlapped with an orthographic projection of a first electrode of a first light emitting device in a light emitting unit of row 2m−1 and column 2n−1 on the base substrate, an orthographic projection of the sixteenth connection part on the base substrate is at least partially overlapped with an orthographic projection of a first electrode of a first light emitting device in a light emitting unit of row 2m and column 2n−1 on the base substrate; an orthographic projection of the seventeenth connection part on the base substrate is at least partially overlapped with an orthographic projection of a first electrode of a first light emitting device in a light emitting units of row 2m−1 and column 2n on the base substrate, and an orthographic projection of the eighteenth connection part on the base substrate is at least partially overlapped with an orthographic projection of a first electrode of a first light emitting device in a light emitting unit of row 2m and column 2n on the base substrate; for a pixel circuit of row m and column 3n−1, the orthographic projection of the fifteenth connection part on the base substrate is at least partially overlapped with an orthographic projection of a first electrode of a second light emitting device in the light emitting unit of row 2m−1 and column 2n−1 on the base substrate, the orthographic projection of the sixteenth connection part on the base substrate is at least partially overlapped with an orthographic projection of a first electrode of a second light emitting device in the light emitting unit of row 2m and column 2n−1 on the base substrate, the orthographic projection of the seventeenth connection part on the base substrate is at least partially overlapped with an orthographic projection of a first electrode of a second light emitting device in the light emitting unit of row 2m−1 and column 2n on the base substrate, and the orthographic projection of the eighteenth connection part on the base substrate is at least partially overlapped with an orthographic projection of a first electrode of a second light emitting device in the light emitting unit of row 2m and column 2n on the base substrate; for a pixel circuit of row m and column 3n, the orthographic projection of the fifteenth connection part on the base substrate is at least partially overlapped with an orthographic projection of a first electrode of a third light emitting device in the light emitting unit of row 2m−1 and column 2n−1 on the base substrate, the orthographic projection of the sixteenth connection part on the base substrate is at least partially overlapped with an orthographic projection of a first electrode of a third light emitting device in the light emitting unit of row 2m and column 2n−1 on the base substrate; the orthographic projection of the seventeenth connection part on the base substrate is at least partially overlapped with an orthographic projection of a first electrode of a third light emitting device in the light emitting unit of row 2m−1 and column 2n on the base substrate, and the orthographic projection of the eighteenth connection part on the base substrate is at least partially overlapped with an orthographic projection of a first electrode of a third light emitting device in the light emitting unit of row 2m and column 2n on the base substrate.

Figure 12A:
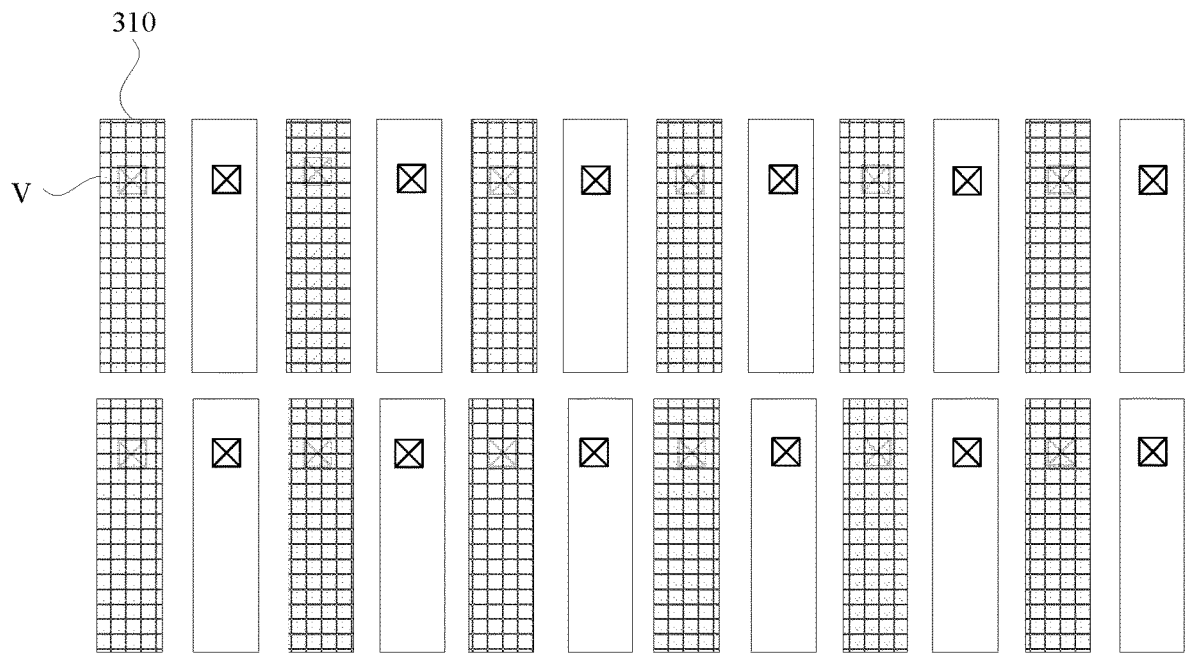
FIG. 12A is a first schematic diagram of a planarization layer and a first electrode layer in an exemplary embodiment.
Figure 12B:
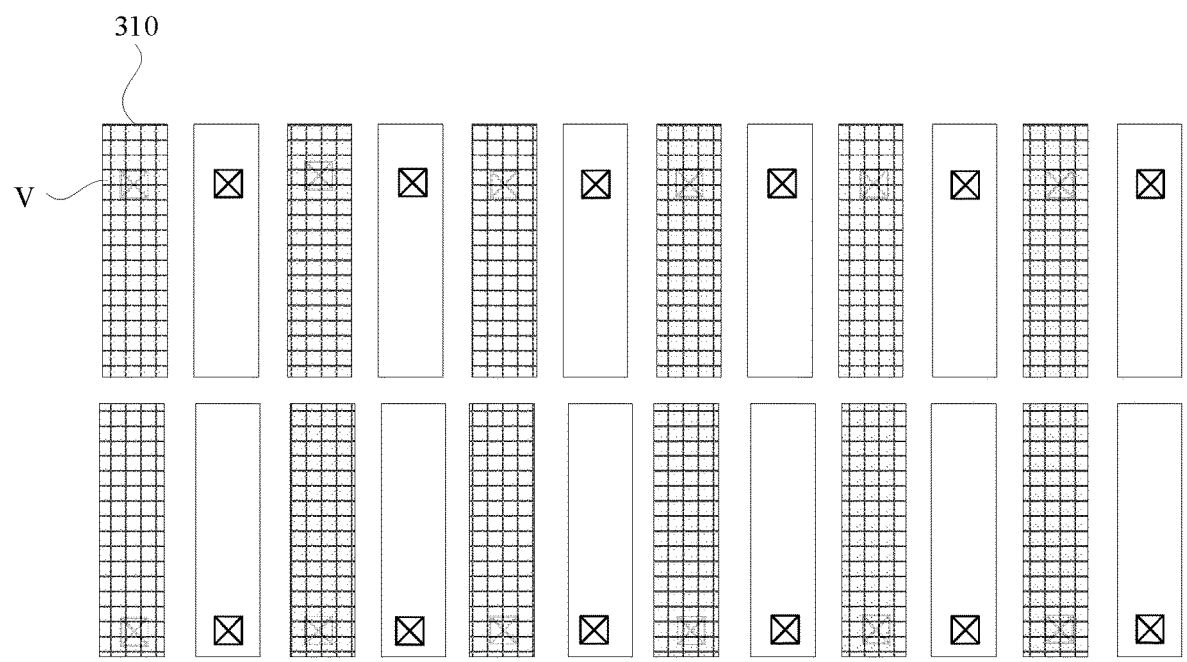
FIG. 12B is a second schematic diagram of a planarization layer and a first electrode layer in an exemplary embodiment.

FIG. 12A is a first schematic diagram of a planarization layer and a first electrode layer in an exemplary embodiment. FIG. 12B is a second schematic diagram of a planarization layer and a first electrode layer in an exemplary embodiment. As shown in FIG. 12A and FIG. 12B, for each light emitting device, a surface of a first electrode 310 in a first electrode layer away from a base substrate includes: a first terminal and a second terminal; a planarization layer is provided with a via V, and the first electrode is connected with a pixel circuit through the via of the planarization layer.

In an exemplary embodiment, a via of the planarization layer connecting first electrodes of light emitting devices located in a same row with a pixel circuit is located at a same terminal of the first electrodes.

In an exemplary embodiment, a via of the planarization layer connecting a first electrode of a light emitting device located in an x-th row with a pixel circuit is located at a first terminal or a second terminal of the first electrode, and a via of the planarization layer connecting a first electrode of a light emitting device located in an (x+1)-th row with a pixel circuit is located at a first terminal or a second terminal of the first electrode. FIG. 12A is illustrated by taking a case that the via of the planarization layer connecting the first electrode of the light emitting device located in the x-th row with the pixel circuit is located at the first terminal of the first electrode, and the via of the planarization layer connecting the first electrode of the light emitting device located in the (x+1)-th row with the pixel circuit is located at the first terminal of the first electrode, as an example. FIG. 12A is illustrated by taking a case that the via of the planarization layer connecting the first electrode of the light emitting device located in the x-th row with the pixel circuit is located at the first terminal of the first electrode, and the via of the planarization layer connecting the first electrode of the light emitting device located in the (x+1)-th row with the pixel circuit is located at the second terminal of the first electrode, as an example. The present disclosure is not limited thereto.

The structure of the display substrate will be described below through an example of a preparation process of the display substrate. A "patterning process" mentioned in the present disclosure includes processes, such as deposition of a film layer, photoresist coating, masking and exposure, development, etching, and photoresist stripping. Deposition may be any one or more of sputtering, evaporation, and chemical vapor deposition. Coating may be any one or more of spray coating and spin coating. Etching may be any one or more of dry etching and wet etching. A "thin film" refers to a layer of a thin film prepared from a material on a base substrate using a process of deposition or coating. If a patterning process is not needed for the "thin film" during a whole preparation process, the "thin film" may also be referred to as a "layer". When a patterning process is needed for the "thin film" during the whole preparation process, the thin film is referred to as a "thin film" before the patterning process and referred to as a "layer" after the patterning process. The "layer" after the patterning process includes at least one "pattern". "A and B are disposed in a same layer" mentioned in the present disclosure means that A and B are simultaneously formed through a same patterning process.

FIGS. 13 to 28 are schematic diagrams of a preparation process of a display panel according to an exemplary embodiment. A display panel according to an exemplary embodiment is described below with reference to FIGS. 13 to 28. FIGS. 13 to 28 are described by taking a case that there are six pixel circuits, a drive circuit layer includes seven metal layers, K=4, and light emitting devices connected with pixel circuits are arranged along a first direction and a second direction, as an example.

Figure 13:
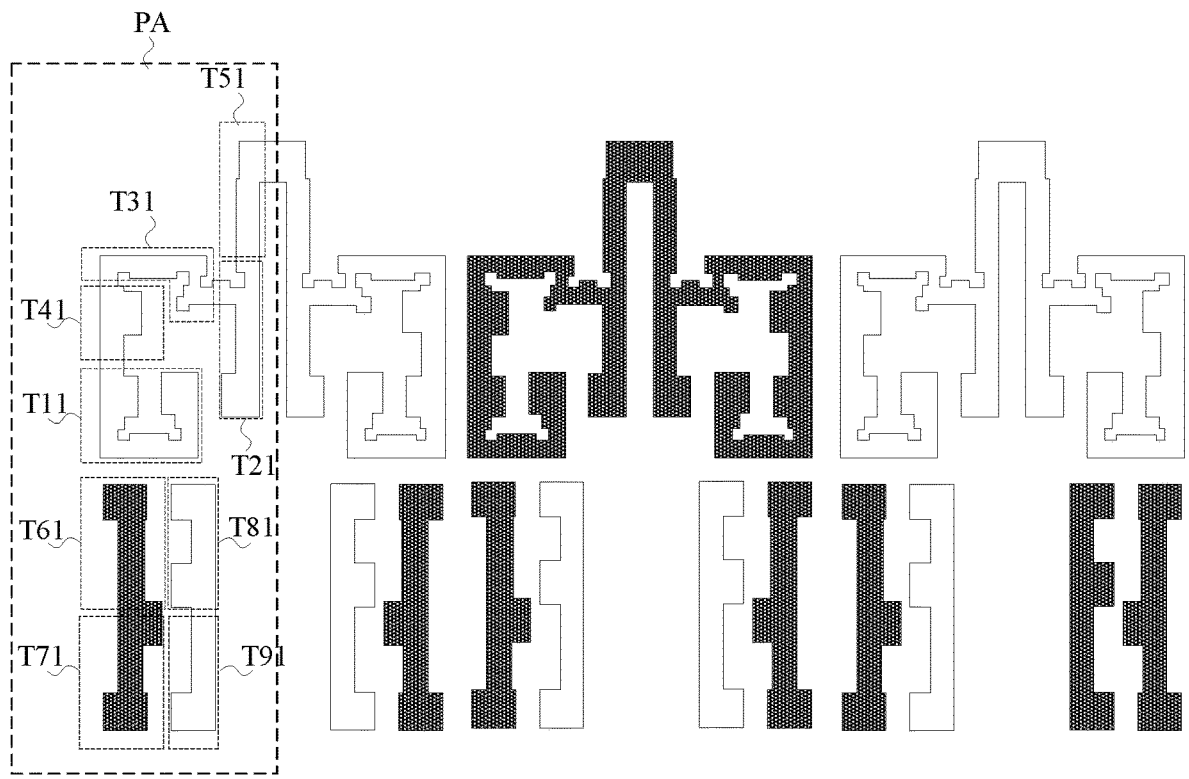
FIG. 13 is a schematic diagram after a semiconductor layer is formed.

(1) Forming a semiconductor layer on a base substrate, includes: depositing a first insulation thin film on the base substrate, patterning the first insulation thin film through a patterning process to form a first insulation layer, depositing a semiconductor thin film on the first insulation thin film, and patterning the semiconductor thin film through a patterning process to form the semiconductor layer. The semiconductor layer includes: active layers of multiple pixel circuits PA, an active layer of each pixel circuit PA includes: an active layer T11 of a first transistor, an active layer T21 of a second transistor, an active layer T31 of a third transistor, an active layer T41 of a fourth transistor, an active layer T51 of a fifth transistor, an active layer T61 of a sixth transistor, an active layer T71 of a seventh transistor, an active layer T81 of an eighth transistor, and an active layer T91 of a ninth transistor, as shown in FIG. 13, which is a schematic diagram after the semiconductor layer is formed.

In an exemplary embodiment, in each pixel circuit, the active layer T11 of the first transistor to the active layer T51 of the fifth transistor are of an integrally formed structure. The active layer T61 of the sixth transistor to the active layer T71 of the seventh transistor are of an integrally formed structure, and the active layer T81 of the eighth transistor and the active layer T91 of the ninth transistor are of an integrally formed structure. The active layer T61 of the sixth transistor, the active layer T71 of the seventh transistor, the active layer T81 of the eighth transistor, and the active layer T91 of the ninth transistor are located on a same side of the active layer T11 of the first transistor, the active layer T21 of the second transistor, the active layer T31 of the third transistor, the active layer T41 of the fourth transistor, and the active layer T51 of the fifth transistor, and are located on a side of the first transistor T11 away from the active layer T41 of the fourth transistor.

In an exemplary embodiment, the active layer T11 of the first transistor has a U-shaped structure, the active layer T21 of the second transistor extends along the first direction, the active layer T31 of the third transistor has an inverted U-shaped structure, and an opening direction of the active layer T11 of the first transistor is opposite to an opening direction of the active layer T31 of the third transistor. The active layer T41 of the fourth transistor extends along the first direction, the active layer T51 of the fifth transistor extends along the first direction, the active layer T61 of the sixth transistor to the active layer T71 of the seventh transistor all extend along the first direction, the active layer T81 of the eighth transistor and the active layer T91 of the ninth transistor all extend along the first direction, and the active layer T61 of the sixth transistor and the active layer T81 of the eighth transistor are arranged along a second direction, wherein the first direction and the second direction intersect.

In an exemplary embodiment, active layers of adjacent pixel circuits are disposed symmetrically along a midline of the adjacent pixel circuits. An active layer of a fifth transistor of a pixel circuit of row i and column i and an active layer of a fifth transistor of a pixel circuit of row i and column i+1 are of an integrally formed structure; wherein i is an odd number.

Figure 14A:
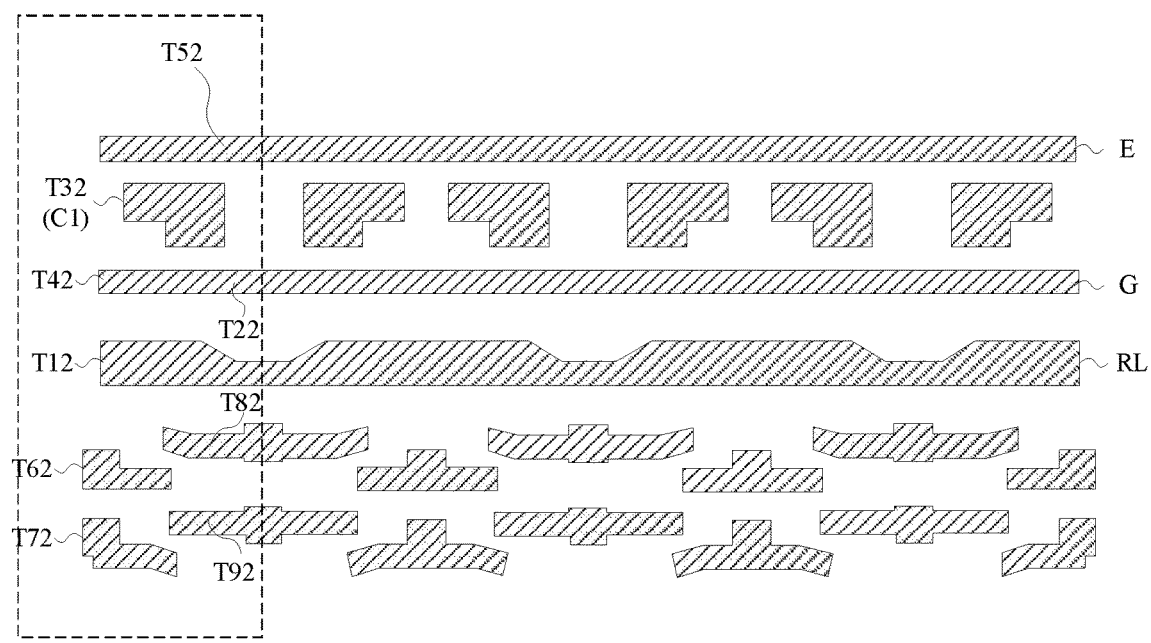
FIG. 14A is a schematic diagram of a first metal layer.
Figure 14B:
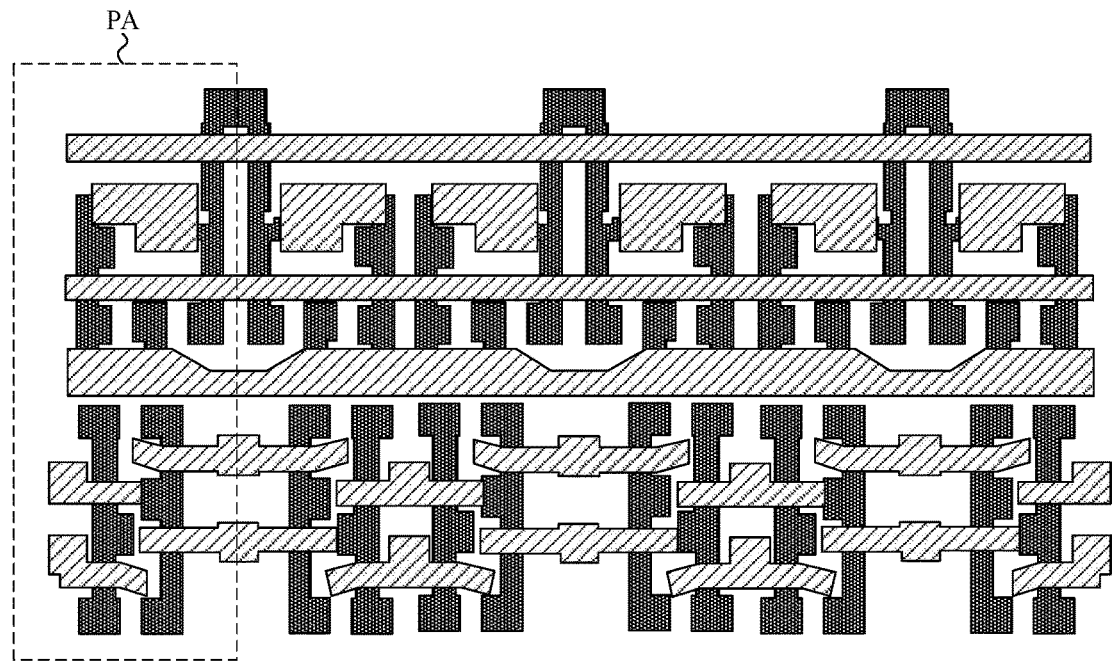
FIG. 14B is a schematic diagram after a first metal layer is formed.

(2) Forming a first metal layer, includes: depositing a second insulation thin film on the base substrate on which the semiconductor layer is formed; patterning the second insulation thin film through a patterning process to form a second insulation layer; depositing a first metal thin film on the second insulation layer, and patterning the first metal thin film through a patterning process to form the first metal layer. The first metal layer includes: a light emitting control line E, a scan signal line G, a reset signal line RL, and first conductive layers of multiple pixel circuits. A first conductive layer of each pixel circuit includes: a gate electrode T12 of a first transistor, a gate electrode T22 of a second transistor, a gate electrode T32 of a third transistor, a gate electrode T42 of a fourth transistor, a gate electrode T52 of a fifth transistor, a gate electrode T62 of a sixth transistor, a gate electrode T72 of a seventh transistor, a gate electrode T82 of an eighth transistor, a gate electrode T92 of a ninth transistor, and a first electrode plate C1, as shown in FIGS. 14A and 14B. FIG. 14A is a schematic diagram of the first metal layer, and FIG. 14B is a schematic diagram after the first metal layer is formed.

In an exemplary embodiment, first conductive layers of adjacent pixel circuits are disposed symmetrically along a midline between the adjacent pixel circuits.

In an exemplary embodiment, the light emitting control line E, the scan signal line G, and the reset signal line RL all extend along the second direction and are arranged along the first direction, and the scan signal line G is located between the light emitting control line E and the reset signal line RL. Among them, a light emitting control line of row i is electrically connected with light emitting control terminals of all pixel circuits located in row i. A scan signal line of row i is electrically connected with scan signal terminals of all pixel circuits located in row i. A reset signal line of row i is electrically connected with reset signal terminals of all pixel circuits located in row i.

In an exemplary embodiment, the first electrode plate C1 is located between the light emitting control line E and the scan signal line G.

In an exemplary embodiment, the gate electrode T12 of the first transistor and the reset signal line RL are of an integrally formed structure. The gate electrode T22 of the second transistor, the gate electrode T42 of the fourth transistor, and the scan signal line G are of an integrally formed structure. The gate electrode T32 of the third transistor and the first electrode plate C1 are of an integrally formed structure. The gate electrode T52 of the fifth transistor and the light emitting control line E are of an integrally formed structure.

In an exemplary embodiment, the gate electrode T62 of the sixth transistor, the gate electrode T72 of the seventh transistor, the gate electrode T82 of the eighth transistor, and the gate electrode T92 of the ninth transistor are all located on a side of the reset signal line RL away from the scan signal line G. Among them, the gate electrode T62 of the sixth transistor and the gate electrode T72 of the seventh transistor are arranged along the first direction, and the gate electrode T72 of the seventh transistor is located on a side of the gate electrode T62 of the sixth transistor away from the reset signal line RL. The gate electrode T82 of the eighth transistor and the gate electrode T92 of the ninth transistor are arranged along the first direction, and the gate electrode T92 of the ninth transistor is located on a side of the gate electrode T82 of the eighth transistor away from the reset signal line RL. The gate electrode T62 of the sixth transistor and the gate electrode T82 of the eighth transistor are arranged along the second direction, and the gate electrode T72 of the seventh transistor and the gate electrode T92 of the ninth transistor are arranged along the second direction.

In an exemplary embodiment, a gate electrode T82 of an eighth transistor of a pixel circuit of row i and column j and a gate electrode T82 of an eighth transistor of a pixel circuit of row i and column j+1 are of an integrally formed structure, and a gate electrode T92 of a ninth transistor of the pixel circuit of row i and column j and a gate electrode T92 of a ninth transistor of the pixel circuit of row i and column j+1 are of an integrally formed structure. A gate electrode T62 of a sixth transistor of the pixel circuit of row i and column j+1 and a gate electrode T62 of a sixth transistor of a pixel circuit of row i and column j+2 are of an integrally formed structure. A gate electrode T72 of a seventh transistor of the pixel circuit of row i and column j+1 and a gate electrode T72 of a seventh transistor of the pixel circuit of row i and column j+2 are of an integrally formed structure, wherein 1≤i≤M, and j is an odd number greater than or equal to 1 and less than or equal to N.

Figure 15A:
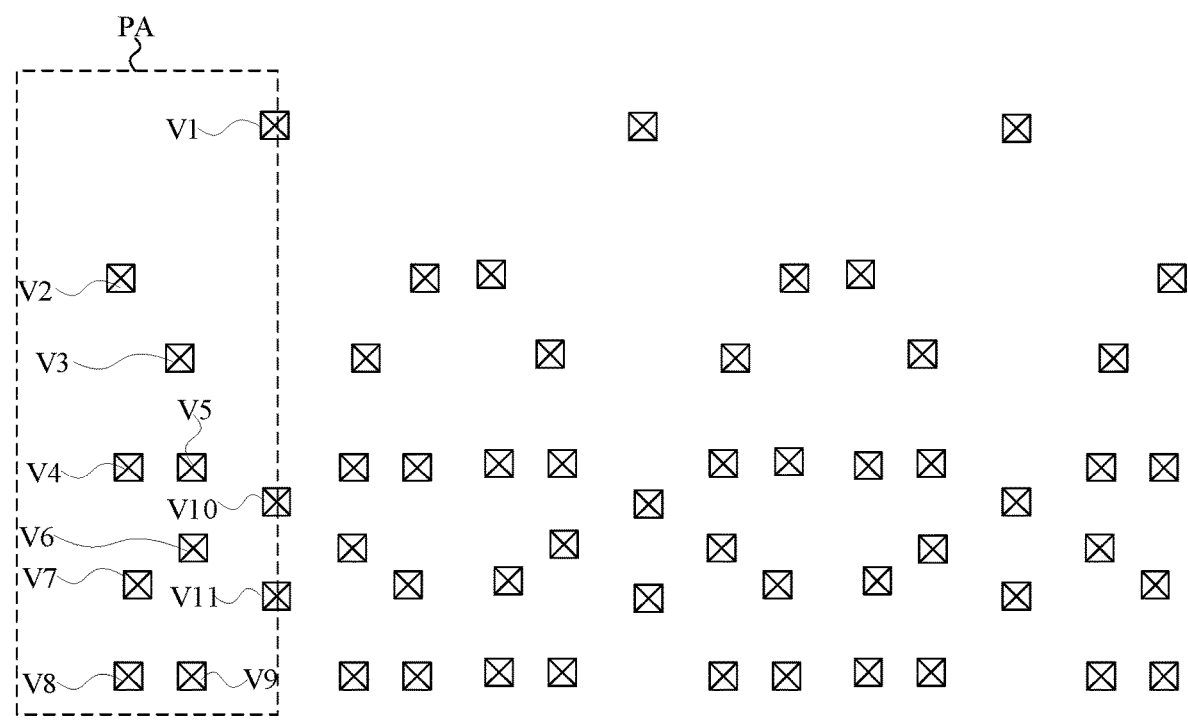
FIG. 15A is a schematic diagram of a third insulation layer.
Figure 15B:
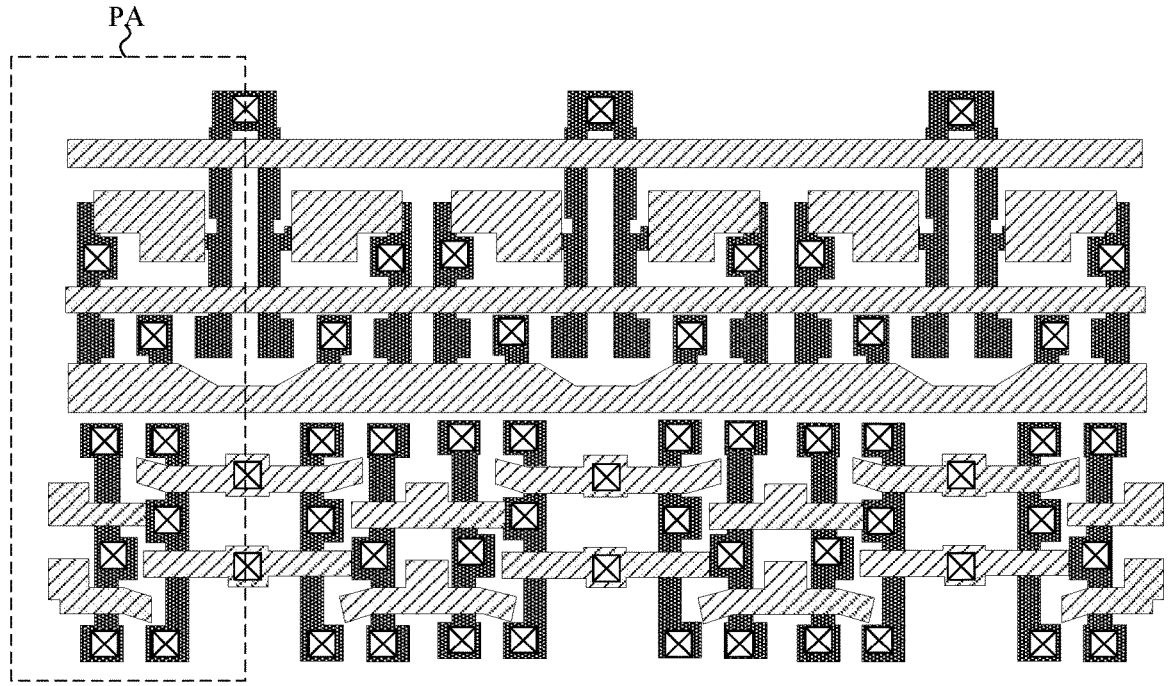
FIG. 15B is a schematic diagram after a third insulation layer is formed.

(3) Forming a third insulation layer, depositing a third insulation thin film on the base substrate on which the first metal layer is formed, and patterning the third insulation thin film through a patterning process to form the third insulation layer. The second insulation layer and the third insulation layer are provided with a first via V1 to a ninth via V9 located in each pixel circuit, and the third insulation layer is further provided with a tenth via V10 and an eleventh via V11 located in each pixel circuit, as shown in FIGS. 15A and 15B. FIG. 15A is a schematic diagram of the third insulation layer, and FIG. 15B is a schematic diagram after the third insulation layer is formed.

In an exemplary embodiment, the first via V1 exposes the active layer of the fifth transistor, the second via V2 exposes the active layer of the third transistor, the third via V3 exposes the active layer of the first transistor, the fourth via V4 exposes the active layer of the sixth transistor, the fifth via V5 exposes the active layer of the eighth transistor, the sixth via V6 exposes the active layer of the eighth transistor, the seventh via V7 exposes the active layer of the sixth transistor, the eighth via V8 exposes the active layer of the seventh transistor, the ninth via V9 exposes the active layer of the ninth transistor, the tenth via V10 exposes the gate electrode of the eighth transistor, and the eleventh via V11 exposes the gate electrode of the ninth transistor.

In an exemplary embodiment, a first via V1 of a pixel circuit of row i and column j and a first via V1 of a pixel circuit of row i and column j+1 are a same via. A tenth via V10 of the pixel circuit of row i and column j and a tenth via V10 of the pixel circuit of row i and column j+1 are a same via. An eleventh via V11 of the pixel circuit of row i and column j and an eleventh via V11 of the pixel circuit of row i and column j+1 are a same via; wherein i is an odd number.

Figure 16A:
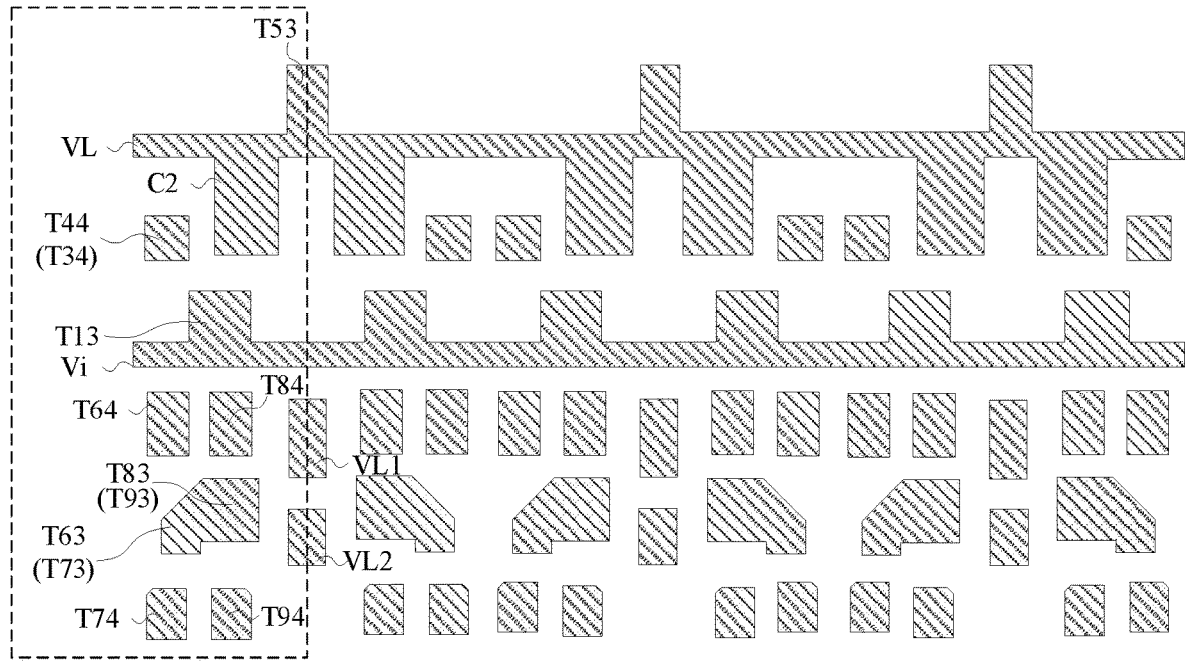
FIG. 16A is a schematic diagram of a second metal layer.
Figure 16B:
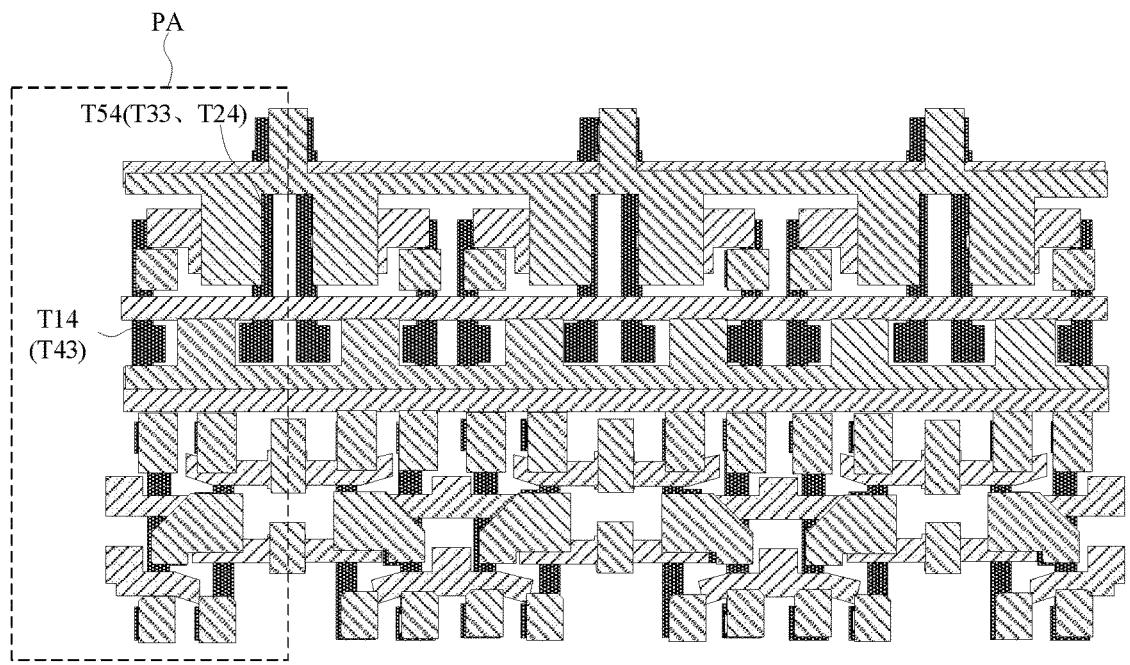
FIG. 16B is a schematic diagram after a second metal layer is formed.

(4) Forming a second metal layer, includes: depositing a second metal thin film on the base substrate on which the third insulation layer is formed; patterning the second metal thin film through a patterning process to form the second metal layer. Among them, the second metal layer includes: second conductive layers of multiple pixel circuits PA, a first power supply line VL, and an initial signal line Vi. A second conductive layer of each pixel circuit PA includes: a first electrode T13 of the first transistor, a second electrode T34 of the third transistor, a second electrode T44 of the fourth transistor, a first electrode T53 of the fifth transistor, a second electrode plate C2, a first electrode T63 of the sixth transistor, a second electrode T64 of the sixth transistor, a first electrode T73 of the seventh transistor, a second electrode T74 of the seventh transistor, a first electrode T83 of the eighth transistor, a second electrode T84 of the eighth transistor, a first electrode T93 of the ninth transistor, a second electrode T94 of the ninth transistor, a first connection part VL1, and a second connection part VL2, as shown in FIGS. 16A and 16B. FIG. 16A is a schematic diagram of the second metal layer, and FIG. 16B is a schematic diagram after the second metal layer is formed.

In an exemplary embodiment, second conductive layers of adjacent pixel circuits are disposed symmetrically along a midline between the adjacent pixel circuits.

In an exemplary embodiment, the first power supply line VL and the initial signal line Vi extend along the second direction and are arranged along the first direction. A first power supply line VL of an i-th row is electrically connected with first power supply terminals of all pixel circuits located in the i-th row, and an initial signal line Vi of the i-th row is electrically connected with initial signal terminals of all the pixel circuits located in the i-th row.

In an exemplary embodiment, an orthographic projection of the first power supply line VL of the i-th row on the base substrate is at least partially overlapped with an orthographic projection of a light emitting control line EM0 of the i-th row on the base substrate.

In an exemplary embodiment, an orthographic projection of the initial signal line Vi of the i-th row on the base substrate is at least partially overlapped with an orthographic projection of a reset signal line Reset of the i-th row on the base substrate.

In an exemplary embodiment, the first electrode T13 of the first transistor is located on a side of the initial signal line Vi close to the first power supply line VL, and the first electrode T13 of the first transistor and the initial signal line Vi are of an integrally formed structure. The first electrode T53 of the fifth transistor is located on a side of the first power supply line VL away from the initial signal line Vi, the second electrode plate C2 is located on a side of the first power supply line VL close to the initial signal line Vi, and the first electrode T53 of the fifth transistor, the second electrode plate C2, and the first power supply line VL are of an integrally formed structure. The second electrode T34 of the third transistor and the second electrode T44 of the fourth transistor are located between the first power supply line VL and the initial signal line Vi, and the second electrode T34 of the third transistor and the second electrode T44 of the fourth transistor are of an integrally formed structure. The first electrode T63 of the sixth transistor, the second electrode T64 of the sixth transistor, the first electrode T73 of the seventh transistor, the second electrode T74 of the seventh transistor, the first electrode T83 of the eighth transistor, the second electrode T84 of the eighth transistor, the first electrode T93 of the ninth transistor, the second electrode T94 of the ninth transistor, the first connection part VL1, and the second connection part VL2 are located on a side of the initial signal line Vi away from the first power supply line VL. The first electrode T63 of the sixth transistor, the first electrode T73 of the seventh transistor, the first electrode T83 of the eighth transistor, and the first electrode T93 of the ninth transistor are of an integrally formed structure.

In an exemplary embodiment, the second electrode T64 of the sixth transistor and the second electrode T84 of the eighth transistor are arranged along the second direction and are located on a side of the first electrode T63 of the sixth transistor close to the initial signal line Vi, and the second electrode T74 of the seventh transistor and the second electrode T94 of the ninth transistor are arranged along the second direction and are located on a side of the first electrode T63 of the sixth transistor away from the initial signal line Vi. The first connection part VL1 and the second connection part VL2 are arranged along the first direction.

In an exemplary embodiment, a first connection part VL1 of a pixel circuit of row i and column j and a first connection part VL1 of a pixel circuit of row i and column j+1 are of an integrally formed structure, and a first electrode T53 of a fifth transistor of the pixel circuit of row i and column j and a first electrode T53 of a fifth transistor of the pixel circuit of row i and column j+1 are of an integrally formed structure, and i is an odd number.

In an exemplary embodiment, for each pixel circuit, the first electrode T53 of the fifth transistor is connected with the active layer of the fifth transistor through the first via, the second electrode T34 of the third transistor is connected with the active layer of the third transistor through the second via, the first electrode T13 of the first transistor is connected with the active layer of the first transistor through the third via, the second electrode T64 of the sixth transistor is connected with the active layer of the sixth transistor through the fourth via, the second electrode T84 of the eighth transistor is connected with the active layer of the eighth transistor through the fifth via, the first electrode T83 of the eighth transistor is connected with the active layer of the eighth transistor through the sixth via, the first electrode T63 of the sixth transistor is connected with the active layer of the sixth transistor through the seventh via, the second electrode T74 of the seventh transistor is connected with the active layer of the seventh transistor through the eighth via, the second electrode T94 of the ninth transistor is connected with the active layer of the ninth transistor through the ninth via, the first connection part VL1 is connected with the gate electrode of the eighth transistor through the tenth via, and the second connection part VL2 is connected with the gate electrode of the ninth transistor through the eleventh via.

Figure 17A:
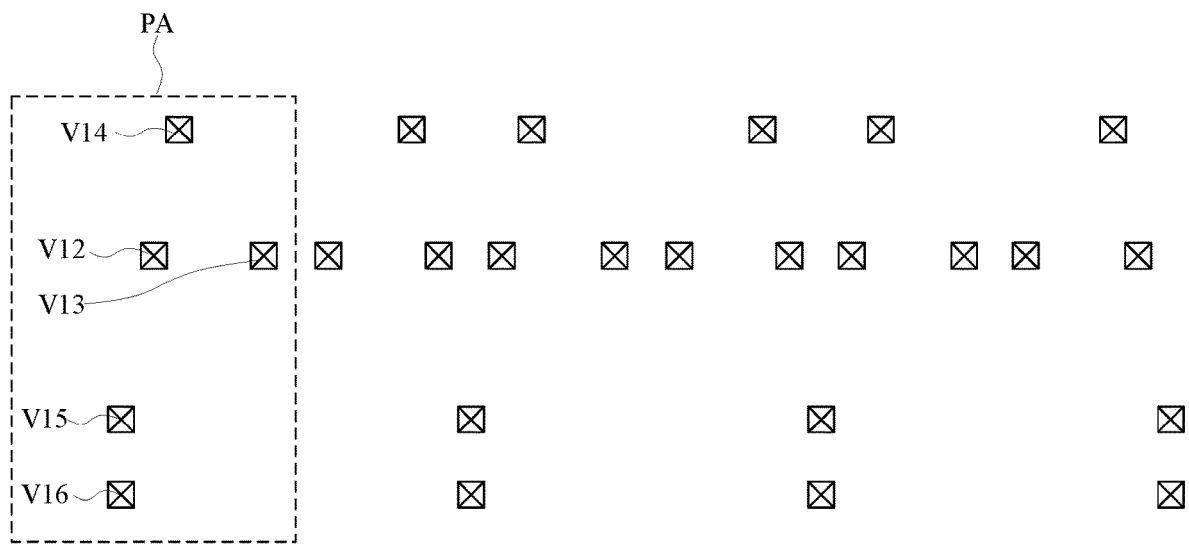
FIG. 17A is a schematic diagram of a fourth insulation layer.
Figure 17B:
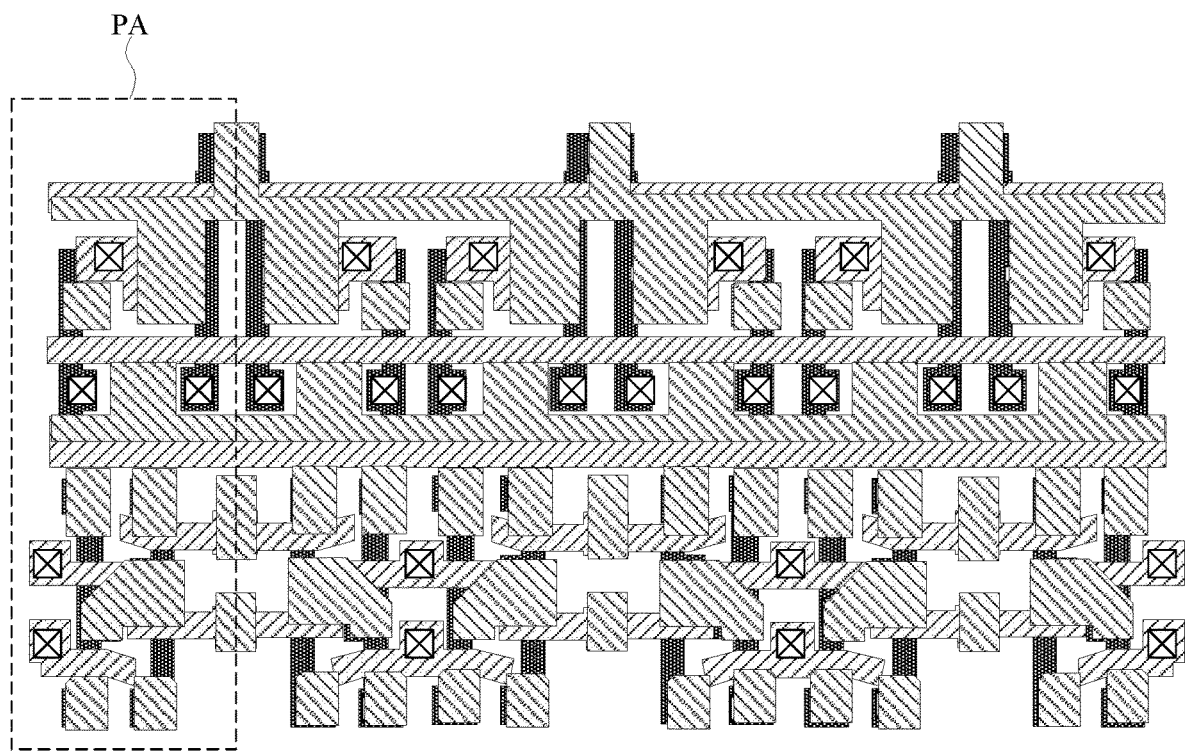
FIG. 17B is a schematic diagram after a fourth insulation layer is formed.

(5) Forming a fourth insulation layer, includes: depositing a fourth insulation thin film on the base substrate on which the second metal layer is formed, and patterning the fourth insulation thin film through a patterning process to form the fourth insulation layer. In each pixel circuit, the second insulation layer, the third insulation layer, and the fourth insulation layer are provided with a twelfth via V12 and a thirteenth via V13. The third insulation layer and the fourth insulation layer are provided with a fourteenth via V14, a fifteenth via V15, and a sixteenth via V16, as shown in FIGS. 17A and 17B. FIG. 17A is a schematic diagram of the fourth insulation layer and FIG. 17B is a schematic diagram after the fourth insulation layer is formed.

In an exemplary embodiment, the twelfth via V12 exposes the active layer of the first transistor and the active layer of the fourth transistor, the thirteenth via V13 exposes the active layer of the second transistor, the fourteenth via V14 exposes the first electrode plate C1, the fifteenth via V15 exposes the gate electrode T62 of the sixth transistor, and the sixteenth via exposes the gate electrode T72 of the seventh transistor.

In an exemplary embodiment, a fifteenth via of a pixel circuit of row i and column j+1 and a fifteenth via of a pixel circuit of row i and column j+2 are a same via, and a sixteenth via of the pixel circuit of row i and column j+1 and a sixteenth via of the pixel circuit of row i and column j+2 are a same via, wherein j is an odd number.

Figure 18A:
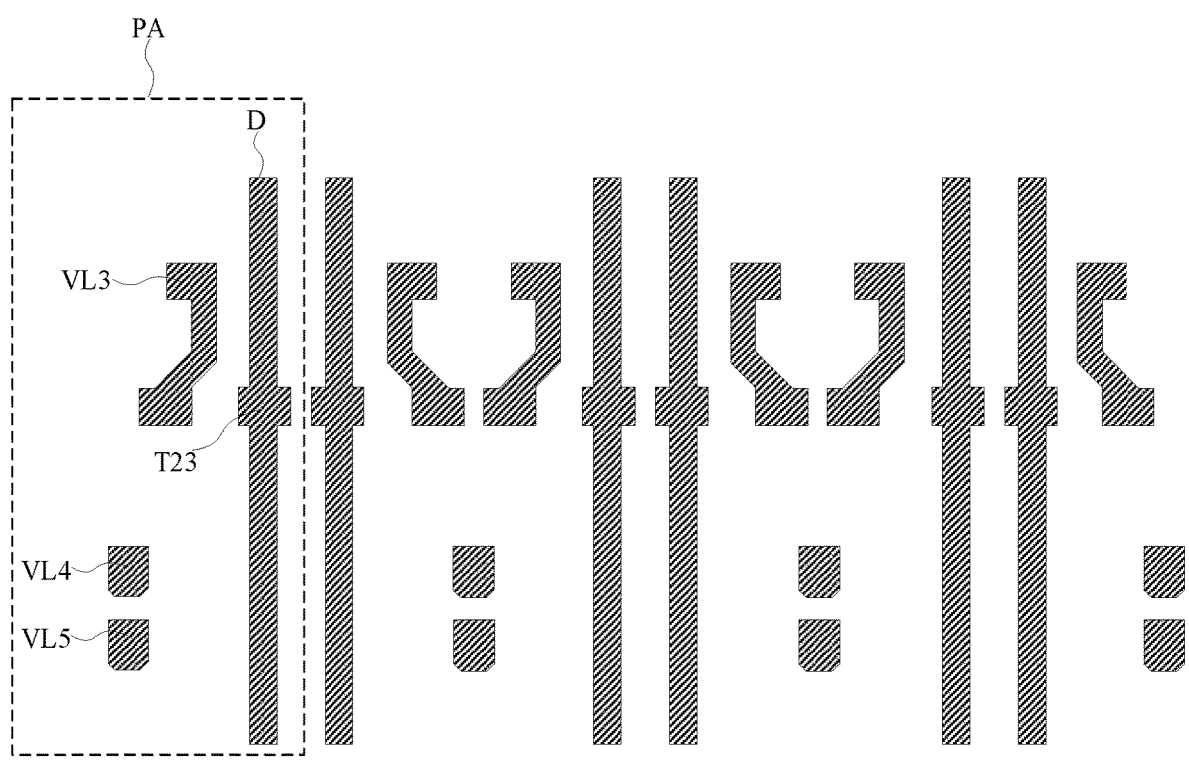
FIG. 18A is a schematic diagram of a third metal layer.
Figure 18B:
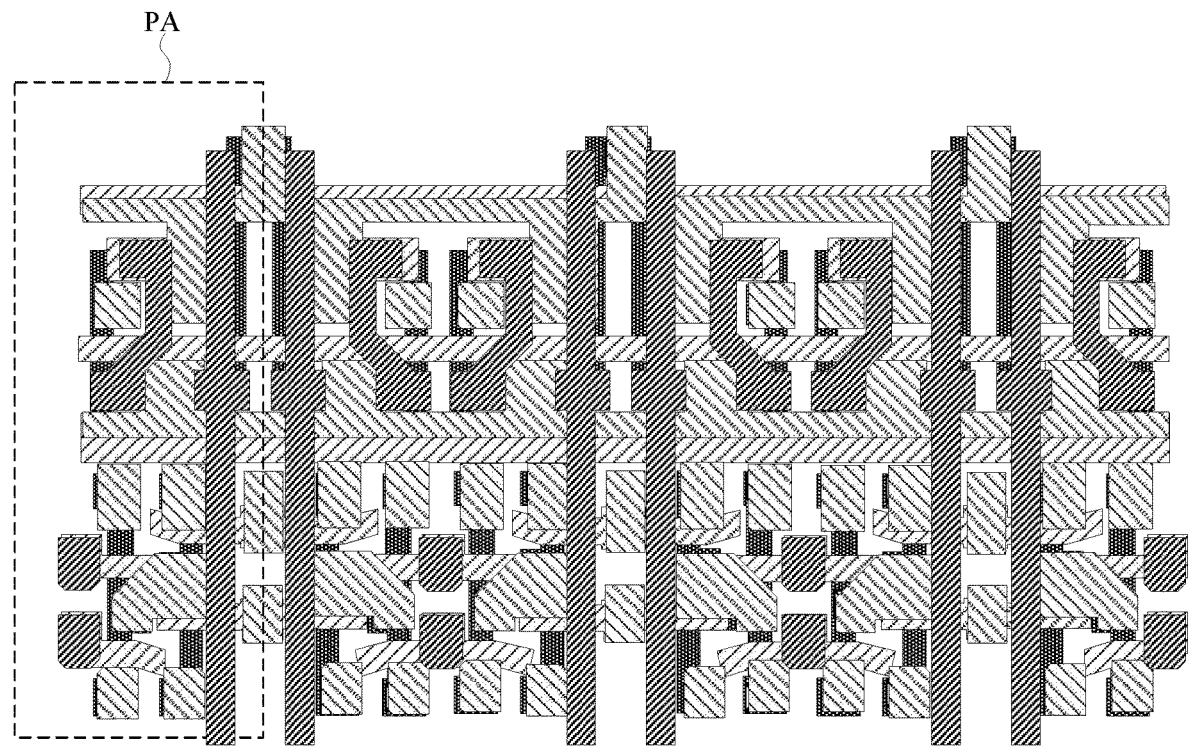
FIG. 18B is a schematic diagram after a third metal layer is formed.

(6) Forming a third metal layer, includes: depositing a third metal thin film on the base substrate on which the fourth insulation layer is formed, and patterning the third metal thin film through a patterning process to form the third metal layer. The third metal layer includes a data signal line D and third conductive layers of multiple pixel circuits, a third conductive layer of each pixel circuit includes a first electrode T23 of the second transistor, a third connection part VL3, a fourth connection part VL4, and a fifth connection part VL5, as shown in FIG. 18A and FIG. 18B, FIG. 18A is a schematic diagram of the third metal layer, and FIG. 18B is a schematic diagram after the third metal layer is formed.

In an exemplary embodiment, the data signal line D extends along the first direction and a data signal line of a j-th column is connected with a data signal terminal with which a pixel circuit of an i-th row and the j-th column is connected. The data signal line D of the j-th column and a data signal line D of a (j+1)-th column are located between a pixel circuit of the j-th column and a pixel circuit of the (j+1)-th column.

In an exemplary embodiment, third conductive layers of adjacent pixel circuits are disposed symmetrically along a midline between the adjacent pixel circuits.

In an exemplary embodiment, the first electrode T23 of the second transistor and the data signal line D are of an integrally formed structure. The third connection part VL3, the fourth connection part VL4, and the fifth connection part VL5 are located on a same side of the data signal line D.

In an exemplary embodiment, the third connection part VL3 is connected with the active layer of the first transistor through the twelfth via, the third connection part VL3 is connected with the first electrode plate C1 through the fourteenth via, the first electrode T23 of the second transistor is connected with the active layer of the second transistor through the thirteenth via, the fourth connection part VL4 is connected with the gate electrode of the sixth transistor through the fifteenth via, and the fifth connection part VL5 is connected with the gate electrode of the seventh transistor through the sixteenth via.

Figure 19A:
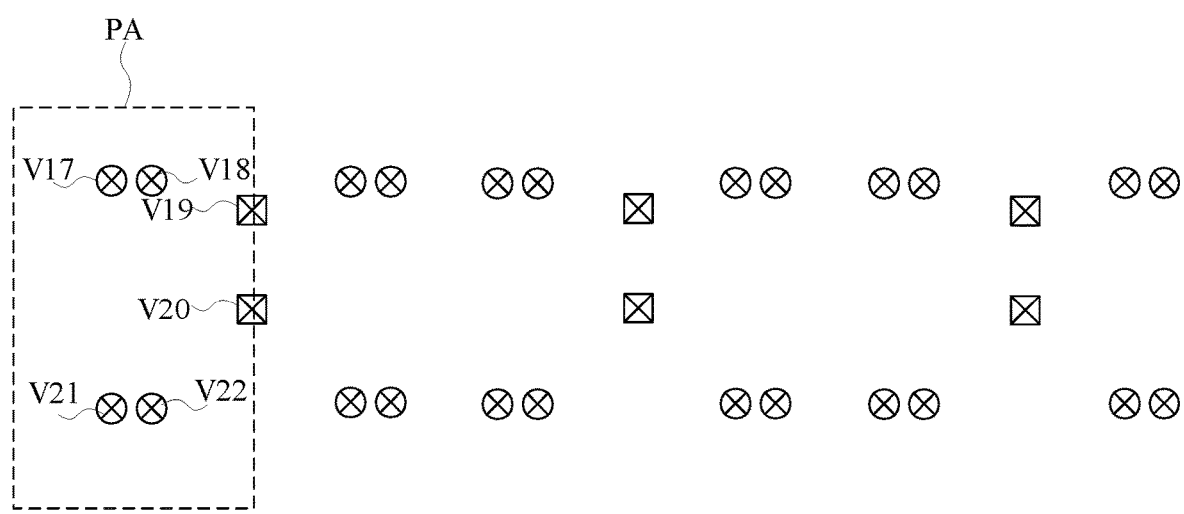
FIG. 19A is a schematic diagram of a fifth insulation layer.
Figure 19B:
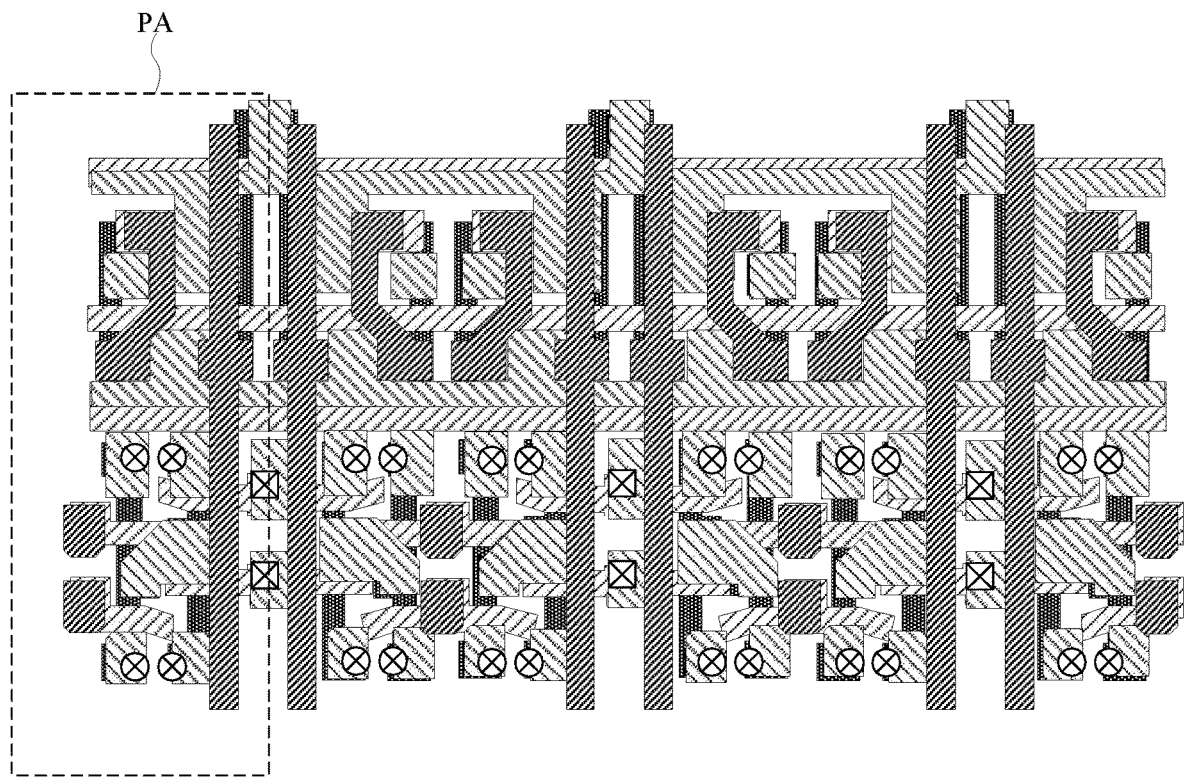
FIG. 19B is a schematic diagram after a fifth insulation layer is formed.

(7) Forming a fifth insulation layer, includes: depositing a fifth insulation thin film on the base substrate on which the third metal layer is formed, and patterning the fifth insulation thin film through a patterning process to form the fifth insulation layer. In each pixel circuit, a seventeenth V17 to a twenty-second via V22 are provided on the fourth insulation layer and the fifth insulation layer, as shown in FIGS. 19A and 19B. FIG. 19A is a schematic diagram of the fifth insulation layer and FIG. 19B is a schematic diagram after the fifth insulation layer is formed.

In an exemplary embodiment, the seventeenth via V17 exposes the second electrode T64 of the sixth transistor, the eighteenth via V18 exposes the second electrode T84 of the eighth transistor, the nineteenth via V19 exposes the first connection part VL1, the twentieth via V20 exposes the second connection part VL2, the twenty-first via V21 exposes the second electrode T74 of the seventh transistor, and the twenty-second via V22 exposes the second electrode T94 of the ninth transistor.

In an exemplary embodiment, a nineteenth via in a pixel circuit of row i and column j and a nineteenth via in a pixel circuit of row i and column j+1 are a same via, and j is an odd number.

Figure 20A:
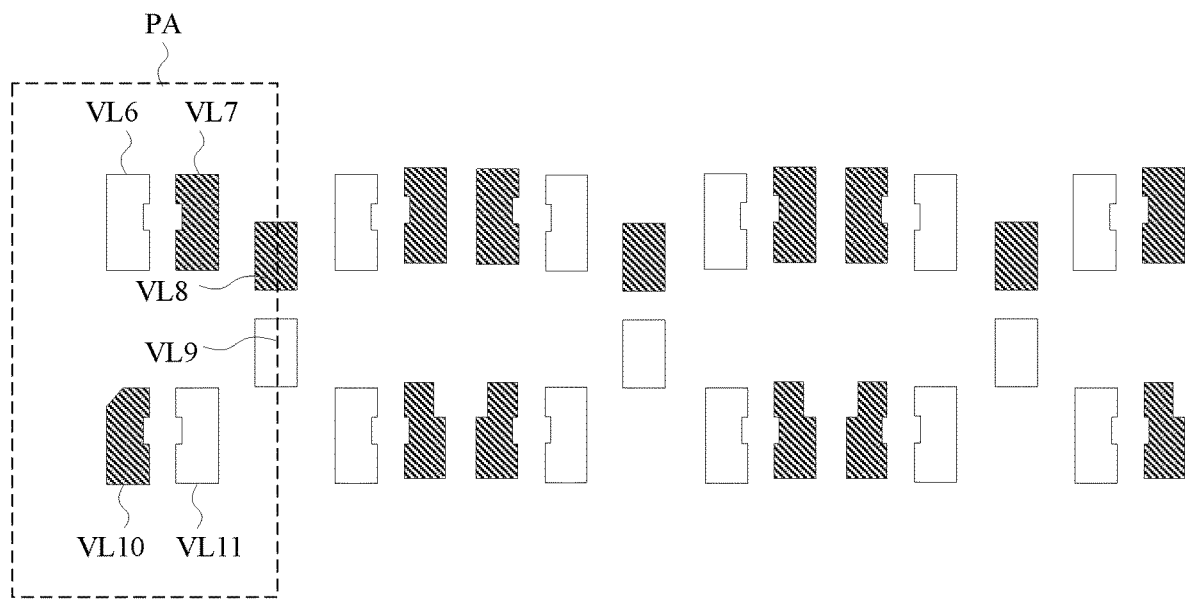
FIG. 20A is a schematic diagram of a fourth metal layer.
Figure 20B:
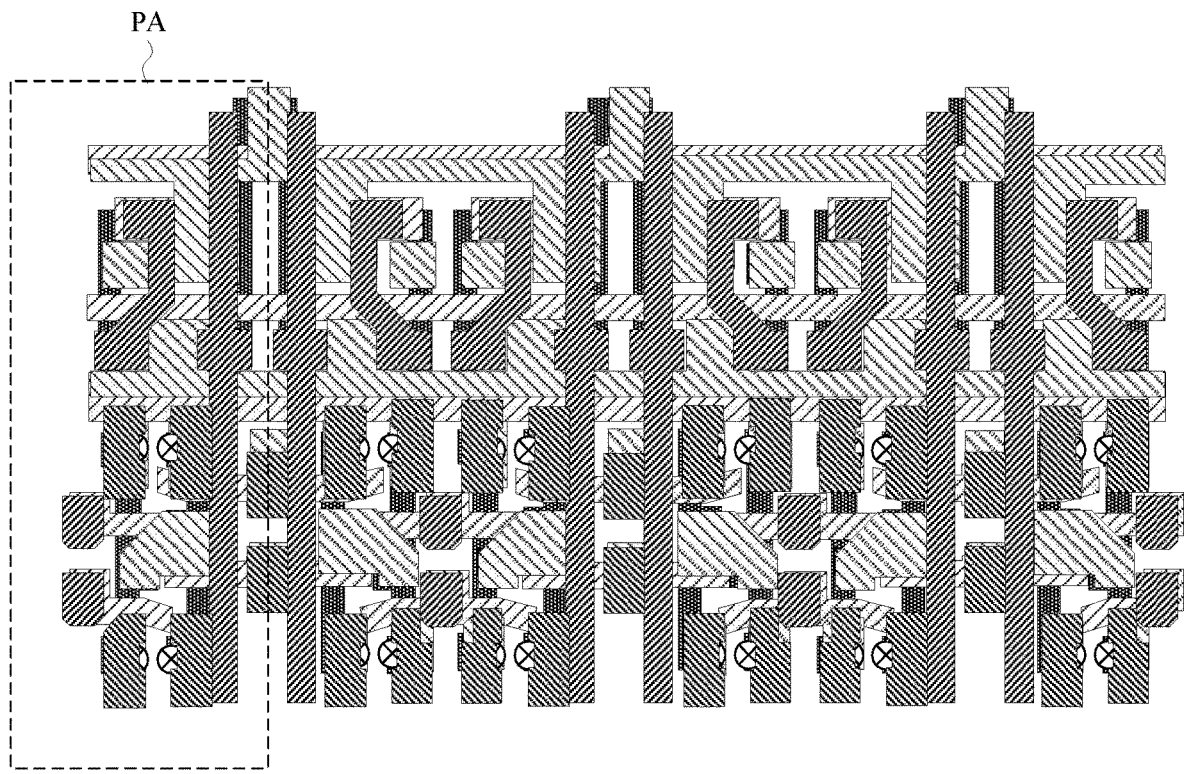
FIG. 20B is a schematic diagram after a fourth metal layer is formed.

(8) Forming a fourth metal layer, includes: depositing a fourth metal thin film on the base substrate on which the fifth insulation layer is formed, and patterning the fourth metal thin film through a patterning process to form the fourth metal layer. The fourth metal layer includes fourth conductive layers of multiple pixel circuits. A fourth conductive layer of each pixel circuit includes a sixth connection part VL6, a seventh connection part VL7, an eighth connection part VL8, a ninth connection part VL9, a tenth connection part VL10, and an eleventh connection part VL11, as shown in FIGS. 20A and 20B. FIG. 20A is a schematic diagram of the fourth metal layer and FIG. 20B is a schematic diagram after the fourth metal layer is formed.

In an exemplary embodiment, fourth conductive layers of adjacent pixel circuits are symmetrical along a midline of the adjacent pixel circuits.

In an exemplary embodiment, in each pixel circuit, the sixth connection part VL6 and the seventh connection part VL7 are arranged along the second direction, the eighth connection part VL8 and the ninth connection part VL9 are arranged along the first direction, the tenth connection part VL10 and the eleventh connection part VL11 are arranged along the second direction, and the sixth connection part VL6 and the tenth connection part VL10 are arranged along the first direction.

In an exemplary embodiment, an eighth connection part VL8 of a pixel circuit of row i and column j, and an eighth connection part VL8 of a pixel circuit of row i and column j+1 are of an integrally formed structure; and j is an odd number.

In an exemplary embodiment, a ninth connection part VL9 of the pixel circuit of row i and column j, and a ninth connection part VL9 of the pixel circuit of row i and column j+1 are of an integrally formed structure; and j is an odd number.

In an exemplary embodiment, in each pixel circuit, the sixth connection part VL6 is connected with the second electrode of the sixth transistor through the seventeenth via, the seventh connection part VL7 is connected with the second electrode of the eighth transistor through the eighteenth via, the eighth connection part VL8 is connected with the first connection part through the nineteenth via, the ninth connection part VL9 is connected with the second connection part through the twentieth via, the tenth connection part VL10 is connected with the second electrode of the seventh transistor through the twenty-first via, and the eleventh connection part VL11 is connected with the second electrode of the ninth transistor through the twenty-second via.

In an exemplary embodiment, in each pixel circuit, the eighth connection part VL8 is connected with the first connection part through the nineteenth via, and the first connection part is connected with the gate electrode of the eighth transistor through the tenth via, that is to say, the eighth connection part is connected with the gate electrode of the eighth transistor through the first connection part.

In an exemplary embodiment, in each pixel circuit, the ninth connection part VL9 is connected with the second connection part through the twentieth via, and the second connection part is connected with the gate electrode of the ninth transistor through the eleventh via, that is to say, the ninth connection part is connected with the gate electrode of the ninth transistor through the second connection part.

Figure 21A:
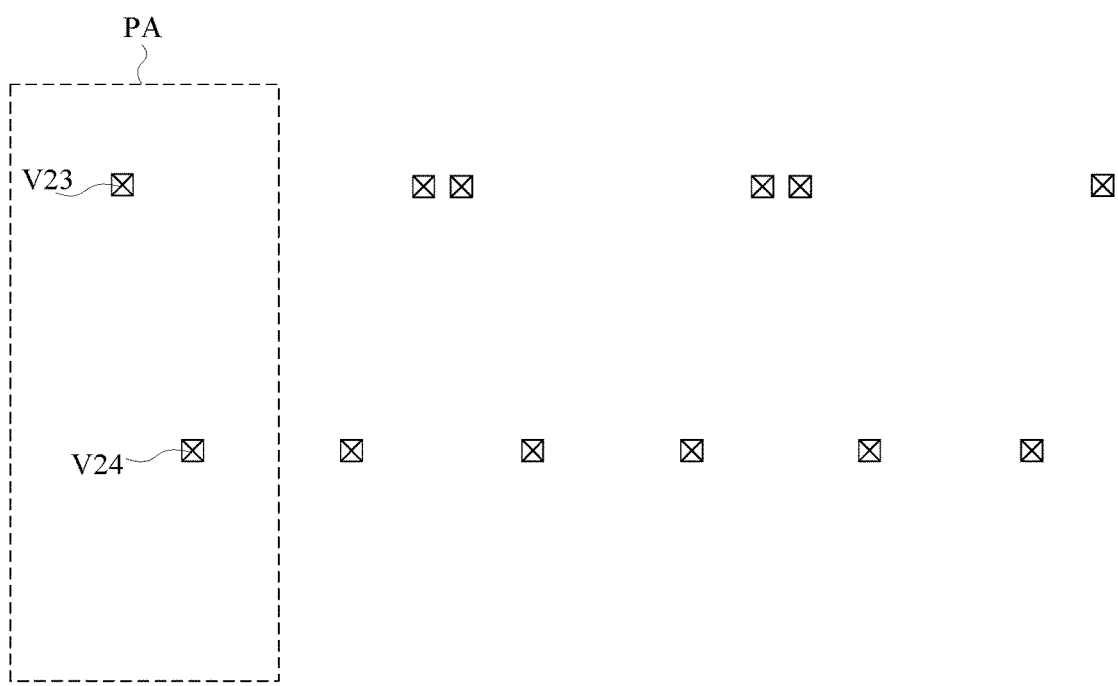
FIG. 21A is a schematic diagram of a sixth insulation layer.
Figure 21B:
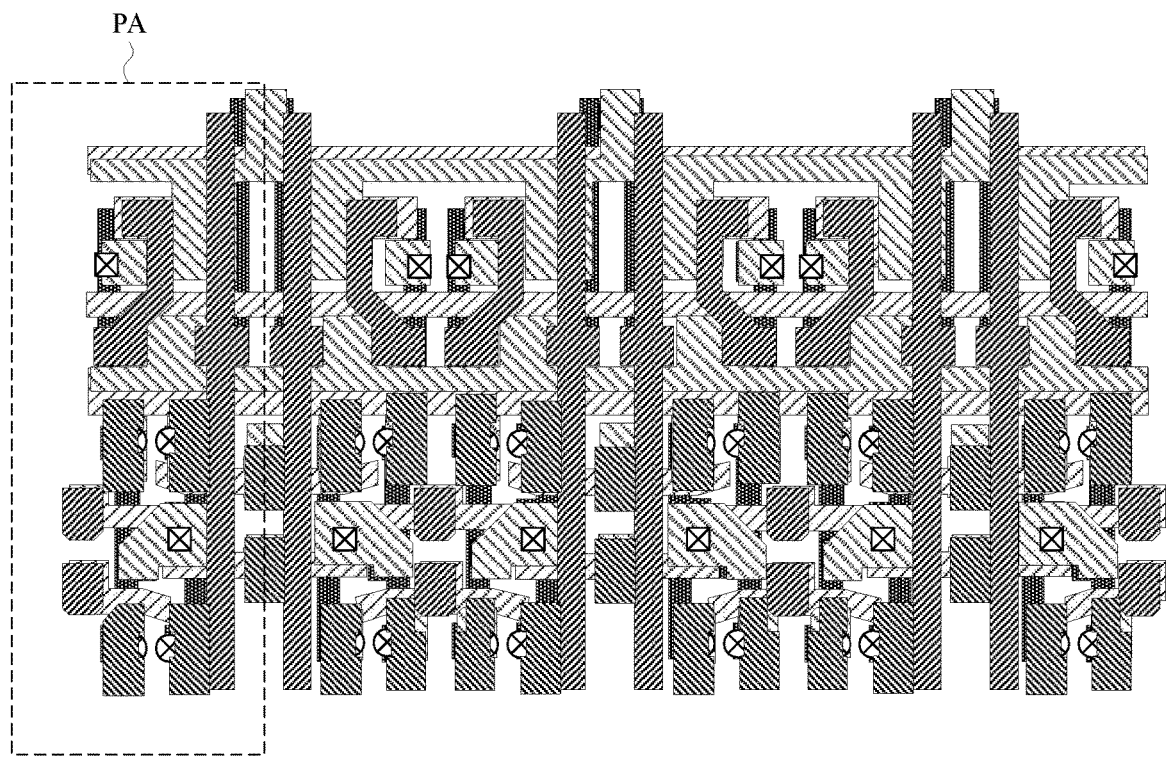
FIG. 21B is a schematic diagram after a sixth insulation layer is formed.

(9) Forming a sixth insulation layer, includes: depositing a sixth insulation thin film on the base substrate on which the fourth metal layer is formed, and patterning the sixth insulation thin film through a patterning process to form the sixth insulation layer. In each pixel circuit, the third insulation layer, the fourth insulation layer, the fifth insulation layer, and the sixth insulation layer are provided with a twenty-third via V23 and a twenty-fourth via V24, as shown in FIGS. 21A and 21B, wherein FIG. 21A is a schematic diagram of the sixth insulation layer, and FIG. 21B is a schematic diagram after the sixth insulation layer is formed.

In an exemplary embodiment, the twenty-third via V23 exposes the second electrode of the third transistor, and the twenty-fourth via V24 exposes the first electrode of the sixth transistor.

Figure 22A:
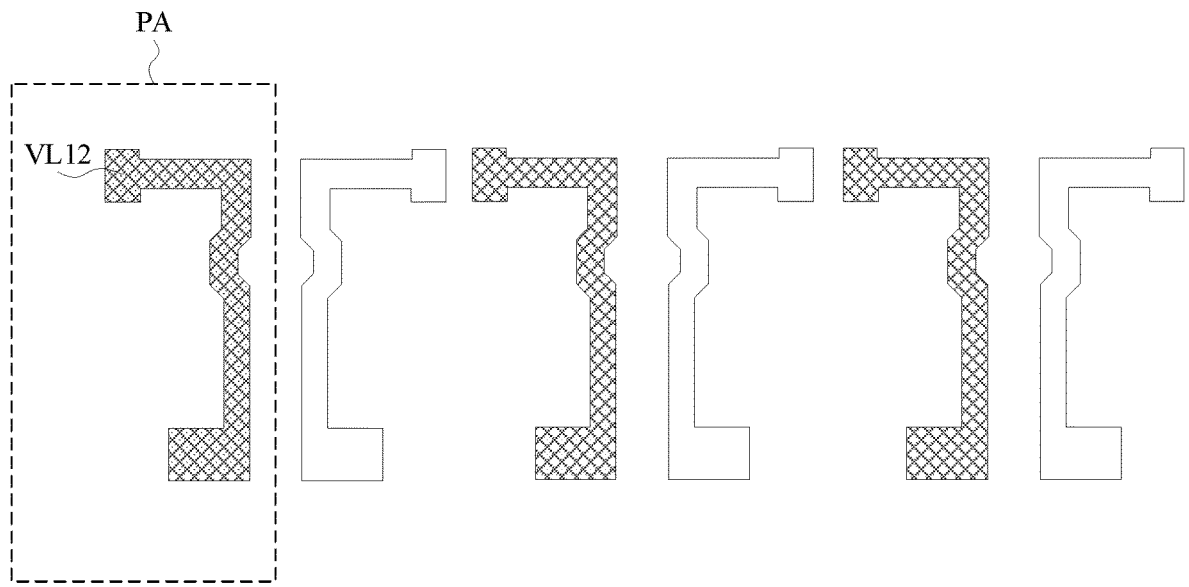
FIG. 22A is a schematic diagram of a fifth metal layer.
Figure 22B:
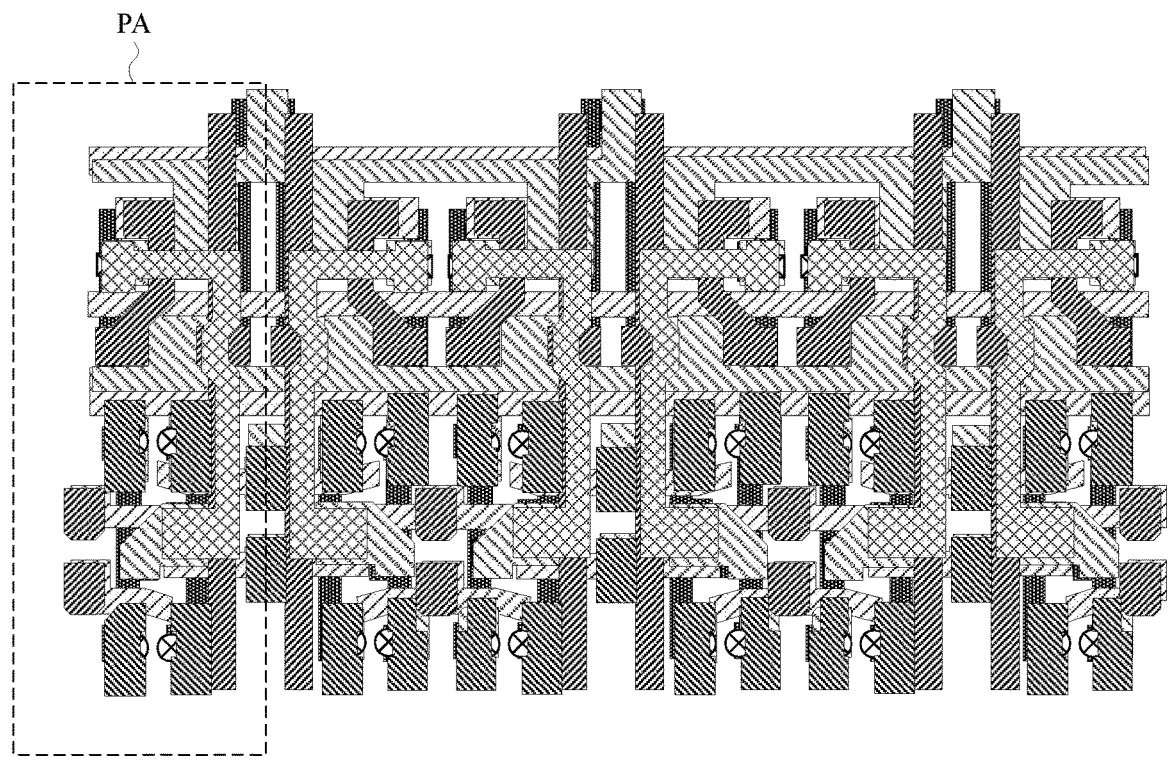
FIG. 22B is a schematic diagram after a fifth metal layer is formed.

(10) Forming a fifth metal layer, includes: depositing a fifth metal thin film on the base substrate on which the sixth insulation layer is formed, and patterning the fifth metal thin film through a patterning process to form the fifth metal layer. The fifth metal layer includes fifth conductive layers of multiple pixel circuits. A conductive layer of each pixel circuit includes a twelfth connection part VL12, as shown in FIGS. 22A and 22B. FIG. 22A is a schematic diagram of the fifth metal layer and FIG. 22B is a schematic diagram after the fifth metal layer is formed.

In an exemplary embodiment, twelfth connection parts of adjacent pixel circuits located in a same row are symmetrical along a midline of the adjacent pixel circuits.

In an exemplary embodiment, the twelfth connection part VL12 is connected with the second electrode of the third transistor through the twenty-third via, and is connected with the first electrode of the sixth transistor through the twenty-fourth via.

Figure 23A:
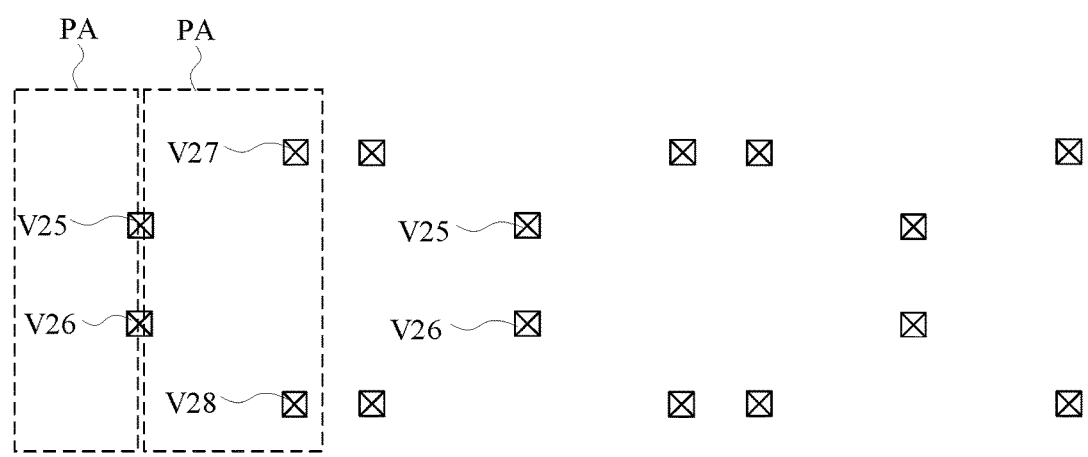
FIG. 23A is a schematic diagram of a seventh insulation layer.
Figure 23B:
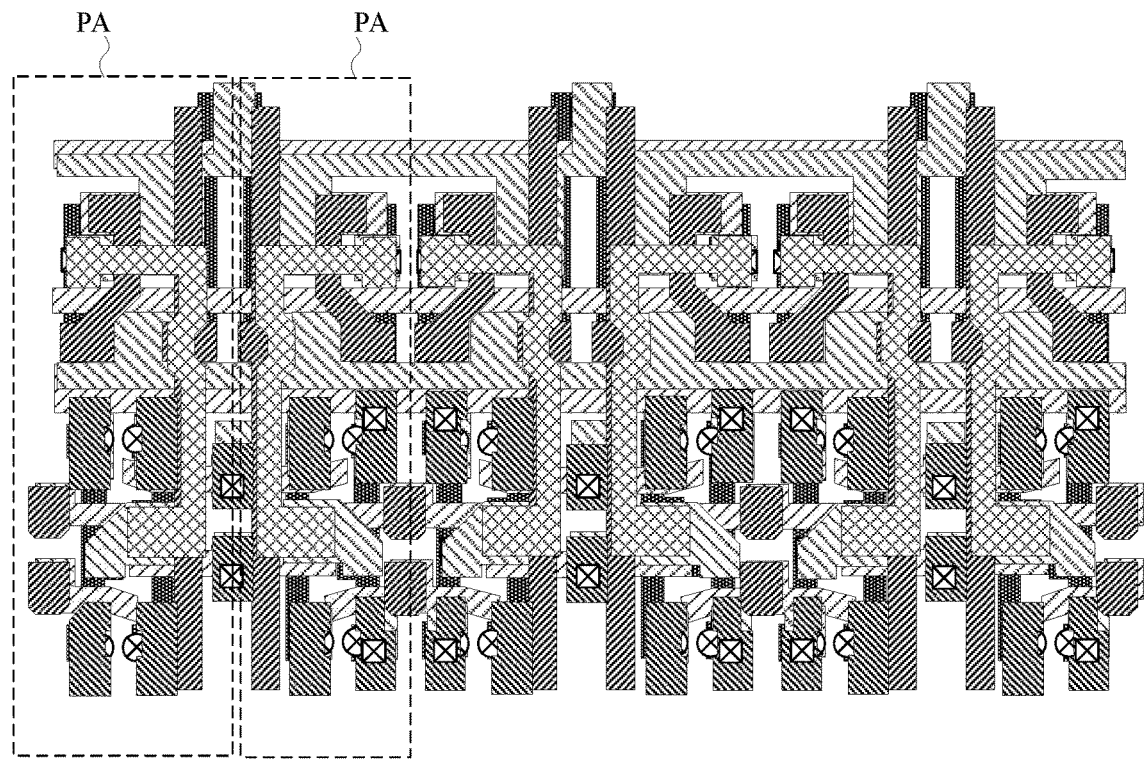
FIG. 23B is a schematic diagram after a seventh insulation layer is formed.

(11) Forming a seventh insulation layer, includes: depositing a seventh insulation thin film on the base substrate on which the fifth metal layer is formed, and patterning the seventh insulation thin film through a patterning process to form the seventh insulation layer. In each pixel circuit, the sixth insulation layer and the seventh insulation layer are provided with a twenty-fifth via V25 and a twenty-sixth via V26. In another pixel circuit except pixel circuits of a first column, the sixth insulation layer and the seventh insulation layer are further provided with a twenty-seventh via V27 and a twenty-eighth via V28, as shown in FIGS. 23A and 23B. FIG. 23A is a schematic diagram of the seventh insulation layer and FIG. 23B is a schematic diagram after the seventh insulation layer is formed.

In an exemplary embodiment, in each pixel circuit, the twenty-fifth via V25 exposes the eighth connection part VL8, and the twenty-sixth via V26 exposes the ninth connection part VL9.

In an exemplary embodiment, in another pixel circuit except pixel circuits of the first column, the twenty-seventh via V27 exposes the sixth connection part VL6, and the twenty-eighth via V28 exposes the tenth connection part VL10.

In an exemplary embodiment, a twenty-fifth via V25 in a pixel circuit of row i and column j and a twenty-fifth via V25 in a pixel circuit of row i and column j+1 are a same via. A twenty-sixth via V26 in the pixel circuit of row i and column j and a twenty-sixth via V26 in the pixel circuit of row i and column j+1 are a same via.

Figure 24A:
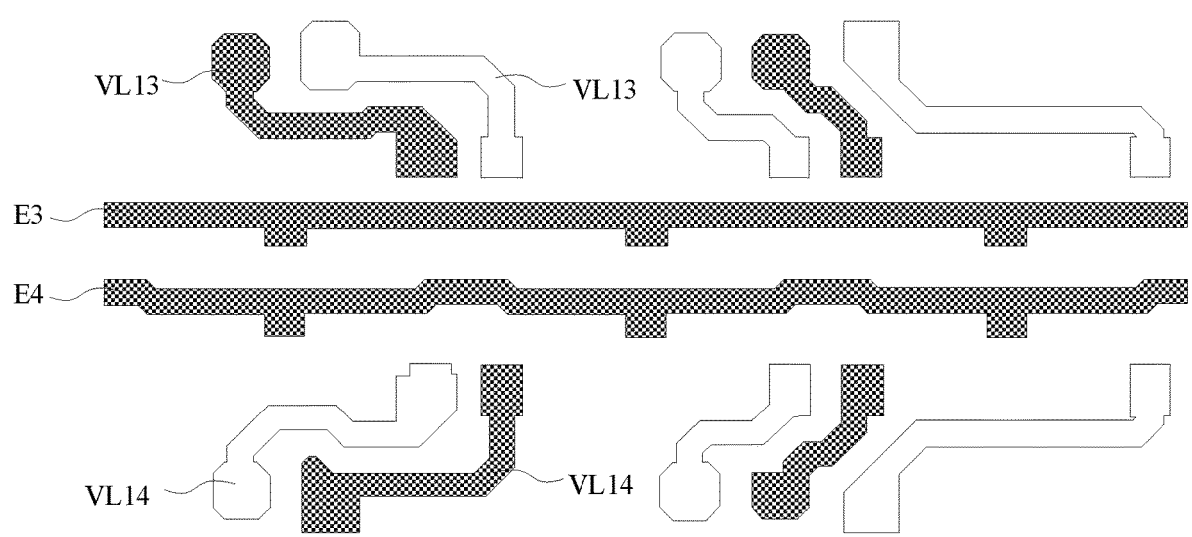
FIG. 24A is a schematic diagram of a sixth metal layer.
Figure 24B:
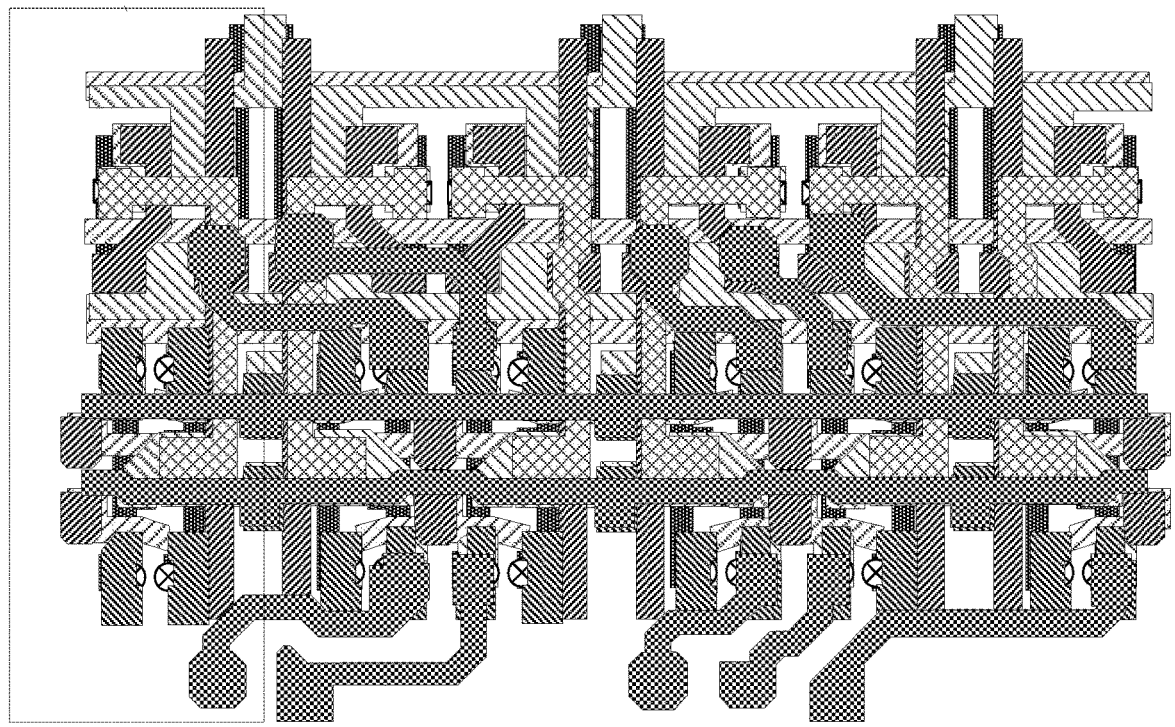
FIG. 24B is a schematic diagram after a sixth metal layer is formed.

(12) Forming a sixth metal layer, includes: depositing a sixth metal thin film on the base substrate on which the seventh insulation layer is formed, and patterning the sixth metal thin film through a patterning process to form the sixth metal layer. The sixth metal layer includes a third light emitting selection signal line E3, a fourth light emitting selection signal line E4, and a sixth conductive layer of another pixel circuit except pixel circuits of the first column, wherein the sixth conductive layer of the another pixel circuit except pixel circuits of the first column includes a thirteenth connection part VL13 and a fourteenth connection part VL14, as shown in FIG. 24A and FIG. 24B, FIG. 24A is a schematic diagram of the sixth metal layer, and FIG. 24B is a schematic diagram after the sixth metal layer is formed.

In an exemplary embodiment, the third light emitting selection signal lines E3 and the fourth light emitting selection signal lines EM4 are arranged along the first direction and both extend along the second direction. The thirteenth connection part VL13 of the another pixel circuit except pixel circuits of the first column is located on a side of the third light emitting selection signal line E3 away from the fourth light emitting selection signal line E4. The fourteenth connection part VL14 of the another pixel circuit except pixel circuits of the first column is located on a side of the fourth light emitting selection signal line E4 away from the third light emitting selection signal line E3.

Pixel circuits located in a same row are connected with a same third light emitting selection signal line. Pixel circuits located in the same row are connected with a same fourth light emitting selection signal line.

In an exemplary embodiment, adjacent rows of pixel circuits are connected with different third light emitting selection signal lines, and adjacent rows of pixel circuits are connected with different fourth light emitting selection signal lines.

In an exemplary embodiment, a pixel circuit of an m-th row and a pixel circuit of an (m+1)-th row are connected with a same third light emitting selection signal line, and the pixel circuit of the m-th row and the pixel circuit of the (m+1)-th row are connected with a same fourth light emitting selection signal line, wherein m is an odd number.

In an exemplary embodiment, in each pixel circuit, the third light emitting selection signal line E3 is connected with the eighth connection part through the twenty-fifth via. Since the eighth connection part is connected with the first connection part through the nineteenth via and the first connection part is connected with the gate electrode of the eighth transistor through the tenth via, that is to say, the third light emitting selection signal line E3 is connected with the gate electrode of the eighth transistor through the eighth connection part and the first connection part in sequence.

In an exemplary embodiment, in each pixel circuit, the fourth light emitting selection signal line E4 is connected with the ninth connection part through the twenty-sixth via. Since the ninth connection part is connected with the second connection part through the twentieth via and the second connection part is connected with the gate electrode of the ninth transistor through the eleventh via, that is to say, the fourth light emitting selection signal line E4 is connected with the gate electrode of the ninth transistor through the ninth connection part and the second connection part in sequence.

In an exemplary embodiment, in another pixel circuit except pixel circuits of the first column, the thirteenth connection part VL13 is connected with the sixth connection part through the twenty-seventh via. Since the sixth connection part is connected with the second electrode of the sixth transistor through the seventeenth via, the thirteenth connection part VL13 is connected with the second electrode of the sixth transistor through the sixth connection part.

In an exemplary embodiment, in another pixel circuit except pixel circuits of the first column, the fourteenth connection part VL14 is connected with the tenth connection part through the twenty-eighth via. Since the tenth connection part is connected with the second electrode of the seventh transistor through the twenty-first via, the fourteenth connection part VL14 is connected with the second electrode of the seventh transistor through the tenth connection part.

Figure 25A:
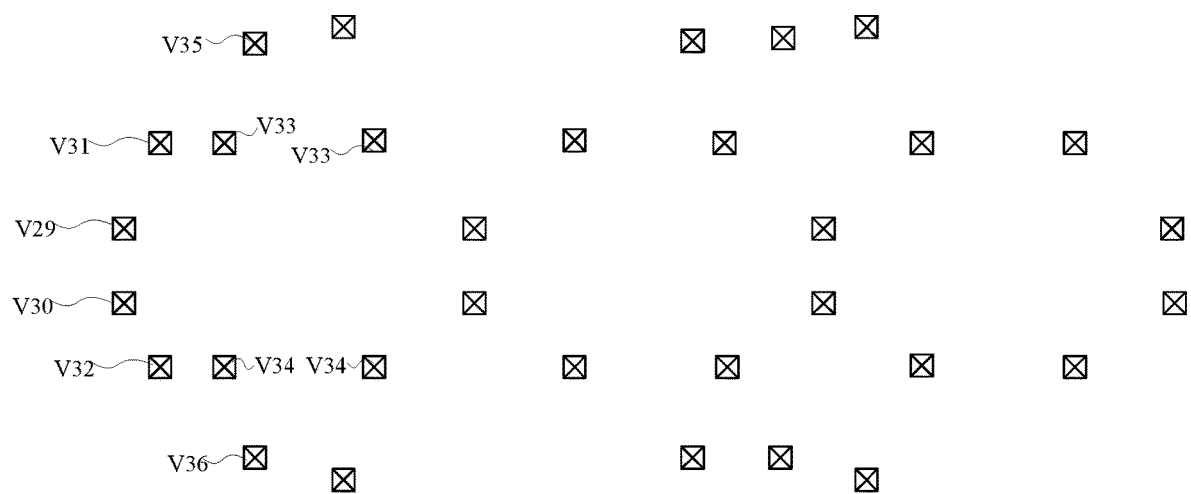
FIG. 25A is a schematic diagram of an eighth insulation layer.
Figure 25B:
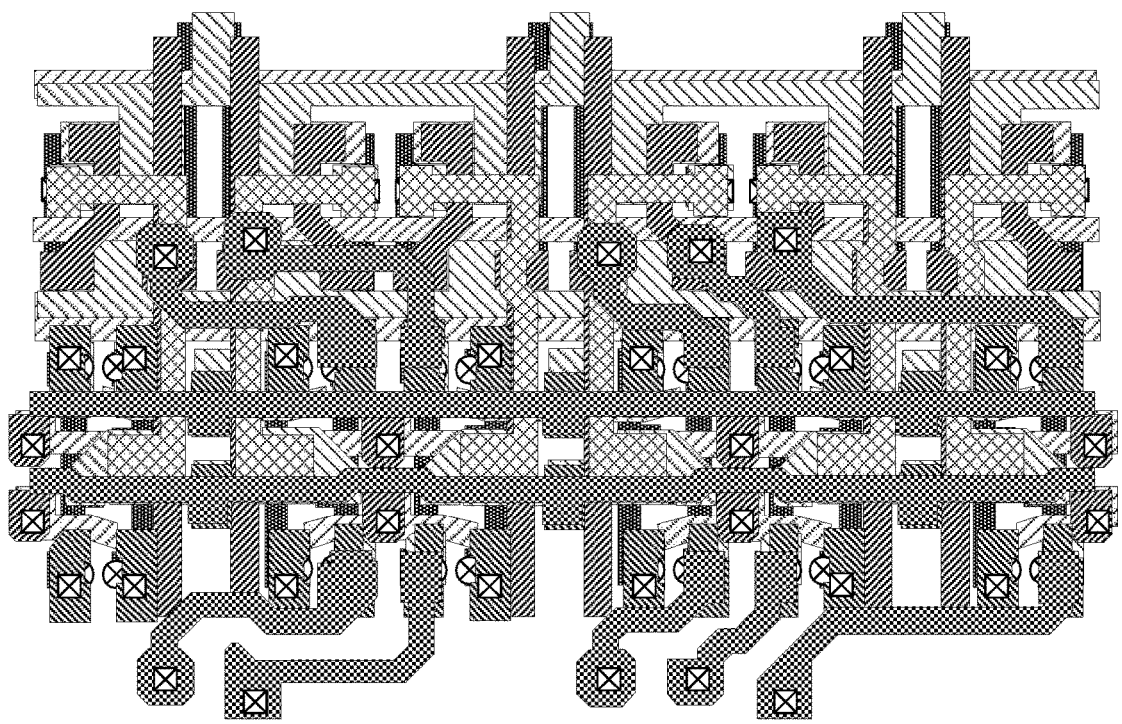
FIG. 25B is a schematic diagram after an eighth insulation layer is formed.

(13) Forming an eighth insulation layer, includes: depositing an eighth insulation thin film on the base substrate on which the sixth metal layer is formed, and patterning the eighth insulation thin film through a patterning process to form the eighth insulation layer. In each pixel circuit, the fifth insulation layer, the sixth insulation layer, the seventh insulation layer, and the eighth insulation layer are provided with a twenty-ninth via V29 and a thirtieth via V30, and in pixel circuits of the first column, the sixth insulation layer, the seventh insulation layer, and the eighth insulation layer are provided with a thirty-first via V31 and a thirty-second via V32. In each column of pixel circuits, the sixth insulation layer, the seventh insulation layer, and the eighth insulation layer are further provided with a thirty-third via V33 and a thirty-fourth via V34. In another pixel circuit except pixel circuits of the first column, the eighth insulation layer is provided with a thirty-fifth via V35 and a thirty-sixth via V36, as shown in FIGS. 25A and 25B. FIG. 25A is a schematic diagram of the eighth insulation layer and FIG. 25B is a schematic diagram after the eighth insulation layer is formed.

In an exemplary embodiment, in each pixel circuit, the twenty-ninth via V29 exposes the fourth connection part VL4, and the thirtieth via V30 exposes the fifth connection part VL5.

In an exemplary embodiment, a twenty-ninth via in a pixel circuit of row i and column j+1 and a twenty-ninth via in a pixel circuit of row i and column j+2 are a same via. A thirtieth via in the pixel circuit of row i and column j+1 and a thirtieth via in the pixel circuit of row i and column j+2 are a same via, wherein j is an odd number.

In an exemplary embodiment, in the pixel circuits of the first column, the thirty-first via V31 exposes the sixth connection part, the thirty-second via V32 exposes the tenth connection part, the thirty-third via V33 exposes the seventh connection part, and the thirty-fourth via V34 exposes the eleventh connection part.

In an exemplary embodiment, in another pixel circuit except pixel circuits of the first column, the thirty-third via V33 exposes the seventh connection part, the thirty-fourth via V34 exposes the eleventh connection part, the thirty-fifth via V35 exposes the thirteenth connection part, and the thirty-sixth via V36 exposes the fourteenth connection part.

Figure 26A:
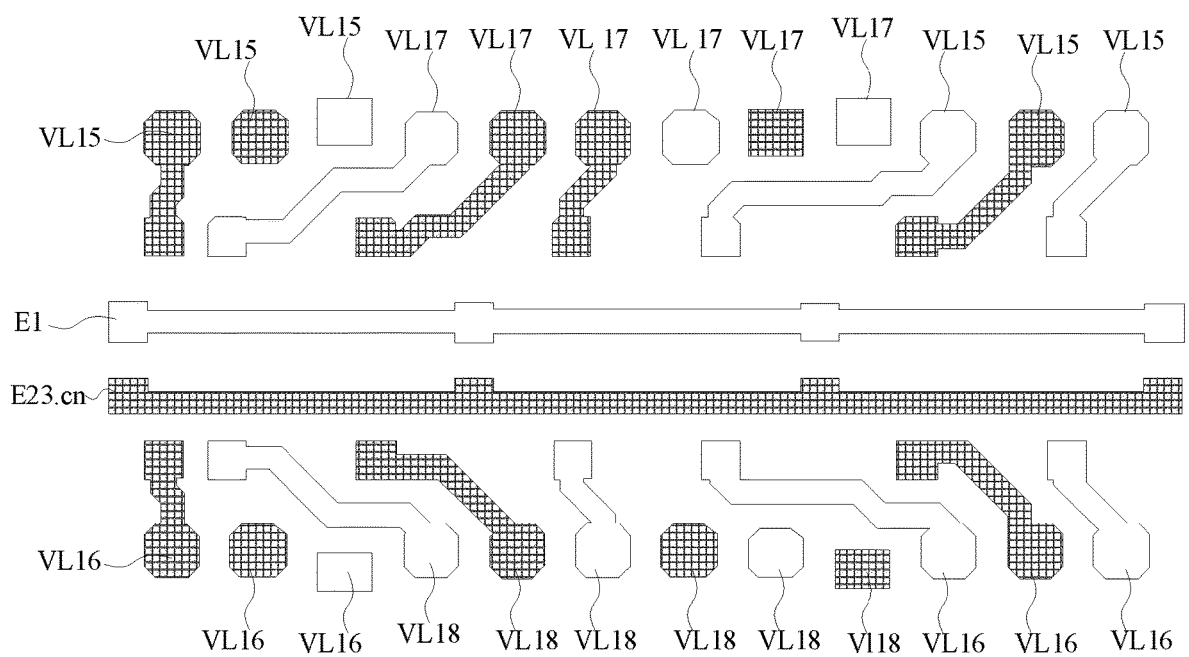
FIG. 26A is a schematic diagram of a seventh metal layer.
Figure 26B:
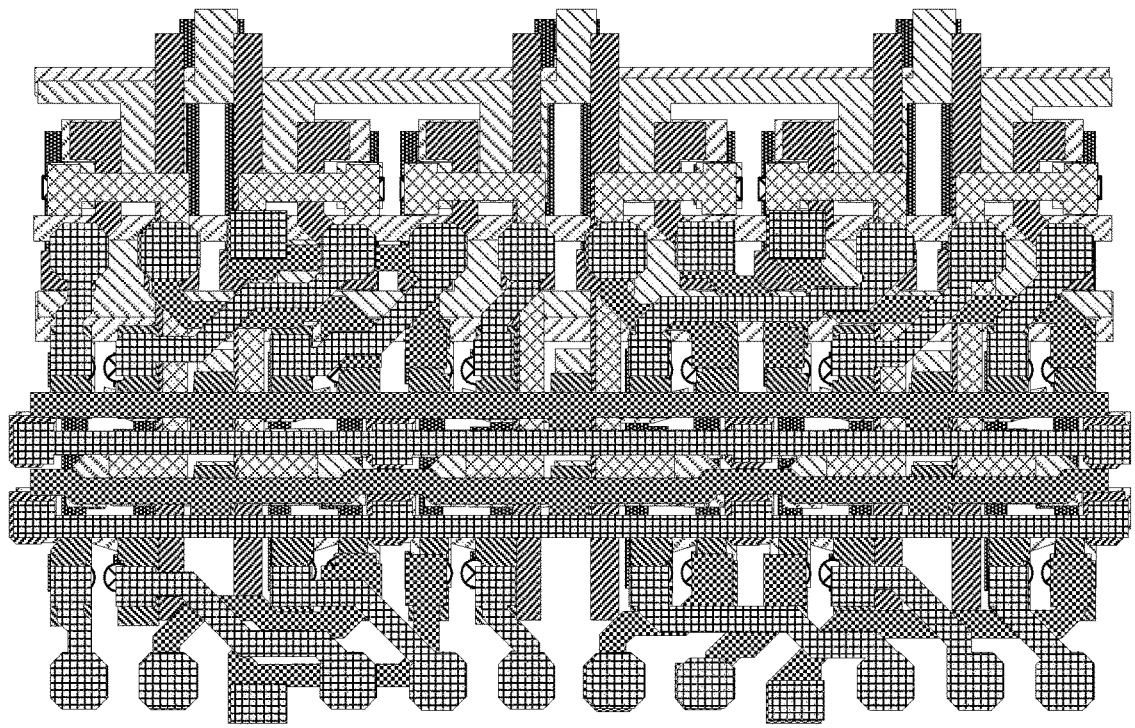
FIG. 26B is a schematic diagram after a seventh metal layer is formed.

(14) Forming a seventh metal layer, includes: depositing a seventh metal thin film on the base substrate on which the eighth insulation layer is formed, and patterning the seventh metal thin film through a patterning process to form the seventh metal layer. The seventh metal layer includes a first light emitting selection signal line E1, a second light emitting selection signal line E2, and seventh conductive layers of multiple pixel circuits, and a seventh conductive layer of each pixel circuit includes a fifteenth connection part VL15, a sixteenth connection part VL16, a seventeenth connection part VL17, and an eighteenth connection part VL18, as shown in FIG. 26A and FIG. 26B, FIG. 26A is a schematic diagram of the seventh metal layer, and FIG. 26B is a schematic diagram after the seventh metal layer is formed.

In an exemplary embodiment, the first light emitting selection signal line E1 and the second light emitting selection signal line EM2 are arranged along the first direction and both extend along the second direction. The fifteenth connection part VL15 and the seventeenth connection part VL17 of each pixel circuit are located on a side of the first light emitting selection signal line E1 away from the second light emitting selection signal line EM2, and the sixteenth connection part VL16 and the eighteenth connection part VL18 are located on a side of the second light emitting selection signal line E2 away from the first light emitting selection signal line E1.

In an exemplary embodiment, an orthographic projection of the first light emitting selection signal line E1 on the base substrate is located between an orthographic projection of the third light emitting selection signal line on the base substrate and an orthographic projection of the fourth light emitting selection signal line on the base substrate.

In an exemplary embodiment, an orthographic projection of the second light emitting selection signal line E2 on the base substrate is located on a side of an orthographic projection of the fourth light emitting selection signal line on the base substrate away from an orthographic projection of the third light emitting selection signal line on the base substrate.

In an exemplary embodiment, in each pixel circuit, the first light emitting selection signal line E1 is connected with the fourth connection part through the twenty-ninth via. Since the fourth connection part VL4 is connected with the gate electrode of the sixth transistor through the fifteenth via, the first light emitting selection signal line E1 is connected with the gate electrode of the sixth transistor through the fourth connection part.

In an exemplary embodiment, in each pixel circuit, the second light emitting selection signal line E2 is connected with the fifth connection part through the thirtieth via. Since the fifth connection part is connected with the gate electrode of the seventh transistor through the sixteenth via, the second light emitting selection signal line E2 is connected with the gate electrode of the seventh transistor through the fifth connection part.

In an exemplary embodiment, in the pixel circuits of the first column, the fifteenth connection part is connected with the sixth connection part through the thirty-first via, the sixteenth connection part is connected with the tenth connection part through the thirty-second via, the seventeenth connection part is connected with the seventh connection part through the thirty-third via, and the eighteenth connection part is connected with the eleventh connection part through the thirty-fourth via. Since the sixth connection part is connected with the second electrode of the sixth transistor through the seventeenth via, the fifteenth connection part is connected with the second electrode of the sixth transistor through the sixth connection part. Since the tenth connection part is connected with the second electrode of the seventh transistor through the twenty-first via, the sixteenth connection part is connected with the second electrode of the seventh transistor through the tenth connection part. Since the seventh connection part is connected with the second electrode of the eighth transistor through the eighteenth via, the seventeenth connection part is connected with the second electrode of the eighth transistor through the seventh connection part. Since the eleventh connection part is connected with the second electrode of the ninth transistor through the twenty-second via, the eighteenth connection part is connected with the second electrode of the ninth transistor through the eleventh connection part.

In an exemplary embodiment, in another pixel circuit except the pixel circuits of the first column, the fifteenth connection part is connected with the seventh connection part through the thirty-third via, the sixteenth connection part is connected with the eleventh connection part through the thirty-fourth via, the seventeenth connection part is connected with the thirteenth connection part through the thirty-fifth via, and the eighteenth connection part is connected with the fourteenth connection part through the thirty-sixth via. Since the seventh connection part is connected with the second electrode of the eighth transistor through the eighteenth via, the seventeenth connection part is connected with the second electrode of the eighth transistor through the seventh connection part. Since the eleventh connection part is connected with the second electrode of the ninth transistor through the twenty-second via, the eighteenth connection part is connected with the second electrode of the ninth transistor through the eleventh connection part. Since the thirteenth connection part is connected with the second electrode of the sixth transistor through the sixth connection part, the seventeenth connection part is connected with the second electrode of the sixth transistor through the thirteenth connection part and the sixth connection part in sequence. Since the fourteenth connection part is connected with the second electrode of the seventh transistor through the tenth connection part, the eighteenth connection part is connected with the second electrode of the seventh transistor through the fourteenth connection part and the tenth connection part in sequence.

Figure 27A:
FIG. 27A is a schematic diagram of a planarization layer.
Figure 27A:
Figure 27B:
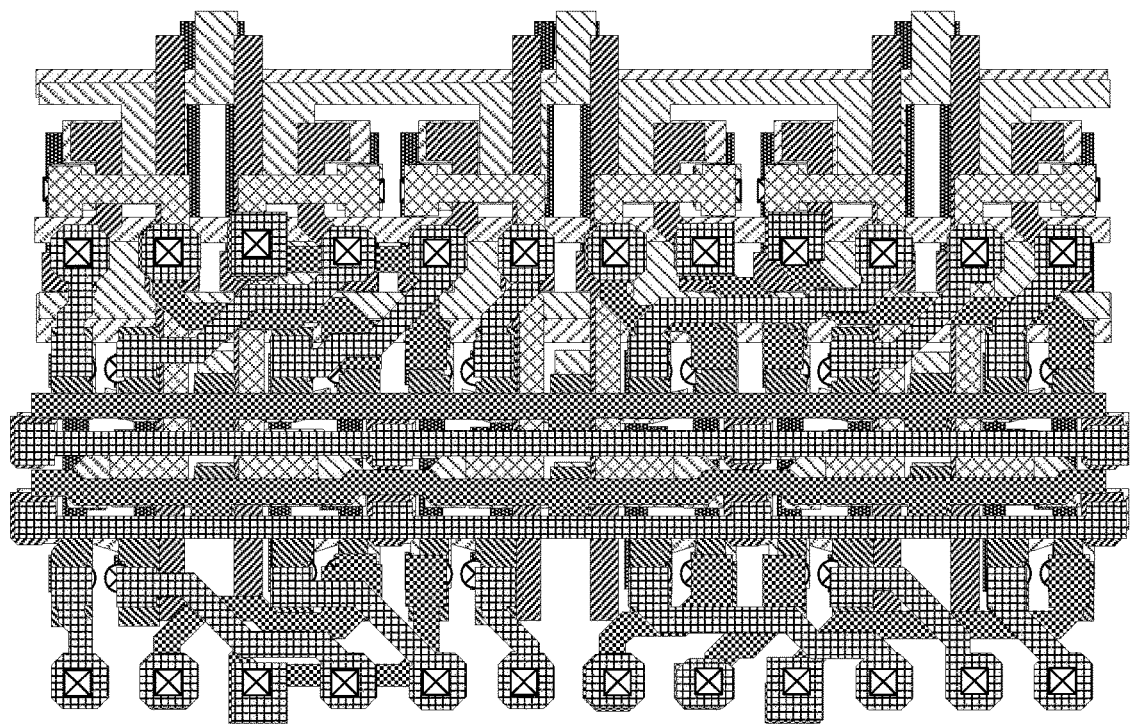
FIG. 27B is a schematic diagram after a planarization layer is formed.

(15) Forming a planarization layer, includes: coating a planarization thin film on the base substrate on which the seventh metal layer is formed, forming the planarization layer by masking, exposing, and developing the planarization thin film. The planarization layer includes a thirty-seventh via V37, a thirty-eighth via V38, a thirty-ninth via V39, and a first via V40 in each pixel circuit, as shown in FIGS. 27A and 27B, FIG. 27A is a schematic diagram of the planarization layer, and FIG. 27B is a schematic diagram after the planarization layer is formed.

In an exemplary embodiment, in each pixel circuit, the thirty-seventh via V37 exposes the fifteenth connection part, the thirty-eighth via V38 exposes the sixteenth connection part, the thirty-ninth via V39 exposes the seventeenth connection part, and the fortieth via V40 exposes the eighteenth connection part.

Figure 28A:
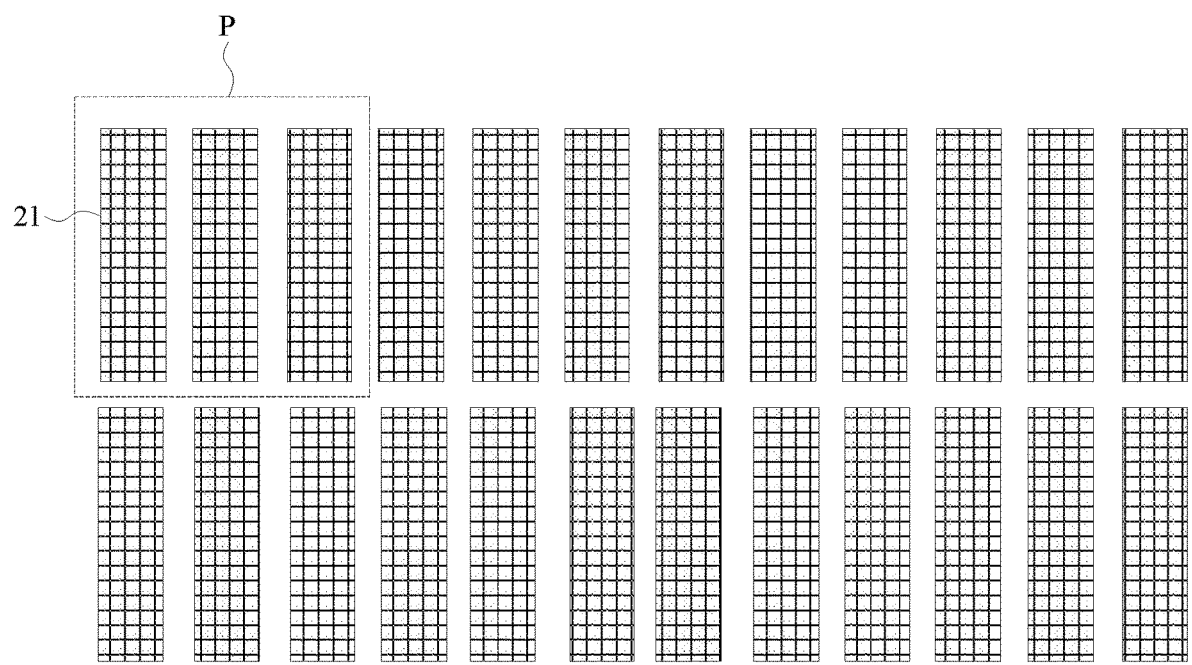
FIG. 28A is a schematic diagram of a first electrode layer.
Figure 28B:
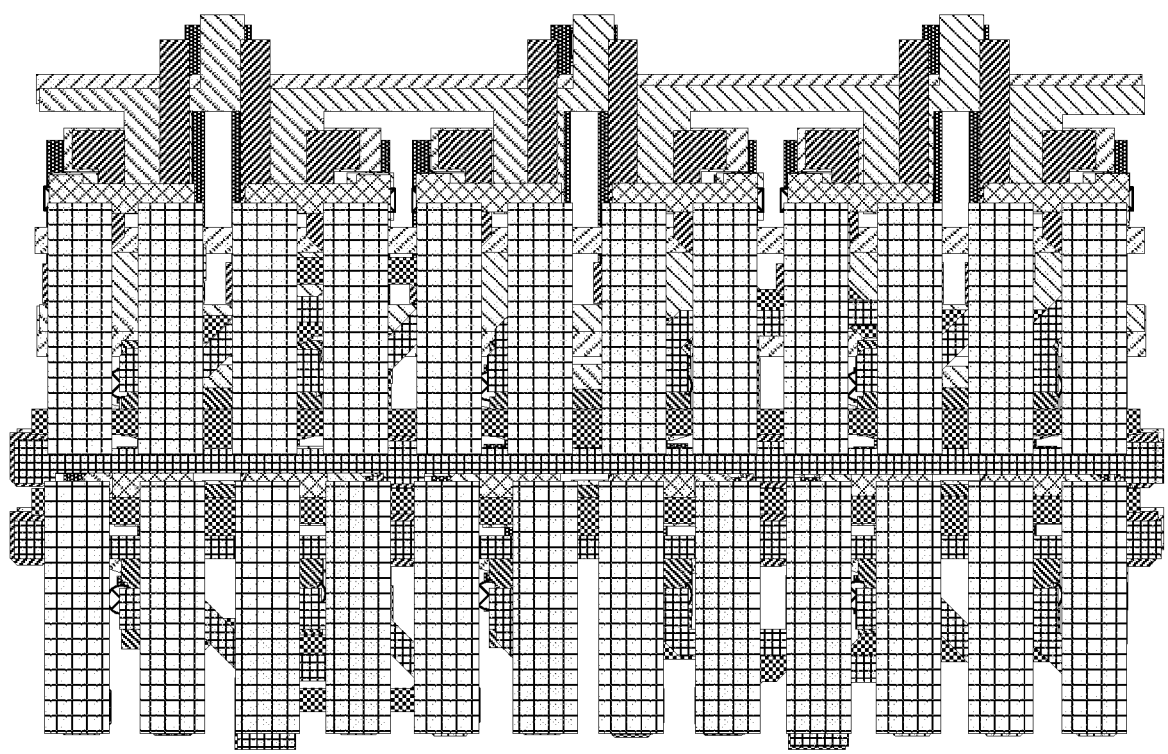
FIG. 28B is a schematic diagram after a first electrode layer is formed.

(16) Forming a first electrode layer, includes: depositing a transparent conductive thin film on the base substrate on which the planarization layer is formed, and patterning the transparent conductive thin film through a patterning process to form the first electrode layer. The first electrode layer includes a first electrode 100 formed in each light emitting device, as shown in FIGS. 28A and 28B, FIG. 28A is a schematic diagram of the first electrode layer, and FIG. 28B is a schematic diagram after the first electrode layer is formed.

In an exemplary embodiment, for each pixel circuit, a first electrode of a first light emitting device connected with the pixel circuit is connected with the fifteenth connection part through the thirty-sixth via. A first electrode of a second light emitting device connected with the pixel circuit is connected with the seventeenth connection part through the thirty-eighth via. A first electrode of a third light emitting device connected with the pixel circuit is connected with the sixteenth connection part through the thirty-seventh via, and a first electrode of a fourth light emitting device connected with the pixel circuit is connected with the eighteenth connection part through the thirty-eighth via.

In an exemplary embodiment, an orthographic projection of a fifteenth connection part in a pixel circuit of row i and column 3j−2 on the base substrate is at least partially overlapped with an orthographic projection of a first electrode of a first light emitting device in a light emitting unit of row 2i−1 and column 2j−1 on the base substrate. An orthographic projection of a sixteenth connection part in the pixel circuit of row i and column 3j−2 on the base substrate is at least partially overlapped with an orthographic projection of a first electrode of a first light emitting device in a light emitting unit of row 2i and column 2j−1 on the base substrate. An orthographic projection of a seventeenth connection part in the pixel circuit of row i and column 3j−2 on the base substrate is at least partially overlapped with an orthographic projection of a first electrode of a first light emitting device in a light emitting unit of row 2i−1 and column 2j on the base substrate. An orthographic projection of an eighteenth connection part in the pixel circuit of row i and column 3j−2 on the base substrate is at least partially overlapped with an orthographic projection of a first electrode of a first light emitting device in a light emitting unit of row 2i and column 2j on the base substrate.

In an exemplary embodiment, a pixel circuit of row i and column 3j−1 is connected with second light emitting devices in the light emitting unit of row 2i−1 and column 2j−1, the light emitting unit of row 2i−1 and column 2j, the light emitting unit of row 2i and column 2j−1, and the light emitting unit of row 2i and column 2j.

In an exemplary embodiment, an orthographic projection of a fifteenth connection part in the pixel circuit of row i and column 3j−1 on the base substrate is at least partially overlapped with an orthographic projection of a first electrode of a second light emitting device in the light emitting unit of row 2i−1 and column 2j−1 on the base substrate. An orthographic projection of a sixteenth connection part in the pixel circuit of row i and column 3j−1 on the base substrate is at least partially overlapped with an orthographic projection of a first electrode of a second light emitting device in the light emitting unit of row 2i and column 2j−1 on the base substrate. An orthographic projection of a seventeenth connection part in the pixel circuit of row i and column 3j−1 on the base substrate is at least partially overlapped with an orthographic projection of a first electrode of a second light emitting device in the light emitting unit of row 2i−1 and column 2j on the base substrate. An orthographic projection of an eighteenth connection part in the pixel circuit of row i and column 3j−1 on the base substrate is at least partially overlapped with an orthographic projection of a first electrode of a second light emitting device in the light emitting unit of row 2i and column 2j on the base substrate.

In an exemplary embodiment, a pixel circuit of row i and column 3j is connected with third light emitting devices in the light emitting unit of row 2i−1 and column 2j−1, the light emitting unit of row 2i−1 and column 2j, the light emitting unit of row 2i and column 2j−1, and the light emitting unit of row 2i and column 2j.

In an exemplary embodiment, an orthographic projection of a fifteenth connection part in the pixel circuit of row i and column 3j on the base substrate is at least partially overlapped with an orthographic projection of a first electrode of a third light emitting device in the light emitting unit of row 2i−1 and column 2j−1 on the base substrate. An orthographic projection of a sixteenth connection part in the pixel circuit of row i and column 3j on the base substrate is at least partially overlapped with an orthographic projection of a first electrode of a third light emitting device in the light emitting unit of row 2i and column 2j−1 on the base substrate. An orthographic projection of a seventeenth connection part in the pixel circuit of row i and column 3j on the base substrate is at least partially overlapped with an orthographic projection of a first electrode of a third light emitting device in the light emitting unit of row 2i−1 and column 2j on the base substrate. An orthographic projection of an eighteenth connection part in the pixel circuit of row i and column 3j on the base substrate is at least partially overlapped with an orthographic projection of a first electrode of a third light emitting device in the light emitting unit of row 2i and column 2j on the base substrate.

(17) Forming a pixel definition layer, includes: coating a pixel definition thin film on the base substrate where the transparent conductive layer is formed, and forming the pixel definition layer through masking, exposure, and development processes, wherein the pixel definition layer is formed in each light emitting device, and an opening region exposing the first electrode is formed in the pixel definition layer in each light emitting device.

In an exemplary embodiment, the pixel definition layer may be made of polyimide, acrylic, or polyethylene terephthalate.

(18) Forming a light emitting material layer, includes: forming the light emitting material layer in the opening region of the formed pixel definition layer and on the pixel definition layer. The light emitting material layer includes an organic emitting layer.

(19) Forming a second electrode layer, includes: coating a conductive thin film on the base substrate where the organic emitting layer is formed, and patterning the conductive thin film through a patterning process to form the second electrode layer. The second electrode layer includes a second electrode. The second electrode covers the organic emitting layer in each light emitting device. The second electrode is connected with the organic emitting layer.

In an exemplary embodiment, the second electrode may be made of any one or more of magnesium (Mg), silver (Ag), aluminum (Al), copper (Cu), and lithium (Li), or an alloy made of any one or more of the above metals.

(20) Forming an encapsulation layer on the base substrate where the second electrode is formed. The encapsulation layer includes a first encapsulation layer made of an inorganic material, a second encapsulation layer made of an organic material, and a third encapsulation layer made of an inorganic material. The first encapsulation layer is disposed on the second electrode, the second encapsulation layer is disposed on the first encapsulation layer, and the third encapsulation layer is disposed on the second encapsulation layer, to form an inorganic material/organic material/inorganic material stacked structure.

In an exemplary embodiment, the base substrate may be a rigid base substrate or a flexible base substrate, wherein the rigid base substrate may be, but is not limited to, one or more of glass and metal foil, the flexible base substrate may be, but is not limited to, one or more of polyethylene glycol terephthalate, ethylene terephthalate, polyether ether ketone, polystyrene, polycarbonate, polyarylate, polyarylester, polyimide, polyvinyl chloride, polyethylene, and textile fibers.

In an exemplary embodiment, in each shift register, active layers of all transistors include: a channel region, and a source connection part and a drain connection part located on both sides of the channel region, a source electrode of a transistor is electrically connected with the source connection part, and a drain electrode of the transistor is electrically connected with the drain connection part. The channel region may not be doped with an impurity, and has characteristics of a semiconductor. The source connection part and the drain connection part may be on two sides of the channel region, and doped with impurities, and thus are conductive. An impurity may be changed according to a type (e.g., an N type or a P type) of a transistor.

In an exemplary embodiment, the semiconductor layer may be an amorphous silicon layer, a poly silicon layer, or may be a metal oxide layer. The metal oxide layer may be made of an oxide containing indium and tin, an oxide containing tungsten and indium, an oxide containing tungsten and indium and zinc, an oxide containing titanium and indium, an oxide containing titanium and indium and tin, an oxide containing indium and zinc, an oxide containing silicon and indium and tin, or an oxide containing indium or gallium and zinc, etc. The metal oxide layer may be a single layer, or a double-layer, or may be a multi-layer.

In an exemplary embodiment, the first insulation layer, the second insulation layer, the third insulation layer, the fourth insulation layer, the fifth insulation layer, the sixth insulation layer, the seventh insulation layer, and the eighth insulation layer may be made of any one or more of Silicon Oxide (SiOx), Silicon Nitride (SiNx), and Silicon Oxynitride (SiON), and may be a single layer, a multi-layer, or a composite layer.

In an exemplary embodiment, the first metal layer, the second metal layer, the third metal layer, the fourth metal layer, the fifth insulation layer, the sixth insulation layer, and the seventh insulation layer may be made of a metal material, such as any one or more of silver (Ag), copper (Cu), aluminum (Al), and molybdenum (Mo), or an alloy material of the above metals, such as an Aluminum Neodymium alloy (AlNd) or a Molybdenum Niobium alloy (MoNb), and may be of a single-layer structure or a multi-layer composite structure such as Mo/Cu/Mo.

An embodiment of the present disclosure also provides a display apparatus including a display substrate.

The display substrate is the display substrate according to any of the aforementioned embodiments, and has similar implementation principles and implementation effects, which will not be repeated here.

In an exemplary embodiment, the display apparatus may be a Liquid Crystal Display (LCD for short) or an Organic Light Emitting Diode (OLED for short) display apparatus. The display apparatus may be any product or component with a display function, such as a liquid crystal panel, electronic paper, an OLED panel, an Active-Matrix Organic Light Emitting Diode (AMOLED for short) panel, a mobile phone, a tablet computer, a television, a display, a notebook computer, a digital photo frame, or a navigator.

The accompanying drawings of the present disclosure only involve the structures involved in the embodiments of the present disclosure, and other structures may refer to usual designs.

For the sake of clarity, in the accompanying drawings used for describing the embodiments of the present disclosure, a thickness and dimension of a layer or a micro structure is enlarged. It may be understood that when an element such as a layer, a film, a region, or a substrate is described as being "on" or "under" another element, the element may be "directly" located "on" or "under" the other element, or there may be an intermediate element.

The invention claimed is:

1. A display substrate, comprising: a display region and a non-display region, the display region is provided with M1 rows and N1 columns of pixel circuits and M2 rows and N2 columns of light emitting units, each light emitting unit comprises: a first light emitting device, a second light emitting device, and a third light emitting device, wherein the first light emitting device, the second light emitting device, and the third light emitting device emit light of different colors; wherein M1≠M2, N1≠N2;

each pixel circuit is connected with K light emitting devices emitting light of a same color, wherein K is a positive integer greater than or equal to 2;

each pixel circuit comprises a current control sub-circuit and a light emitting selection sub-circuit;

the current control sub-circuit is respectively connected with a reset signal terminal, an initial signal terminal, a scan signal terminal, a data signal terminal, a light emitting control terminal, a first power supply terminal, and a first node, and is configured to provide a drive current to the first node under control of the reset signal terminal, the initial signal terminal, the scan signal terminal, the data signal terminal, the light emitting control terminal, and the first power supply terminal;

the light emitting selection sub-circuit is respectively connected with the first node, K light emitting selection signal terminals, and the K light emitting devices emitting light of the same color, and is configured to sequentially provide a signal of the first node to the K light emitting devices emitting light of the same color under control of the K light emitting selection signal terminals, wherein the display substrate further comprises: N1 columns of data signal lines, M1 rows of scan signal lines, M1 rows of first power supply lines, M1 rows of reset signal lines, M1 rows of initial signal lines, P rows of first light emitting selection signal lines, P rows of second light emitting selection signal lines, P rows of third light emitting selection signal lines, P rows of fourth light emitting selection signal lines, and P rows of light emitting control lines, P=M1 or M1/2;

the data signal lines extend along a first direction, and the scan signal lines, the first power supply lines, the reset signal lines, the initial signal lines, the first light emitting selection signal lines, the second light emitting selection signal lines, the third light emitting selection signal lines, the fourth light emitting selection signal lines, and the light emitting control lines extend along a second direction, wherein the first direction and the second direction intersect;

a scan signal line of an s-th row is connected with a scan signal terminal of a pixel circuit of an s-th row, a first power supply line of an s-th row is connected with a first power supply terminal of the pixel circuit of the s-th row, a reset signal line of an s-th row is connected with a reset signal terminal of the pixel circuit of the s-th row, an initial signal line of an s-th row is connected with an initial signal terminal of the pixel circuit of the s-th row, a data signal line of a t-th column is connected with a data signal terminal of a pixel circuit of a t-th column, 1≤s≤M1, 1≤t≤N1.

2. The display substrate according to claim 1, wherein in each pixel circuit, the current control sub-circuit comprises: a first transistor, a second transistor, a third transistor, a fourth transistor, a fifth transistor, and a capacitor, wherein the capacitor comprises a first electrode plate and a second electrode plate;

a control electrode of the first transistor is connected with the reset signal terminal, a first electrode of the first transistor is connected with the initial signal terminal, and a second electrode of the first transistor is connected with a second node;

a control electrode of the second transistor is connected with the scan signal terminal, a first electrode of the second transistor is connected with the data signal terminal, and a second electrode of the second transistor is connected with a third node;

a control electrode of the third transistor is connected with the second node, a first electrode of the third transistor is connected with a third node, and a second electrode of the third transistor is connected with the first node;

a control electrode of the fourth transistor is connected with the scan signal terminal, a first electrode of the fourth transistor is connected with the second node, and a second electrode of the fourth transistor is connected with the first node;

a control electrode of the fifth transistor is connected with the light emitting control terminal, a first electrode of the fifth transistor is connected with the first power supply terminal, and a second electrode of the fifth transistor is connected with the third node; and the first electrode plate is connected with the second node, and the second electrode plate is connected with the first power supply terminal.

3. The display substrate according to claim 1, wherein in each pixel circuit, the light emitting selection sub-circuit comprises a sixth transistor to a (5+K)-th transistor;
a control electrode of a k-th transistor is connected with a (k−5)-th light emitting selection signal terminal, a first electrode of the k-th transistor is connected with the first node, a second electrode of the k-th transistor is connected with a (k−5)-th light emitting device, 6≤k≤5+K.

4. The display substrate according to claim 1, wherein light emitting devices connected with adjacent pixel circuits located in a same row emit light of different colors, and light emitting devices connected with adjacent pixel circuits located in a same column emit light of a same color.

5. The display substrate according to claim 4, wherein when M2=K×M1 and N1=3×N2, light emitting devices connected with each pixel circuit are located in a same column;
a pixel circuit of row m and column 3n−2 is respectively connected with a first light emitting device in a light emitting unit of row K×m−K+1 and column n, and a first light emitting device in a light emitting unit of row Km−K+2 and column n, until a first light emitting device in a light emitting unit of row K×m and column n, wherein 1≤m≤M1 and 1≤n≤N2;
a pixel circuit of row m and column 3n−1 is respectively connected with a second light emitting device in the light emitting unit of row K×m−K+1 and column n, and a second light emitting device in the light emitting unit of row Km−K+2 and column n, until a second light emitting device in the light emitting unit of row K×m and column n;
a pixel circuit of row m and column 3n is respectively connected with a third light emitting device in the light emitting unit of row K×m×K+1 and column n, and a third light emitting device in the light emitting unit of row Km−K+2 and column n, until a third light emitting device in the light emitting unit of row K×m and column n.

6. The display substrate according to claim 5, wherein when P=M1, a first light emitting selection signal line of an s-th row is connected with a first light emitting selection signal terminal of the pixel circuit of the s-th row, a second light emitting selection signal line of an s-th row is connected with a second light emitting selection signal terminal of the pixel circuit of the s-th row, a third light emitting selection signal line of an s-th row is connected with a third light emitting selection signal terminal of the pixel circuit of the s-th row, a fourth light emitting selection signal line of an s-th row is connected with a fourth light emitting selection signal terminal of the pixel circuit of the s-th row;
when P=M1/2, a first light emitting selection signal line of a v-th row is respectively connected with first light emitting selection signal terminals of a pixel circuit of a (2v−1)-th row and a pixel circuit of a 2v-th row, a second light emitting selection signal line of a v-th row is respectively connected with second light emitting selection signal terminals of the pixel circuit of the (2v−1)-th row and the pixel circuit of the 2v-th row, a third light emitting selection signal line of a v-th row is respectively connected with third light emitting selection signal terminals of the pixel circuit of the (2v−1)-th row and the pixel circuit of the 2v-th row, a fourth light emitting selection signal line of a v-th row is respectively connected with fourth light emitting selection signal terminals of the pixel circuit of the (2v−1)-th row and the pixel circuit of the 2v-th row, and a light emitting control line of a v-th row is respectively connected with light emitting control terminals of the pixel circuit of the (2v−1)-th row and the pixel circuit of the 2v-th row, wherein 1≤v≤P.

7. The display substrate according to claim 6, wherein a first light emitting selection signal line and a second light emitting selection signal line are arranged in a same layer, a third light emitting selection signal line and a fourth light emitting selection signal line are arranged in a same layer, and the first light emitting selection signal line and the third light emitting selection signal line are arranged in different layers.

8. The display substrate according to claim 7, comprising: a base substrate, and a drive circuit layer and a light emitting structure layer sequentially disposed on the base substrate; the drive circuit layer comprises a pixel circuit, and the light emitting structure layer comprises a light emitting unit;
the drive circuit layer comprises: a first insulation layer, a semiconductor layer, a second insulation layer, a first metal layer, a third insulation layer, a second metal layer, a fourth insulation layer, a third metal layer, a fifth insulation layer, a fourth metal layer, a sixth insulation layer, a fifth metal layer, a seventh insulation layer, a sixth metal layer, an eighth insulation layer, a seventh metal layer, and a planarization layer which are stacked on the base substrate in sequence;
when K=4, the semiconductor layer comprises active layers of multiple pixel circuits, an active layer of each pixel circuit comprises active layers of multiple transistors; the first metal layer comprises a light emitting control line, a scan signal line, a reset signal line, and first conductive layers of multiple pixel circuits, wherein a first conductive layer of each pixel circuit comprises gate electrodes of multiple transistors and a first electrode plate; the second metal layer comprises a first power supply line, an initial signal line, and second conductive layers of multiple pixel circuits, a second conductive layer of each pixel circuit comprises first electrodes and second electrodes of multiple transistors, a first connection part, and a second connection part; the third metal layer comprises a data signal line and third conductive layers of multiple pixel circuits, a third conductive layer of each pixel circuit comprises a first electrode of a second transistor, a third connection part, a fourth connection part, and a fifth connection part; the fourth metal layer comprises fourth conductive layers of multiple pixel circuits, and a fourth conductive layer of each pixel circuit comprises a sixth connection part, a seventh connection part, an eighth connection part, a ninth connection part, a tenth connection part, and an eleventh connection part; the fifth metal layer comprises fifth conductive layers of multiple pixel circuits, and a conductive layer of each pixel circuit comprises a twelfth connection part; the sixth metal layer comprises a third light emitting selection signal line, a fourth light emitting selection signal line, and a sixth conductive layer of another pixel circuit except pixel circuits of a first column, wherein the sixth conductive layer of the another pixel circuit except the pixel circuits of the first column comprises a thirteenth connection part and a fourteenth connection part; and the seventh metal layer comprises a first light emitting selection signal line, a second light emitting selection signal line, and seventh conductive layers of multiple pixel circuits, and a seventh conductive layer of each pixel circuit comprises a fifteenth connection part, a sixteenth connection part, a seventeenth connection part, and an eighteenth connection part.

9. The display substrate according to claim 8, wherein an orthographic projection of the initial signal line of the s-th row on the base substrate is at least partially overlapped with an orthographic projection of the reset signal line of the s-th row on the base substrate;
an orthographic projection of the first light emitting selection signal line on the base substrate is located between an orthographic projection of the third light emitting selection signal line on the base substrate and an orthographic projection of the fourth light emitting selection signal line on the base substrate; and
an orthographic projection of the second light emitting selection signal line on the base substrate is located on a side of the orthographic projection of the fourth light emitting selection signal line on the base substrate away from the orthographic projection of the third light emitting selection signal line on the base substrate.

10. The display substrate according to claim 8, wherein active layers of adjacent pixel circuits located in a same row are arranged symmetrically along a midline of the adjacent pixel circuits, and an active layer of a pixel circuit of row i and column j is connected with an active layer of a pixel circuit of row i and column j+1, wherein 1≤i≤M1, 1≤j<N1, and are odd numbers;
first conductive layers of adjacent pixel circuits located in a same row are symmetrically arranged along a midline between the adjacent pixel circuits; second conductive layers of adjacent pixel circuits located in a same row are symmetrically arranged along a midline between the adjacent pixel circuits; third conductive layers of adjacent pixel circuits located in a same row are symmetrically arranged along a midline between the adjacent pixel circuits; fourth conductive layers of adjacent pixel circuits located in a same row are symmetrically arranged along a midline between the adjacent pixel circuits; and fifth conductive layers of adjacent pixel circuits located in a same row are symmetrically arranged along a midline between the adjacent pixel circuits.

11. The display substrate according to claim 8, wherein an active layer of a first transistor comprises: a first branch segment, a first connection segment, and a second branch segment;
the first branch segment and the second branch segment are located on a same side of the first connection segment, and the first connection segment is respectively connected with the first branch segment and the second branch segment;
the first branch segment and the second branch segment extend along a first direction, and the first connection segment extends along a second direction;
a length of the first connection segment is greater than a length of the first branch segment.

12. The display substrate according to claim 8, wherein when the light emitting devices connected with the pixel circuits are arranged along the first direction and the second direction, an active layer of a fifth transistor of a pixel circuit of row i and column j and an active layer of a fifth transistor of a pixel circuit of row i and column i+1 are of an integrally formed structure; a gate electrode of an eighth transistor of the pixel circuit of row i and column j and a gate electrode of an eighth transistor of a pixel circuit of row i and column j+1 are of an integrally formed structure; a gate electrode of a ninth transistor of the pixel circuit of row i and column j and a gate electrode of a ninth transistor of the pixel circuit of row i and column j+1 are of an integrally formed structure; a gate electrode of a sixth transistor of the pixel circuit of row i and column j+1 and a gate electrode of a sixth transistor of a pixel circuit of row i and column j+2 are of an integrally formed structure; a gate electrode of a seventh transistor of the pixel circuit of row i and column j+1 and a gate electrode of a seventh transistor of the pixel circuit of row i and column j+2 are of an integrally formed structure; a first connection part of the pixel circuit of row i and column j and a first connection part of the pixel circuit of row i and column j+1 are of an integrally formed structure; a first electrode of the fifth transistor of the pixel circuit of row i and column j and a first electrode of the fifth transistor of the pixel circuit of row i and column j+1 are of an integrally formed structure; an eighth connection part of the pixel circuit of row i and column j and an eighth connection part of the pixel circuit of row i and column j+1 are of an integrally formed structure; and a ninth connection part of the pixel circuit of row i and column j and a ninth connection part of the pixel circuit of row i and column j+1 are of an integrally formed structure.

13. The display substrate according to claim 8, wherein the second insulation layer and the third insulation layer are provided with a first via to a ninth via located in each pixel circuit; the third insulation layer is further provided with a tenth via and an eleventh via located in each pixel circuit; the second insulation layer, the third insulation layer, and the fourth insulation layer are provided with a twelfth via and thirteenth via; the third insulation layer and the fourth insulation layer are provided with a fourteenth via, a fifteenth via, and a sixteenth via located in each pixel circuit; the fourth insulation layer and the fifth insulation layer are provided with a seventeenth via to a twenty-second via located in each pixel circuit; the third insulation layer, the fourth insulation layer, the fifth insulation layer, and the sixth insulation layer are provided with a twenty-third via and a twenty-fourth via located in each pixel circuit; the sixth insulation layer and the seventh insulation layer are provided with a twenty-fifth via and a twenty-sixth via located in each pixel circuit; the sixth insulation layer and the seventh insulation layer are further provided with a twenty-seventh via and a twenty-eighth via located in the another pixel circuit except the pixel circuits of the first column; the fifth insulation layer, the sixth insulation layer, the seventh insulation layer, and the eighth insulation layer are provided with a twenty-ninth via and a thirtieth via located in each pixel circuit; in the pixel circuits of the first column, the sixth insulation layer, the seventh insulation layer, and the eighth insulation layer are provided with a thirty-first via and a thirty-second via located in each pixel circuit, the sixth insulation layer, the seventh insulation layer, and the eighth insulation layer are further provided with a thirty-third via and a thirty-fourth via located in each pixel circuit; the eighth insulation layer is provided with a thirty-fifth via and a thirty-sixth via located in the another pixel circuit except the pixel circuits of the first column; and the planarization layer is provided with a thirty-seventh via, a thirty-eighth via, a thirty-ninth via, and a fortieth via located in each pixel circuit;
the first via exposes an active layer of a fifth transistor, the second via exposes an active layer of a third transistor, the third via exposes an active layer of a first transistor, the fourth via exposes an active layer of a sixth transistor, the fifth via exposes an active layer of an eighth transistor, the sixth via exposes the active layer of the eighth transistor, the seventh via exposes the active layer of the sixth transistor, the eighth via exposes an active layer of a seventh transistor, the ninth via exposes an active layer of a ninth transistor, the tenth via exposes a gate electrode of the eighth transistor, the eleventh via exposes a gate electrode of the ninth transistor, the twelfth via exposes the active layer of the first transistor and an active layer of a fourth transistor, the thirteenth via exposes an active layer of the second transistor, the fourteenth via exposes the first electrode plate, the fifteenth via exposes a gate electrode of the sixth transistor, the sixteenth via exposes a gate electrode of the seventh transistor, the seventeenth via exposes a second electrode of the sixth transistor, the eighteenth via exposes a second electrode of the eighth transistor, the nineteenth via exposes the first connection part, the twentieth via exposes the second connection part, the twenty-first via exposes a second electrode of the seventh transistor, the twenty-second via exposes a second electrode of the ninth transistor, the twenty-third via exposes a second electrode of the third transistor, the twenty-fourth via exposes a first electrode of the sixth transistor; in each pixel circuit, the twenty-fifth via exposes the eighth connection part, the twenty-sixth via exposes the ninth connection part, the twenty-seventh via exposes the sixth connection part, the twenty-eighth via exposes the tenth connection part, the twenty-ninth via exposes the fourth connection part, the thirtieth via exposes the fifth connection part, the thirty-first via exposes the sixth connection part, the thirty-second via exposes the tenth connection part, the thirty-third via exposes the seventh connection part, the thirty-fourth via exposes the eleventh connection part, the thirty-fifth via exposes the thirteenth connection part, the thirty-sixth via exposes the fourteenth connection part, the thirty-seventh via exposes the fifteenth connection part, the thirty-eighth via exposes the sixteenth connection part, the thirty-ninth via exposes the seventeenth connection part, and the fortieth via exposes the eighteenth connection part.

14. The display substrate according to claim 13, wherein a first via of a pixel circuit of row i and column j and a first via of a pixel circuit of row i and column j+1 are a same via; a tenth via of the pixel circuit of row i and column j and a tenth via of the pixel circuit of row i and column j+1 are a same via; an eleventh via of the pixel circuit of row i and column j and an eleventh via of the pixel circuit of row i and column j+1 are a same via;
a fifteenth via of the pixel circuit of row i and column j+1 and a fifteenth via of a pixel circuit of row i and column j+2 are a same via; a sixteenth via of the pixel circuit of row i and column j+1 and a sixteenth via of the pixel circuit of row i and column j+2 are a same via; a nineteenth via of the pixel circuit of row i and column j and a nineteenth via of the pixel circuit of row i and column j+1 are a same via; a twenty-fifth via of the pixel circuit of row i and column j and a twenty-fifth via of the pixel circuit of row i and column j+1 are a same via;
a twenty-sixteenth via of the pixel circuit of row i and column j and a twenty-sixteenth via of the pixel circuit of row i and column j+1 are a same via; a twenty-ninth via of the pixel circuit of row i and column j+1 and a twenty-ninth via of the pixel circuit of row i and column j+2 are a same via; and a thirtieth via of the pixel circuit of row i and column j+1 and a thirtieth via of the pixel circuit of row i and column j+2 are a same via.

15. The display substrate according to claim 13, wherein for each pixel circuit, a first electrode of a fifth transistor is connected with an active layer of the fifth transistor through the first via, a second electrode of a third transistor is connected with an active layer of the third transistor through the second via, a first electrode of a first transistor is connected with an active layer of the first transistor through the third via, a second electrode of a sixth transistor is connected with an active layer of the sixth transistor through the fourth via, a second electrode of an eighth transistor is connected with an active layer of the eighth transistor through the fifth via, a first electrode of the eighth transistor is connected with the active layer of the eighth transistor through the sixth via, a first electrode of the sixth transistor is connected with the active layer of the sixth transistor through the seventh via, a second electrode of a seventh transistor is connected with an active layer of the seventh transistor through the eighth via, a second electrode of a ninth transistor is connected with an active layer of the ninth transistor through the ninth via, the first connection part is connected with a gate electrode of the eighth transistor through the tenth via, the second connection part is connected with a gate electrode of the ninth transistor through the eleventh via, the third connection part is connected with the active layer of the first transistor through the twelfth via, the third connection part is connected with the first electrode plate through the fourteenth via, a first electrode of a second transistor is connected with an active layer of the second transistor through the thirteenth via, the fourth connection part is connected with a gate electrode of the sixth transistor through the fifteenth via, the fifth connection part is connected with a gate electrode of the seventh transistor through the sixteenth via, the sixth connection part is connected with the second electrode of the sixth transistor through the seventeenth via, the seventh connection part is connected with the second electrode of the eighth transistor through the eighteenth via, the eighth connection part is connected with the first connection part through the nineteenth via, the ninth connection part is connected with the second connection part through the twentieth via, the tenth connection part is connected with a second electrode of the seventh transistor through the twenty-first via, the eleventh connection part is connected with the second electrode of the ninth transistor through the twenty-second via, the twelfth connection part is connected with the second electrode of the third transistor through the twenty-third via, and is connected with the first electrode of the sixth transistor through the twenty-fourth via, the third light emitting selection signal line is connected with the eighth connection part through the twenty-fifth via, the fourth light emitting selection signal line is connected with the ninth connection part through the twenty-sixth via, the first light emitting selection signal line is connected with the fourth connection part through the twenty-ninth via, the second light emitting selection signal line is connected with the fifth connection part through the thirtieth via, a first light emitting device connected with a pixel circuit is connected with the fifteenth connection part through the thirty-sixth via, a second light emitting device connected with the pixel circuit is connected with the seventeenth connection part through the thirty-eighth via, a third light emitting device connected with the pixel circuit is connected with the sixteenth connection part through the thirty-seventh via, and a fourth light emitting device connected with the pixel circuit is connected with the eighteenth connection part through the thirty-eighth via;
- in the pixel circuits of the first column, the fifteenth connection part is connected with the sixth connection part through the thirty-first via, the sixteenth connection part is connected with the tenth connection part through the thirty-second via, the seventeenth connection part is connected with the seventh connection part through the thirty-third via, the eighteenth connection part is connected with the eleventh connection part through the thirty-fourth via; in the another pixel circuit except the pixel circuits of the first column, the thirteenth connection part is connected with the sixth connection part through the twenty-seventh via, the fourteenth connection part is connected with the tenth connection part through the twenty-eighth via, the fifteenth connection part is connected with the seventh connection part through the thirty-third via, the sixteenth connection part is connected with the eleventh connection part through the thirty-fourth via, the seventeenth connection part is connected with the thirteenth connection part through the thirty-fifth via, and the eighteenth connection part is connected with the fourteenth connection part through the thirty-sixth via.

16. The display substrate according to claim 8, wherein a light emitting device comprises: a first electrode, an organic emitting layer, and a second electrode; the light emitting structure layer comprises a first electrode layer, a pixel definition layer, a light emitting material layer, and a second electrode layer which are sequentially stacked on a drive structure layer;
- the first electrode layer comprises first electrodes arranged in an array, the light emitting material layer comprises organic emitting layers arranged in an array, and the second electrode layer comprises a second electrode;
- a pixel circuit is connected with a first electrode of a light emitting device connected with the pixel circuit, and second electrodes of all light emitting devices are connected with a second power supply terminal;
- for a pixel circuit of row m and column 3n−2, an orthographic projection of the fifteenth connection part on the base substrate is at least partially overlapped with an orthographic projection of a first electrode of a first light emitting device in a light emitting unit of row 2m−1 and column 2n−1 on the base substrate, an orthographic projection of the sixteenth connection part on the base substrate is at least partially overlapped with an orthographic projection of a first electrode of a first light emitting device in a light emitting unit of row 2m and column 2n−1 on the base substrate; an orthographic projection of the seventeenth connection part on the base substrate is at least partially overlapped with an orthographic projection of a first electrode of a first light emitting device in a light emitting unit of row 2m−1 and column 2n on the base substrate, and an orthographic projection of the eighteenth connection part on the base substrate is at least partially overlapped with an orthographic projection of a first electrode of a first light emitting device in a light emitting unit of row 2m and column 2n on the base substrate;
- for a pixel circuit of row m and column 3n−1, an orthographic projection of the fifteenth connection part on the base substrate is at least partially overlapped with an orthographic projection of a first electrode of a second light emitting device in a light emitting unit of row 2m−1 and column 2n−1 on the base substrate, an orthographic projection of the sixteenth connection part on the base substrate is at least partially overlapped with an orthographic projection of a first electrode of a second light emitting device in a light emitting unit of row 2m and column 2n−1 on the base substrate; an orthographic projection of the seventeenth connection part on the base substrate is at least partially overlapped with an orthographic projection of a first electrode of a second light emitting device in a light emitting unit of row 2m−1 and column 2n on the base substrate, and an orthographic projection of the eighteenth connection part on the base substrate is at least partially overlapped with an orthographic projection of a first electrode of a second light emitting device in a light emitting unit of row 2m and column 2n on the base substrate;
- for a pixel circuit of row m and column 3n, an orthographic projection of the fifteenth connection part on the base substrate is at least partially overlapped with an orthographic projection of a first electrode of a third light emitting device in a light emitting unit of row 2m−1 and column 2n−1 on the base substrate, an orthographic projection of the sixteenth connection part on the base substrate is at least partially overlapped with an orthographic projection of a first electrode of a third light emitting device in a light emitting unit of row 2m and column 2n−1 on the base substrate; an orthographic projection of the seventeenth connection part on the base substrate is at least partially overlapped with an orthographic projection of a first electrode of a third light emitting device in a light emitting unit of row 2m−1 and column 2n on the base substrate, and an orthographic projection of the eighteenth connection part on the base substrate is at least partially overlapped with an orthographic projection of a first electrode of a third light emitting device in a light emitting unit of row 2m and column 2n on the base substrate.

17. The display substrate according to claim 16, wherein for each light emitting device, a surface of a first electrode away from the base substrate comprises: a first terminal and a second terminal; the planarization layer is provided with a via, and the first electrode is connected with a pixel circuit through the via of the planarization layer;
- a via of the planarization layer connecting first electrodes of light emitting devices located in a same row with a pixel circuit is located at a same terminal of the first electrodes;
- a via of the planarization layer connecting a first electrode of a light emitting device located in an x-th row with a pixel circuit is located at a first terminal or a second terminal of the first electrode, and a via of the planarization layer connecting a first electrode of a light emitting device located in an (x+1)-th row with a pixel circuit is located at a first terminal or a second terminal of the first electrode, wherein $1 \leq x < M2$.

18. The display substrate according to claim 6, wherein the non-display region is provided with a scan drive circuit, a light emitting drive circuit, a first light emitting selection drive circuit, a second light emitting selection drive circuit, a third light emitting selection drive circuit, and a fourth light emitting selection drive circuit, and the display region comprises a first side and a second side, which are oppositely disposed;
- the scan drive circuit is located on the first side and the second side of the display region, the light emitting drive circuit is located on a side of the scan drive circuit away from the display region, the first light emitting selection drive circuit is located on the first side of the display region and between the scan drive circuit and the light emitting drive circuit, the second light emitting selection drive circuit is located on the second side of the display region and between the scan drive circuit and the light emitting drive circuit, the third light emitting selection drive circuit is located on the first side of the display region and between the first light emitting selection drive circuit and the light emitting drive circuit, and the fourth light emitting selection drive circuit is located on the second side of the display region and between the second light emitting selection drive circuit and the light emitting drive circuit;

the scan drive circuit comprises: M1 cascaded scan shift registers, and a scan shift register of an s-th stage is connected with a scan signal line of an s-th row, the light emitting drive circuit comprises P cascaded light emitting shift registers, wherein a light emitting shift register of a v-th stage is connected with a light emitting control line of a v-th row; the first light emitting selection drive circuit comprises P cascaded first light emitting selection shift registers, a first light emitting selection shift register of a v-th stage is connected with a first light emitting selection signal line of a v-th row; the second light emitting selection drive circuit comprises P cascaded second light emitting selection shift registers, a second light emitting selection shift register of a v-th stage is connected with a second light emitting selection signal line of a v-th row; the third light emitting selection drive circuit comprises P cascaded third light emitting selection shift registers, a third light emitting selection shift register of a v-th stage is connected with a third light emitting selection signal line of a v-th row; and the fourth light emitting selection drive circuit comprises P cascaded fourth light emitting selection shift registers, a fourth light emitting selection shift register of a v-th stage is connected with a fourth light emitting selection signal line of a v-th row.

19. The display substrate according to claim 4, wherein when $M2=4\times M1$ and $N1=3\times N2$, light emitting devices connected with pixel circuits are arranged along a first direction and a second direction, wherein the first direction intersects with the second direction;

a pixel circuit of row m and column 3n−2 is connected with a first light emitting device in a light emitting unit of row 2m−1 and column 2n−1, a first light emitting device in a light emitting unit of row 2m−1 and column 2n, a first light emitting device in a light emitting unit of row 2m and column 2n−1, and a first light emitting device in a light emitting unit of row 2m and column 2n, wherein $1 \leq m \leq M1$ and $1 \leq n \leq N2$;

a pixel circuit of row m and column 3n−1 is connected with a second light emitting device in the light emitting unit of row 2m−1 and column 2n−1, a second light emitting device in the light emitting unit of row 2m−1 and column 2n, a second light emitting device in the light emitting unit of row 2m and column 2n−1, and a second light emitting device in the light emitting unit of row 2m and column 2n;

a pixel circuit of row m and column 3n is connected with a third light emitting device in the light emitting unit of row 2m−1 and column 2n−1, a third light emitting device in the light emitting unit of row 2m−1 and column 2n, a third light emitting device in the light emitting unit of row 2m and column 2n−1, and a third light emitting device in the light emitting unit of row 2m and column 2n.

20. A display apparatus, comprising the display substrate according to claim 1.

* * * * *